US009576694B2

(12) United States Patent
Gogotsi et al.

(10) Patent No.: US 9,576,694 B2
(45) Date of Patent: Feb. 21, 2017

(54) APPLICATIONS FOR ALLIFORM CARBON

(75) Inventors: Yury Gogotsi, Warminster, PA (US); Vadym Mochalin, Philadelphia, PA (US); John Kenneth McDonough, IV, Collegeville, PA (US); Patrice Simon, Toulouse (FR); Pierre-Louis Taberna, Escalquens (FR)

(73) Assignees: Drexel University, Philadelphia, PA (US); Universite Paul Abatier De Toulouse France (FR)

( * ) Notice: Subject to any disclaimer, the term of this patent is extended or adjusted under 35 U.S.C. 154(b) by 576 days.

(21) Appl. No.: 13/823,336

(22) PCT Filed: Sep. 16, 2011

(86) PCT No.: PCT/US2011/051903
§ 371 (c)(1),
(2), (4) Date: May 23, 2013

(87) PCT Pub. No.: WO2012/037445
PCT Pub. Date: Mar. 22, 2012

(65) Prior Publication Data
US 2013/0244121 A1 Sep. 19, 2013

Related U.S. Application Data

(60) Provisional application No. 61/383,951, filed on Sep. 17, 2010, provisional application No. 61/387,156, filed on Sep. 28, 2010.

(51) Int. Cl.
| | |
|---|---|
| *H01G 11/36* | (2013.01) |
| *H01M 4/583* | (2010.01) |
| *H01B 1/04* | (2006.01) |
| *H01M 4/62* | (2006.01) |
| *H01M 4/66* | (2006.01) |
| *H01M 4/96* | (2006.01) |
| *C09D 5/24* | (2006.01) |
| *D02G 3/36* | (2006.01) |
| *H01G 11/58* | (2013.01) |
| *H05K 1/09* | (2006.01) |

(52) U.S. Cl.
CPC ................ *H01B 1/04* (2013.01); *C09D 5/24* (2013.01); *D02G 3/36* (2013.01); *H01G 11/36* (2013.01); *H01G 11/58* (2013.01); *H01M 4/583* (2013.01); *H01M 4/625* (2013.01); *H01M 4/663* (2013.01); *H01M 4/667* (2013.01); *H01M 4/668* (2013.01); *H01M 4/96* (2013.01); *H05K 1/09* (2013.01); *Y02E 60/50* (2013.01); *Y10T 428/265* (2015.01); *Y10T 428/292* (2015.01); *Y10T 442/3057* (2015.04); *Y10T 442/603* (2015.04)

(58) Field of Classification Search
CPC ...... H01G 11/36; H01M 4/583; H01M 4/625; H01M 4/663
See application file for complete search history.

(56) References Cited

U.S. PATENT DOCUMENTS

| | | | |
|---|---|---|---|
| 3,936,184 | A | 2/1976 | Tanaka et al. |
| 3,938,058 | A | 2/1976 | Yamamoto |
| 3,975,082 | A | 8/1976 | Winzer |
| 3,991,755 | A | 11/1976 | Vernon et al. |
| 4,026,278 | A | 5/1977 | Ricketts et al. |
| 4,050,802 | A | 9/1977 | Tanaka et al. |
| 4,141,359 | A | 2/1979 | Jacobsen et al. |
| 4,150,200 | A | 4/1979 | Sullivan |
| 4,172,333 | A | 10/1979 | Towsend |
| 4,225,216 | A | 9/1980 | Boyd et al. |
| 4,250,878 | A | 2/1981 | Jacobsen et al. |
| 4,260,429 | A | 4/1981 | Moyer |
| 4,292,092 | A | 9/1981 | Hanak |
| 4,322,133 | A | 3/1982 | Uede et al. |
| 4,398,545 | A | 8/1983 | Wilson |
| 4,408,862 | A | 10/1983 | Takano et al. |
| 4,438,591 | A | 3/1984 | Kessler |
| 4,556,051 | A | 12/1985 | Maurer |
| 4,580,572 | A | 4/1986 | Granek et al. |
| 4,583,547 | A | 4/1986 | Granek et al. |
| 4,589,735 | A | 5/1986 | Saunders |
| 4,606,613 | A | 8/1986 | Urabe |

(Continued)

FOREIGN PATENT DOCUMENTS

| | | |
|---|---|---|
| EP | 1338436 | 8/2003 |
| JP | 2005-229103 | 8/2005 |

(Continued)

OTHER PUBLICATIONS

Bowley et al, "Improving the Voltage Response of Holographically-Formed Polymer Dispersed Liquid crystals (H-PDLCs)", Molecular Crystals and Liquid Crystals Science and Technology, Jan. 1, 2001, 359(1), 647-659.
Bunning, T.J. and Vatarajan, I.V., "Holographic Polymer-Dispersed Liquid Crystals (H-PDLCs)", Annual Raeview of Materisals Science, Aug. 1, 2000, 30(1), 83-115.
Geis et al. "30 to 50 ns Liquid Crystal Optical Switches", Proc. SPIE, 2010,7618, paper 76180J, 5 pages.
International Patent Application No. PCT/US2014/025922: International Search report and the Written Opinion dated Nov. 11, 2014, 20 pages.
Jakubiak et al., "Holographic Photopolymerization for Fabrication of Electrically Switchable Inorganic-Organic Hybrid Photonic Structures", Jul. 2003, Proc. SPIE, 4991, 89-97.

(Continued)

*Primary Examiner* — Ladan Mohaddes
(74) *Attorney, Agent, or Firm* — Baker & Hostetler LLP

(57) ABSTRACT

This invention relates to novel applications for alliform carbon, useful in conductors and energy storage devices, including electrical double layer capacitor devices and articles incorporating such conductors and devices. Said alliform carbon particles are in the range of 2 to about 20 percent by weight, relative to the weight of the entire electrode. Said novel applications include supercapacitors and associated electrode devices, batteries, bandages and wound healing, and thin-film devices, including display devices.

14 Claims, 28 Drawing Sheets

(56) References Cited

U.S. PATENT DOCUMENTS

| | | |
|---|---|---|
| 4,608,987 A | 9/1986 | Mills |
| 4,623,222 A | 11/1986 | Itoh et al. |
| 4,693,558 A | 9/1987 | Nakaho et al. |
| 4,723,656 A | 2/1988 | Kiernan et al. |
| 4,729,377 A | 3/1988 | Granek et al. |
| 4,729,638 A | 3/1988 | Shirai |
| 4,734,558 A | 3/1988 | Nakano et al. |
| 4,792,208 A | 12/1988 | Ulman et al. |
| 4,796,971 A | 1/1989 | Robello et al. |
| 4,820,933 A | 4/1989 | Hong et al. |
| 4,825,877 A | 5/1989 | Kempe |
| 4,832,427 A | 5/1989 | Nanba et al. |
| 4,848,878 A | 7/1989 | Lee et al. |
| 4,878,743 A | 11/1989 | Aikawa et al. |
| 4,886,339 A | 12/1989 | Scozzafava et al. |
| 4,900,127 A | 2/1990 | Robello et al. |
| 5,008,043 A | 4/1991 | Robello et al. |
| 5,029,979 A | 7/1991 | Robello et al. |
| 5,046,803 A | 9/1991 | Colak |
| 5,056,895 A | 10/1991 | Kahn |
| 5,070,509 A | 12/1991 | Meyers |
| 5,075,043 A | 12/1991 | Robello et al. |
| 5,093,874 A | 3/1992 | Hawkins et al. |
| 5,120,621 A | 6/1992 | Ramsbottom |
| 5,128,799 A | 7/1992 | Byker |
| 5,168,378 A | 12/1992 | Black et al. |
| 5,179,565 A | 1/1993 | Tsuchiya et al. |
| 5,212,585 A | 5/1993 | Ning |
| 5,220,317 A | 6/1993 | Lynam et al. |
| 5,245,453 A | 9/1993 | Hatano et al. |
| 5,298,017 A | 3/1994 | Theeuwes et al. |
| 5,307,186 A | 4/1994 | Izumi et al. |
| 5,307,187 A | 4/1994 | Sunohara et al. |
| 5,309,464 A | 5/1994 | Ko |
| 5,381,507 A | 1/1995 | Robello et al. |
| 5,384,578 A | 1/1995 | Lynam et al. |
| 5,402,306 A | 3/1995 | Mayer et al. |
| 5,410,630 A | 4/1995 | Robello et al. |
| 5,559,330 A | 9/1996 | Murashita |
| 5,592,314 A | 1/1997 | Ogasawara et al. |
| 5,617,436 A | 4/1997 | Lo |
| 5,640,021 A | 6/1997 | Lee et al. |
| 5,640,274 A | 6/1997 | Iwama et al. |
| 5,646,815 A | 7/1997 | Owens et al. |
| 5,649,061 A | 7/1997 | Smyth |
| 5,681,402 A | 10/1997 | Ichinose et al. |
| 5,721,630 A | 2/1998 | Horner et al. |
| 5,725,970 A | 3/1998 | Martin et al. |
| 5,751,452 A | 5/1998 | Tanaka et al. |
| 5,751,467 A | 5/1998 | Byker |
| 5,759,291 A | 6/1998 | Ichinose et al. |
| 5,760,853 A | 6/1998 | Yamashita |
| 5,786,555 A | 7/1998 | Saito et al. |
| 5,805,367 A | 9/1998 | Kanazawa |
| 5,818,983 A | 10/1998 | Yoshimura et al. |
| 5,875,012 A | 2/1999 | Crawford et al. |
| 5,899,856 A | 5/1999 | Schoendorfer et al. |
| 5,942,157 A | 8/1999 | Sutherland et al. |
| 5,953,204 A | 9/1999 | Suhara et al. |
| 5,982,529 A | 11/1999 | Chapnik et al. |
| 6,014,247 A | 1/2000 | Winter et al. |
| 6,023,364 A | 2/2000 | Kobayashi et al. |
| 6,069,313 A | 5/2000 | Kay |
| 6,130,732 A | 10/2000 | Crawford et al. |
| 6,145,551 A | 11/2000 | Jayaraman et al. |
| 6,146,351 A | 11/2000 | Kempe |
| 6,215,920 B1 | 4/2001 | Whitehead et al. |
| 6,238,381 B1 | 5/2001 | Tapper |
| 6,266,560 B1 | 7/2001 | Zhang et al. |
| 6,285,486 B1 | 9/2001 | Kobayashi et al. |
| 6,288,104 B1 | 9/2001 | Gericke et al. |
| 6,291,677 B1 | 9/2001 | Vasudevan et al. |
| 6,294,582 B1 | 9/2001 | Jerussi |
| 6,313,396 B1 | 11/2001 | Glenn |
| 6,317,189 B1 | 11/2001 | Yuan et al. |
| 6,324,053 B1 | 11/2001 | Kamijo |
| 6,327,413 B1 | 12/2001 | Kinoshita |
| 6,333,458 B1 | 12/2001 | Forrest et al. |
| 6,338,882 B1 | 1/2002 | Dultz et al. |
| 6,341,057 B1 | 1/2002 | Nissen et al. |
| 6,357,904 B1 | 3/2002 | Kawashima |
| 6,381,482 B1 | 4/2002 | Jayaraman et al. |
| 6,385,355 B1 | 5/2002 | Nashimoto et al. |
| 6,392,338 B1 | 5/2002 | Hori et al. |
| 6,404,074 B2 | 6/2002 | Saito et al. |
| 6,404,789 B1 | 6/2002 | Kopp et al. |
| 6,414,235 B1 | 7/2002 | Luch |
| 6,436,613 B1 | 8/2002 | Fallahi et al. |
| 6,437,903 B1 | 8/2002 | Kozhukh |
| 6,472,594 B1 | 10/2002 | Ichinose et al. |
| 6,472,817 B1 | 10/2002 | Kawase |
| 6,515,218 B1 | 2/2003 | Shimizu et al. |
| 6,525,759 B2 | 2/2003 | Kawai |
| 6,525,847 B2 | 2/2003 | Popovich et al. |
| 6,538,775 B1 | 3/2003 | Bowley et al. |
| 6,556,137 B1 | 4/2003 | Oka et al. |
| 6,559,555 B1 | 5/2003 | Saitou et al. |
| 6,580,094 B1 | 6/2003 | Yamazaki et al. |
| 6,613,977 B1 | 9/2003 | Fowler |
| 6,661,034 B2 | 12/2003 | Kawase |
| 6,667,134 B1 | 12/2003 | Sutherland et al. |
| 6,674,136 B1 | 1/2004 | Ohtani |
| 6,687,040 B2 | 2/2004 | Kimura |
| 6,689,316 B1 | 2/2004 | Blyth et al. |
| 6,692,718 B1 | 2/2004 | Osawa |
| 6,697,035 B2 | 2/2004 | Sugahara et al. |
| 6,706,961 B2 | 3/2004 | Shimizu et al. |
| 6,750,471 B2 | 6/2004 | Bethune et al. |
| 6,754,408 B2 | 6/2004 | Toda et al. |
| 6,766,082 B2 | 7/2004 | Hirabayashi et al. |
| 6,778,236 B1 | 8/2004 | Crawford et al. |
| 6,785,036 B1 | 8/2004 | Berneth et al. |
| 6,791,024 B2 | 9/2004 | Toyomura |
| 6,808,523 B2 | 10/2004 | Fujisaka et al. |
| 6,809,343 B2 | 10/2004 | Yamazaki et al. |
| 6,816,140 B2 | 11/2004 | Fujieda |
| 6,819,386 B2 | 11/2004 | Roosendaal et al. |
| 6,821,457 B1 | 11/2004 | Natarajan et al. |
| 6,830,594 B2 | 12/2004 | Shinozaki et al. |
| 6,842,573 B2 | 1/2005 | Birnbach |
| 6,868,854 B2 | 3/2005 | Kempe |
| 6,879,618 B2 | 4/2005 | Cok et al. |
| 6,882,517 B2 | 4/2005 | Tano et al. |
| 6,888,305 B2 | 5/2005 | Weaver |
| 6,895,138 B2 | 5/2005 | Toda et al. |
| 6,901,175 B2 | 5/2005 | Baxter et al. |
| 6,906,911 B2 | 6/2005 | Ikeda et al. |
| 6,940,092 B2 | 9/2005 | Yoshida et al. |
| 6,946,597 B2 | 9/2005 | Sager et al. |
| 6,950,220 B2 | 9/2005 | Abramson et al. |
| 6,950,453 B2 | 9/2005 | Biswas et al. |
| 6,960,841 B2 | 11/2005 | Saitou et al. |
| 6,961,105 B2 | 11/2005 | Chang et al. |
| 7,018,563 B1 | 3/2006 | Sutherland et al. |
| 7,024,094 B2 | 4/2006 | Kimura |
| 7,030,556 B2 | 4/2006 | Adachi et al. |
| 7,047,080 B2 | 5/2006 | Palanker et al. |
| 7,079,730 B2 | 7/2006 | Fallahi et al. |
| 7,082,236 B1 | 7/2006 | Moore |
| 7,088,490 B2 | 8/2006 | Nakaho et al. |
| 7,091,411 B2 | 8/2006 | Falk et al. |
| 7,092,046 B2 | 8/2006 | Feoktistov et al. |
| 7,095,041 B2 | 8/2006 | Cho et al. |
| 7,173,806 B2 | 2/2007 | Hinoki et al. |
| 7,180,649 B2 | 2/2007 | Morrison et al. |
| 7,183,050 B2 | 2/2007 | Krull |
| 7,233,250 B2 | 6/2007 | Forster |
| 7,235,331 B2 | 6/2007 | Noda et al. |
| 7,250,930 B2 | 7/2007 | Hoffman et al. |
| 7,256,099 B2 | 8/2007 | Takahashi et al. |
| 7,279,751 B2 | 10/2007 | Ueda et al. |
| 7,279,752 B2 | 10/2007 | Yamazaki et al. |
| 7,279,833 B2 | 10/2007 | Adachi et al. |
| 7,303,975 B2 | 12/2007 | Hinoki et al. |

(56) References Cited

U.S. PATENT DOCUMENTS

| | | | |
|---|---|---|---|
| 7,312,976 B2 | 12/2007 | Kazaryan et al. | |
| 7,316,789 B2 | 1/2008 | Lu | |
| 7,327,509 B2 | 2/2008 | Nakaho | |
| 7,352,500 B2 | 4/2008 | Jagt et al. | |
| 7,369,295 B2 | 5/2008 | Morita et al. | |
| 7,382,602 B2 | 6/2008 | Sakata et al. | |
| 7,394,140 B2 | 7/2008 | Patel et al. | |
| 7,394,648 B2 | 7/2008 | Kondo et al. | |
| 7,412,281 B2 | 8/2008 | Shen et al. | |
| 7,424,782 B2 | 9/2008 | Cheskin | |
| 7,428,395 B2 | 9/2008 | Takahashi et al. | |
| 7,436,577 B2 | 10/2008 | Moriyama et al. | |
| 7,443,650 B2 | 10/2008 | Nedoshivin et al. | |
| 7,454,103 B2 | 11/2008 | Parriaux | |
| 7,462,774 B2 | 12/2008 | Roscheisen et al. | |
| 7,463,198 B2 | 12/2008 | Deaett et al. | |
| 7,468,222 B2 | 12/2008 | Takahashi et al. | |
| 7,476,222 B2 | 1/2009 | Sun et al. | |
| 7,477,938 B2 | 1/2009 | Sun et al. | |
| 7,477,939 B2 | 1/2009 | Sun et al. | |
| 7,477,940 B2 | 1/2009 | Sun et al. | |
| 7,477,941 B2 | 1/2009 | Sun et al. | |
| 7,479,133 B2 | 1/2009 | Sun et al. | |
| 7,480,530 B2 | 1/2009 | Sun et al. | |
| 7,486,989 B2 | 2/2009 | Sun et al. | |
| 7,495,146 B2 | 2/2009 | Crisp | |
| 7,504,953 B2 | 3/2009 | Forster | |
| 7,507,228 B2 | 3/2009 | Sun et al. | |
| 7,507,903 B2 | 3/2009 | Luch | |
| 7,528,907 B2 | 5/2009 | Sung | |
| 7,539,533 B2 | 5/2009 | Tran | |
| 7,558,622 B2 | 7/2009 | Tran | |
| 7,567,209 B2 | 7/2009 | Tanaka et al. | |
| 7,586,035 B2 | 9/2009 | Gaudiana et al. | |
| 7,599,652 B2 | 10/2009 | Takagami | |
| 7,601,942 B2 | 10/2009 | Underwood et al. | |
| 7,605,327 B2 | 10/2009 | Roscheisen et al. | |
| 7,618,267 B2 | 11/2009 | Konno et al. | |
| 7,622,667 B2 | 11/2009 | Chittibabu et al. | |
| 7,633,179 B2 | 12/2009 | Kobayashi | |
| 7,635,600 B2 | 12/2009 | Zhang et al. | |
| 7,635,810 B2 | 12/2009 | Luch | |
| 7,638,216 B2 | 12/2009 | Yang et al. | |
| 7,643,201 B2 | 1/2010 | Nakaho et al. | |
| 7,643,874 B2 | 1/2010 | Nitzan et al. | |
| 7,645,933 B2 | 1/2010 | Narkis et al. | |
| 7,651,647 B1 | 1/2010 | Strange et al. | |
| 7,657,297 B2 | 2/2010 | Simpson et al. | |
| 7,662,176 B2 | 2/2010 | Skiba et al. | |
| 7,664,476 B2 | 2/2010 | Yanagida | |
| 7,672,719 B2 | 3/2010 | Skiba et al. | |
| 7,708,787 B2 | 5/2010 | Hinoki et al. | |
| 7,754,382 B2 | 7/2010 | Kurihara et al. | |
| 7,771,495 B2 | 8/2010 | Kobayashi et al. | |
| 7,771,799 B2 | 8/2010 | Kobayashi et al. | |
| 7,787,169 B2 | 8/2010 | Abramson et al. | |
| 7,794,629 B2 | 9/2010 | Youngs | |
| 7,820,321 B2 | 10/2010 | Horne et al. | |
| 2001/0016283 A1 | 8/2001 | Shiraishi et al. | |
| 2001/0019434 A1 | 9/2001 | Popovich et al. | |
| 2002/0130988 A1 | 9/2002 | Crawford et al. | |
| 2002/0145792 A1 | 10/2002 | Jacobson et al. | |
| 2003/0064565 A1 | 4/2003 | Maletin et al. | |
| 2003/0071948 A1 | 4/2003 | Felder et al. | |
| 2003/0169557 A1 | 9/2003 | Noguchi et al. | |
| 2003/0191275 A1 | 10/2003 | Leonte et al. | |
| 2004/0002002 A1 | 1/2004 | Mizuta et al. | |
| 2004/0008391 A1 | 1/2004 | Bowley et al. | |
| 2004/0121204 A1 | 6/2004 | Adelman et al. | |
| 2004/0137204 A1 | 7/2004 | Sutherland et al. | |
| 2004/0207539 A1 | 10/2004 | Schultz et al. | |
| 2005/0018960 A1 | 1/2005 | De Bougrenet De La Tocnaye et al. | |
| 2005/0052609 A1 | 3/2005 | Pan et al. | |
| 2005/0099930 A1 | 5/2005 | Volodin et al. | |
| 2005/0140837 A1 | 6/2005 | Crawford et al. | |
| 2005/0227146 A1 | 10/2005 | Ghantous et al. | |
| 2005/0250052 A1 | 11/2005 | Nguyen | |
| 2006/0239171 A1 | 10/2006 | Ooi et al. | |
| 2007/0020561 A1 | 1/2007 | Hisada et al. | |
| 2008/0239420 A1 | 10/2008 | McGrew | |
| 2008/0281014 A1 | 11/2008 | Momose et al. | |
| 2008/0297980 A1 | 12/2008 | Bourcier et al. | |
| 2009/0027828 A1 | 1/2009 | Jung et al. | |
| 2009/0190286 A1 | 7/2009 | Tian et al. | |
| 2009/0272946 A1 | 11/2009 | Lu | |
| 2010/0008021 A1 | 1/2010 | Hu et al. | |
| 2010/0014216 A1 | 1/2010 | Cadek et al. | |
| 2010/0033903 A1 | 2/2010 | Kim et al. | |
| 2010/0047671 A1 | 2/2010 | Chiang et al. | |
| 2010/0073605 A1 | 3/2010 | Masutani et al. | |
| 2010/0119815 A1 | 5/2010 | Kim | |
| 2010/0151318 A1* | 6/2010 | Lopatin et al. | 429/163 |
| 2010/0203391 A1 | 8/2010 | Lopatin et al. | |
| 2010/0216026 A1 | 8/2010 | Lopatin et al. | |
| 2010/0219067 A1 | 9/2010 | Koval et al. | |
| 2010/0231997 A1 | 9/2010 | Fontecchio et al. | |
| 2011/0199563 A1 | 8/2011 | Fontecchio et al. | |
| 2013/0244121 A1 | 9/2013 | Gogotsi et al. | |

FOREIGN PATENT DOCUMENTS

| | | |
|---|---|---|
| WO | WO 94/09441 | 4/1994 |
| WO | WO 01/16023 | 3/2001 |
| WO | WO 01/37244 | 5/2001 |
| WO | WO 2005/110592 | 11/2005 |
| WO | WO 2008/069833 A2 | 6/2008 |
| WO | WO 2009/023449 | 2/2009 |
| WO | WO 2009/123784 A2 | 10/2009 |
| WO | WO 2009/156775 | 12/2009 |
| WO | WO 2010/045308 | 4/2010 |
| WO | WO 2010/091352 | 8/2010 |
| WO | WO 2012/037445 | 3/2012 |
| WO | WO 2012/058652 | 5/2012 |
| WO | WO 2013/027006 | 2/2013 |

OTHER PUBLICATIONS

Kamanina et al. "Fullerene-Doped Polymer Dispersed Liquid Crystals Holographic Recording and Optical Limiting Effect", Proc. SPIE, Apr. 2001, 4347, 487-492.
Massenot, "etude, Modelisation et Realtization de Composants Diffractants: Contribution a l'etude de Materiaux Accordables et application a l'enregistrement Holographique des filters Resonants", these, Feb. 2006, 175 pages (with English Abstract).
Shriyan et al. "Electro-Optical Effect of Oxidized Multiwalled Carbon Nanotube Doping on Holographic Polymer Dispersed Liquid Crystal Films", Proc. SPIE, 2009, 7414, article 741407, 8 pages.
Woo et al. "Dual Effects of Fullerene Doped to Holographic Polymer Dispersed Liquid Crystals" J Poly. Sci. A: Poly. Chem., Dec. 1, 2007, 45(23), 5590-5596.
Yaroshchuk et al., "Electro-optics and Structure of Polymer Dispersed Liquid Crystals Doped With Nanoparticles of Inorganic Materials" Opt. Mater., Apr. 2007, 29(8),1097-1102.
Rai et al, "Fabrication Technique for Broadening Reflected Wavelengths of Thin Film Holograms", NECF Meeting Abstracts, 33rd New England Complex Fluids Meeting, Nov. 28, 2007, 14 pages.
U.S. Appl. No. 13/828,520, filed Mar. 14, 2013, Fontecchio et al.
U.S. Appl. No. 13/881,608, filed Apr. 25, 2013, Fontecchio et al.
"The Future of ITO: Transparent Conductor and ITO Replacement Markets", http://www.researchandmarkets.com/search.asp?q=The%20Future%20of%20ITO:%20Transparent%20Conductor%20and%20ITO%20Replacement%20Markets, NanoMarkets, Mar. 2008, 1 page.
Bowley et al., "Reflection from dual domains in a holographically formed polymer dispersed liquid crystal material", Appl. Phys. Lett., May 1999, 74(21), 3096-3098.
Brenner, D.W. et al., "A second-generation reactive empirical bond order (REBO) potential energy expression for hydrocarbons", Phys. Condens. Matter., Feb. 2002, 14(4), 783-802.

(56) References Cited

OTHER PUBLICATIONS

Bushueva et al., "Double layer supercapacitor properties of onion-like carbon materials," Phys. Stat. Sol. (b), Oct. 2008, 245(10), 2296-2299.
Du Pasquier et al., "A comparative study of Li-ion battery, supercapacitor and nonaqueous asymmetric hybrid devices for automotive applications," Journal of Power Sources, Mar. 2003, 115(1), 171-178.
Fontecchio et al., "Diffuse renditions of spatially pixelated and temporally multiplexed H-PDLCs for full color reflective displays", SID Symposium Digest of Technical Papers, Jun. 2001, 32(1), 348-351.
Fontecchio et al., "Multiplexed holographic polymer dispersed liquid crystals", J. Opt. Technol., Sep. 2001, 68(9), 652-656.
Fox et al., "Holographically formed polymer dispersed liquid crystal films for transmission mode spectrometer applications", Appl. Opt., Sep. 2007, 46(25), 6277-6282.
Huang et al., "Curvature effects in carbon nanomaterials: Exohedral versus endohedral supercapacitors," J. Mater. Res., Aug. 2010, 25(8), 1525-1531.
In et al., "Origami fabrication of nanostructured, three-dimensional devices: electrochemical capacitors with carbon electrodes", Appl. Phys. Lett., Feb. 2006, 88, 083104-1-083104-3.
International Patent Application No. PCT/US2011/051903: International Search Report and Written Opinion dated Mar. 21, 2012, 18 pages.
International Patent Application No. PCT/US2011/058483: International Search Report and Written Opinion dated Apr. 25, 2012, 14 pages.
Kaempgen et al., "Printable thin film supercapacitors using single-walled carbon nanotubes", Nano. Lett., Apr. 2009, 9(5), 1872-1876.
Kaiser et al., "Chirped switchable reflection grating in holographic polymer-dispersed liquid crystal for spectral flattening in free space optical communication systems", Appl. Opt., Nov. 2004, 43(32), 5996-6000.
Kinoshita, K., "Electrochemical Uses of Carbon," Electrochemistry Encyclopedia, available at http://electrochem.cwru.edu/encycl/art-c01-carbon.htm, Jan. 2001, 12 pages.
Kuznetsov et al., "Effect of explosion conditions on the structure of detonation soots: ultradisperse diamond and onion carbon," Carbon, 1994, 32(5), 873-882.
Kuznetsov, V.L., et al. "Onion-like carbon from ultra-disperse diamond," Chem. Phys. Lett., May 1994, 222(4), 343-348.
Lin et al., "Microelectrode Study of Pore Size, Ion Size, and Solvent Effects on the Charge/Discharge Behavior of Microporous Carbons for Electrical Double-Layer Capacitors", Journal of the Electrochemical Society, 2009, 156(1), A7-A12.
Osswald, S., et al., "Control of sp2/sp3 carbon ratio and surface chemistry of nanodiamond powders by selective oxidation in air", J. Am. Chem. Soc., Sep. 2006, 128(35), 11635-11642.
Park et al., "Pseudocapacitive Behavior of Carbon Nanoparticles Modified by Phosphomolybdic Acid," Journal of the Electrochemical Society, Sep. 2009, 156(11), A921-A926.
Pech et al., "Ultrahigh-power micrometre-sized supercapacitors based on onion-like carbon," Nature Nanotechnology, Aug. 2010, 5(9), 651-654.
Pech, D. et al., "Elaboration of a microstructured inkjet-printed carbon electrochemical capacitor", J. Power Sources, Feb. 2010, 195(4), 1266-1269.
Plonska-Brzezinska et al., "Electrochemical Properties of Small Carbon Nano-Onion Films," Electrochemical and Solid-State Letters, Jan. 2010, 13(4), K35-K38.
Portet et al., "Electrochemical characterizations of carbon nanomaterials by the cavity microelectrode technique," Electrochimica Acta, Nov. 2008, 53(26), 7675-7680.
Portet et al., "Electrochemical performance of carbon onions, nanodiamonds, carbon black and multiwalled nanotubes in electrical double layer capacitors," Carbon, Nov. 2007, 45(13), 2511-2518.
Qi et al., "Holographically formed polymer dispersed liquid crystal displays", Displays, Dec. 2004, 25(5), 177-186.
Qi et al., "Temporally multiplexed holographic polymer dispersed liquid crystals", Appl. Phys. Lett., Mar. 2003, 82(11), 1652-1654.
Rai, "Study of Spectral Sensing using Electro-Optic Films", Thesis Submitted to the Faculty Drexel University, Sep. 2009, 180 pages.
Shriyan et al., "Multilayer Stacking Technique for Holographic Polymer Dispersed Liquid Crystals", Applied Physics Letters, 93, 261113, 2008, 3 pages.
Wang et al., "Facile Synthesis of Ordered Mesoporous Carbons with High Thermal Stability by Self-Assembly of Resorcinol-Formaldehyde and Block Copolymers under Highly Acidic Conditions", Langmuir, Jun. 2008, 24(14), 7500-7505.
Yoo et al., "Plastic Electronics Could Slash the Cost of Solar Panels", Princeton University, Apr. 14, 2010, 3 pages.
Zheng et al., "Carbon with an onion-like structure obtained by chlorinating titanium carbide," Journal of Materials Chemistry, Apr. 2000, 10(5), 1039-1041.
Basavalingu, B. et al., "Decomposition of silicon carbide in the presence of organic compounds under hydrothermal conditions", Carbon, 39, 2001, 1763-1767.
Bleicher, A., "Nano-Onions Give Supercapacitors Extra Oomph", IEEE Spectrum, Aug. 2010, 2 pages.
Brogioli, D. et al., "A prototype cell for extracting energy form a water salinity difference by means of double layer expansion in nanoporous carbon electrode", Energy Environ. Sci. Jan. 2011, 4, 772-777.
Dash, R. et al., "Titanium carbide derived nanoporous carbon for energy-related applications", Carbon 44, Oct. 2006, 2489-2497.
Deshmukh, A. A. et al., "Carbon spheres", Material Science and Engineering R 70 Sep. 2010,1-28.
Guangda Li et al., "A Facile Approach for the Synthesis of Uniform Hollow Carbon Nanospheres", J Phys Chem C, Jan. 2008, 112, 1896-1900.
Lei, Z. et al., "Mesoporous carbon nanospheres with an excellent electrocapacitive performance", J. Mater. Chem., Dec. 2011, 21, 2274-2281.
Lu Wei et al., "Hydrothermal Carbonization of Abundant Renewable Natural Organic Chemicals for High-Performance Supercapacitor Electrodes", Adv. Energy Mater., May 2011, 1, 356-361.
Rose, M. et al., "Hierarchical Micro- and Mesoporous Carbide-Derived Carbon as a High-Performance Electrode Material in Supercapacitors", small, Mar. 2011, 7(8), 1108-1117.

* cited by examiner (A)

(B)

(A)

(B)

Working electrode:
Pt wire with 125 μm diameter
and 30 μm deep cavity

Counterelectrode:
Pt foil

APPLICATIONS FOR ALLIFORM CARBON

CROSS-REFERENCE TO RELATED APPLICATIONS

This application is the National Stage of international application number PCT/US2011/051903 filed Sep. 16, 2011, which claims the benefit of U.S. provisional application No. 61/383,951, filed Sep. 17, 2010 and U.S. provisional application No. 61/387,156, filed Sep. 28, 2010, the disclosures of which are incorporated herein by reference in their entireties.

GOVERNMENT SUPPORT

This invention was made with government support under Contract No. DE-AC05-00OR22725 awarded by the U.S. Department of Energy. The government has certain rights in the invention.

TECHNICAL FIELD

This invention relates to novel applications for alliform carbon, including conductors and energy storage devices, including electrical double layer capacitor devices and articles incorporating such devices. Said novel applications include supercapacitors and conductors, and associated electrode devices, batteries, electro-optic devices, functional clothing or textiles, and bandages and wound healing devices.

BACKGROUND

The recent boom in multi-function portable electronic equipments and the increasing need for wireless sensor networks for the development of smart environments raise the problem of compact and/or flexible energy storage. Designing efficient miniaturized energy storage devices that can achieve high energy delivery or can harvest at high discharge rates with a lifetime that matches or exceeds that of the machine being powered remains a challenge. The integration of the storage element as close as possible to the electronic circuit (directly on a chip or within a flexible substrate, for example, including clothing) is another challenge. Since electrochemical energy storage in batteries occurs by volumetric reactions, the charge-discharge rate and specific power of the best (Li-ion) batteries are limited by the rate of solid-state diffusion. The redox reactions and expansion-contraction of the active material limit the lifetime to hundreds or thousands of cycles. These problems can only be partially resolved by using nano-structured materials. The properties of thin-film batteries, despite their excellent energy per unit volume, drop dramatically in the microscale range.

Electric double-layer capacitors (EDLCs), also called supercapacitors, store energy using an accumulation of ions of opposite charge in a double layer at electrochemically-stable high specific surface area electrodes. EDLCs do not have a conventional dielectric. Rather than two separate plates separated by an intervening substance, these capacitors use "plates" that are in fact two layers of the same substrate, and their electrical properties, the so-called "electrical double layer", result in the effective separation of charge despite the vanishingly thin (on the order of nanometers) physical separation of the layers. The lack of need for a bulky layer of dielectric permits the packing of "plates" with much larger surface area into a given size, resulting in extraordinarily high capacitances in practical-sized packages.

In an electrical double layer, each layer by itself is quite conductive, but the physics at the interface where the layers are effectively in contact means that no significant current can flow between the layers. The high surface to volume ratio of the active material promotes the energy and power densities of EDLCs, and is further enhanced in micro-supercapacitors. By offering fast charging and discharging rates, and the ability to sustain millions of cycles, electrochemical capacitors bridge the gap between batteries, which offer high energy densities but are slow, and conventional electrolytic capacitors, which are fast but have low energy densities.

EDLCs have much higher power density than batteries. In fact, existing EDLCs have energy densities that are perhaps $\frac{1}{10}$th that of a conventional battery, their power density is generally 10 to 100 times as great (see, e.g., FIG. 1).

Typical materials used for supercapacitors have been limited to activated carbon, graphene, carbon nanotubes, carbon aerogels, and certain conductive polymers. However, few studies have been performed on nanoparticles that do not have narrow pores, unlike activated carbons or nanotubes, wherein the transport of ions may be the rate controlling factor limiting the charge/discharge rate.

Micro-supercapacitors have yet to be described which exhibit the combination of high capacitance, especially high power, and high discharge rates necessary for wide-scale commercial use. There is a clear need in the market for devices that are capable of exhibiting high capacitance levels wherein the powers per volume that are at least comparable to electrolytic capacitors, the energies per volume are higher than electrolytic capacitors, and which exhibit discharge rates significantly higher than conventional supercapacitors. Such devices are available through the present invention.

While exploring the properties of materials of a genus of materials identified herein and hereinafter described as alliform carbon, the present inventors have also discovered properties that, in addition to solving the problems just described, open a wide range of new application possibilities. These new applications include the use of alliform carbon particles in activated carbon electrodes, batteries, and current collectors (and/or the interface of EDLCs therewith), where the particle properties provide for enhanced performance of those devices. Alliform carbon particles also can be used in binderless EDCLs and in conductors and integrated energy storage devices on flexible substrates such as paper, plastics, and woven and non-woven fabrics. This latter discovery—the ability to design functional electrical storage devices in woven and non-woven fabrics—opens the possibility of functional fabrics and medical treatments that provide significant advantages over existing technologies. Each of these options is described below.

SUMMARY

This invention relates to conductors and energy storage devices, more particularly to electrical double layer capacitor devices based on alliform carbon, articles incorporating such conductors and devices, and methods of making such conductors and devices.

Some embodiments of this invention provide electrodes, including carbon electrodes, comprising alliform carbon particles, wherein the alliform carbon is included at concentrations, for example, in the range of about 2 to about 50 weight percent, based on the weight of the entire electrode.

This invention also teaches methods for making binderless monolithic alliform carbon electrodes as including hot pressing, cold pressing and annealing shaped bodies, or thermally annealing flat sheets in an oxygen deficient atmosphere, wherein the precursor is either a plurality of detonated nanodiamonds or preformed alliform carbon particles. In some cases, the heat treatment is done in the presence of an optional organic binder.

Other embodiments of this invention provide energy storage devices, wherein each device comprises (a) a first and a second electrode, each electrode comprising a body in electrical communication with a current collector; and (b) an electrolyte; wherein at least one body comprises a three dimensionally porous matrix of alliform carbon particles, said alliform carbon particles having a mean diameter as measured by TEM (transmission electron microscopy) photomicrograph image analysis of from 2 to about 30 nanometers, the alliform carbon particles being substantially physically connected; and wherein the electrolyte physically contacts and is in electrical communication with said matrix of alliform carbon particles. Preferred embodiments include those in which an energy storage device is superposed on a substrate, and the electrodes are configured so as to comprise interdigital fingers. Other embodiments of this invention include electrical circuits or a devices comprising at least one of the energy storage devices described herein.

Still other embodiments include methods of making these energy storage devices comprising organizing the plurality of alliform carbon particles into a 3-dimensional porous matrix.

In other embodiments, alliform carbon is included in a paint, glue, or coating material used in current electrodes as an additive to improve the performance of the associated battery, fuel cell, or supercapacitor energy storage device.

In still other embodiments, alliform carbon is included in a conducting or semi-conducting polymer, ionomers, or graphitic composition. Such a composition may be used alone or applied or associated with a range of surfaces, including flexible, rigid or transparent flat substrates, or fibers or fabrics.

In other embodiments, alliform carbon particles or films are used in the construction of electro-optic displays, lasers, waveguides, and solar cells. Other embodiments include those devices or equipment which included these electro-optic displays, lasers, waveguides, and solar cells.

In yet further embodiments, alliform carbon particles are adhered to or incorporated into microfibrils, filaments, fibers, yarns, or fabrics. Additional embodiments include garments containing microfibrils, filaments, fibers, yarns, or fabrics comprising alliform carbon, thereby providing for the electrical functionalization of these materials. Specific embodiments include those where the functionalization provides for electromagnetic shielding, identifying the wearer's physical location and medical status, for capturing, storing, and later releasing the energy of movement or static electricity, and for the treatment of medical conditions.

BRIEF DESCRIPTION OF THE DRAWINGS

FIG. 13(D) shows data derived from particles formed at different synthesis temperatures. The data here show alliform carbon particles synthesized at 1500° C. show peak capacitive behavior. At higher synthesis temperatures, higher conductivity and a more capacitive behavior. FIG. 13(E) shows data as a function of scan rate. Alliform carbon particles are highly capacitive at a rate of 10 V/s and still show good capacitive behavior at very high scan rates like 100 V/s.

FIG. 31A is a cyclic voltammogram wherein alliform carbon is added to activated carbon on a polyester microfiber fabric. FIG. 31B compares the performance of alliform carbon when added to activated carbon and carbide derived carbon adhered to polyester microfibers, and as compared with the performance of activated carbon on polypyrrole coated Poly/Nylon (FIG. 31C). Under the conditions tested, the maximum gravimetric capacitance for activated carbon was 62 F/g and can increase to 99 F/g with the addition of alliform carbon. Similarly, the addition of alliform carbon can increase the capacitance of TiC CDC to 160 F/g. These compare with activated carbon on polypyrrole coated Poly/Nylon to 160 F/g to 200 F/g.

DETAILED DESCRIPTION OF ILLUSTRATIVE EMBODIMENTS

Figure 1:
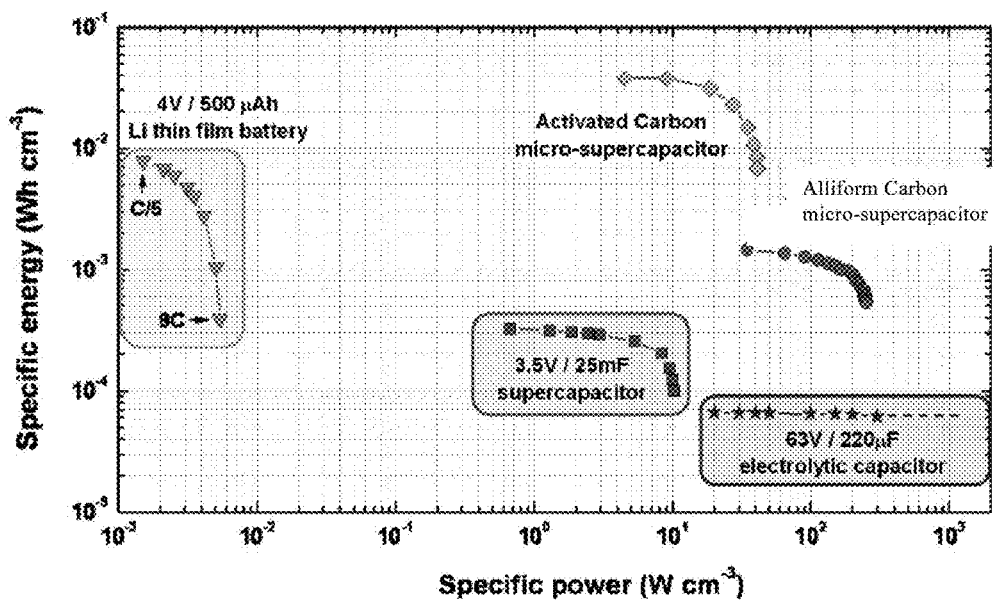
FIG. 1 provides a comparison of the specific energy and power density (per $cm^3$ of stack) for typical electrolytic capacitors, supercapacitors and batteries with the micro-devices of the present invention in a Ragone plot. The non-limiting results shown in this Figure (macro and micro) resulted from testing each device the same dynamic conditions (see Example 3). Very high energy density was obtained with the activated carbon based micro-supercapacitor, while ultrahigh power density is obtained with the alliform carbon based micro-supercapacitor.

The present invention is directed to energy storage devices, conductors, and circuits and articles which contain such devices and conductors, and methods for making said energy storage devices and conductors. Some embodiments of this invention provide electrodes, including carbon electrodes, comprising alliform carbon particles, and methods of forming the same. Conductive pastes, glues, fibers, yarns, and fabrics, and methods of producing same and uses thereof, are also described herein.

Energy storage devices are described which comprise alliform carbon nanoparticles configured as one or more electrodes of an electrical double-layer capacitor, also known as an ultra- or supercapacitor, which are capable of high charge/discharge rates at high polarity cycle rates. More specifically, the devices described herein relate to the inclusion of alliform carbon in solid body electrodes or alliform carbon deposited on thin, flexible, and/or fabric materials.

Additionally, these micro-supercapacitors are capable of exhibiting powers per volume that are comparable to electrolytic capacitors, capacitances that are four orders of magnitude higher, and energies per volume that are an order of magnitude higher than electrolytic capacitors. Discharge rates of 200 V/s, and higher, are available from such devices, this value being three orders of magnitude higher than conventional supercapacitors. The integration of nanostructured alliform carbon particles in micro-devices of high surface to volume ratio provides devices which are able to compete with batteries and conventional electrolytic capacitors in a number of applications.

The present invention may be understood more readily by reference to the following detailed description taken in connection with the accompanying Tables and Figures, which form a part of this disclosure. It is to be understood that this invention is not limited to the specific products, methods, conditions or parameters described and/or shown herein, and that the terminology used herein is for the purpose of describing particular embodiments by way of example only and is not intended to be limiting of any claimed invention. Similarly, any description as to a possible mechanism or mode of action or reason for improvement is meant to be illustrative only, and the invention herein is not to be constrained by the correctness or incorrectness of any such suggested mechanism or mode of action or reason for improvement. Throughout this text, it is recognized that the descriptions refer both to the method of preparing articles and to the resulting, corresponding physical articles themselves, as well as the referenced and readily apparent applications for such articles.

In the present disclosure the singular forms "a," "an," and "the" include the plural reference, and reference to a particular numerical value includes at least that particular value, unless the context clearly indicates otherwise. Thus, for example, a reference to "a material" is a reference to at least one of such materials and equivalents thereof known to those skilled in the art, and so forth.

When values are expressed as approximations by use of the antecedent "about," it will be understood that the particular value forms another embodiment. In general, use of the term "about" indicates approximations that can vary depending on the desired properties sought to be obtained by the disclosed subject matter and is to be interpreted in the specific context in which it is used, based on its function, and the person skilled in the art will be able to interpret it as such. In some cases, the number of significant figures used for a particular value may be one non-limiting method of determining the extent of the word "about." In other cases, the gradations used in a series of values may be used to determine the intended range available to the term "about" for each value. Where present, all ranges are inclusive and combinable. That is, a reference to values stated in ranges includes each and every value within that range.

It is to be appreciated that certain features of the invention which are, for clarity, described herein in the context of separate embodiments, may also be provided in combination in a single embodiment. Conversely, various features of the invention that are, for brevity, described in the context of a single embodiment, may also be provided separately or in any subcombination. Finally, while an embodiment may be described as part of a series of steps or part of a more general composition or structure, each said embodiment may also be considered an independent embodiment in itself. The inventors claim each and every permutation of the embodiments described herein.

As used herein, the term "alliform carbon particles" refers to substantially spherical or quasi-spherical carbon nanoparticles comprising at least one concentric external graphitic shell, but generally more than one such external shell, resembling the concentric shells of an onion (the term "alliform" derived from "allium" meaning onion). In fact, particles described as "carbon onions" or "onion-like carbon" particles, in many respects, are related to these alliform carbon particles, but these terms are normally associated with particles having multiple concentric shells. The external graphitic shell or shells of alliform carbon have surfaces wherein at least 25%, or at least 50%, or at least 75% of their area comprise $sp^2$ carbon. The term "substantially spherical" relates to the shape being without near-sized appendages (i.e., having appendages such as carbon nanotubes) which substantially interfere with their ability to organize into packed matrices. To the extent that a given particle or population of particles deviates from a purely spherical shape, such that each particle can be described as having a major and minor axis, the ratio of the lengths of the major and minor axis of each particle can be less than about 2, less than about 1.5, less than about 1.3, less than about 1.2, less than about 1.1, or less than about 1.05 or less than about 1.02. As used herein, where the particles are other than purely spherical, the term "mean diameter" refers to the arithmetic average of the lengths of the major and minor axes of the particles. Independent embodiments provide that the alliform carbon particles have a mean diameter in the range of about 2 nm to about 30 nm, in the range of about 2 to about 20 nm, in the range of about 2 to about 10 nm, and in the range of about 5 nm to about 10 nm; however, particles having mean diameters encompassing a larger range (i.e., 1 to about 50 nm) may also be acceptable. Described more generally, particles having a mean diameter range wherein the lower end of the range is independently about 1, 2, 4, 6, 10 or 20 nm and the upper end of the range is about 50, 40, 30, 25, 20, 15, or 10 nm are encompassed by this invention. These particle sizes and distributions are defined herein by TEM photomicrograph analysis. In this method, a predetermined number of particles—(more than 100) are analyzed in representative transmission electron micrographs (typically derived from more than 3 randomly selected powder samples) by measuring the mean diameters of the particles, counting particles within a pre-determined size fraction gradient, and statistically correlating those numbers.

Figure 2:
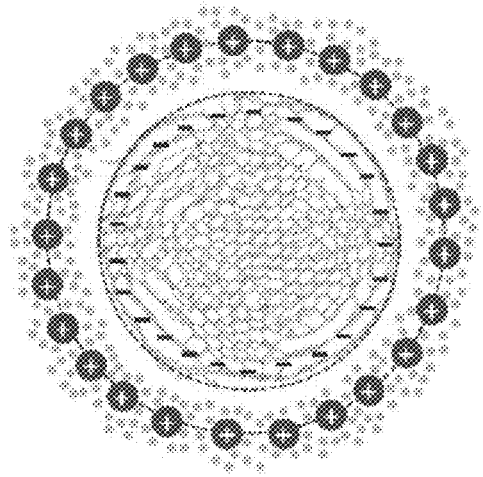
FIG. 2 illustrates (A) a cross-section schematic of a charged zero-dimensional alliform carbon capacitor, consisting of two layers of charges forming the inner and outer spheres; and (B) a Transmission Electron Microscopy (TEM) image of an alliform carbon particle produced at 1800° C. Lattice spacing between the bent graphitic layers in the particle is close to 0.35 nm.
Figure 2:
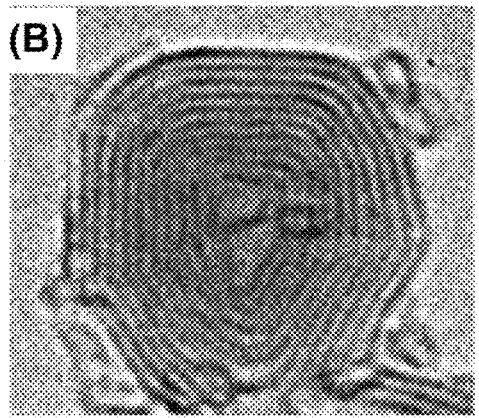

Given these diameters, alliform carbon particles offer a moderate specific surface area as compared to activated carbons, but this surface is fully accessible to ion adsorption (FIG. 2A), in contrast to other commonly used nano- or microporous materials, where the large surface areas are made mainly by the nano- or micropores, which are inaccessible or only slowly accessible by ions. In an ideal case, they can be considered as multi-shell giant fullerenes, but the real particles have discontinuous and defective shells when synthesised at temperatures below 1800° C., as shown in FIG. 3D, or polygonized shells when higher temperatures or longer times are used. See Example 1.

This being said, various embodiments of the present invention describe those alliform carbon particles having a specific surface area in the range of about 250 to about 750 $m^2 g^{-1}$, with those having specific surface areas in the range of about 300 to about 700 $m^2 g^{-1}$, or about 350 to about 650 $m^2 g^{-1}$, or about 400 to about 600 $m^2 g^{-1}$ being preferred, and those having a specific surface area of about 500 $m^2 g^{-1}$ being more preferred.

The alliform carbon particles of the present invention can be made in several ways, including chemical vapor deposition and spark ignition. In the most preferred embodiment, said particles are derived by annealing detonation nanodiamond powders. The method is inexpensive and is widely used method to synthesize large amounts of alliform carbon. See, for example, Kuznetsov, V. L. et al. Effect of explosion conditions on the structure of detonation soots: ultradisperse diamond and onion carbon. Carbon 32, 873-882 (1994), which is incorporated by reference herein for this purpose. Detonation nanodiamonds tend to be unimodal in particle size distribution and available (and so produce alliform carbon particles) in the preferred sizes for the present invention. In various embodiments, annealing is done at temperatures in the range of about 1200° C. to about 2500° C., at temperatures in the range of about 1500° C. to about 2000° C., or at temperatures in the range of about 1800° C. to about 2000° C. The specific surface area, pore size and pore size distribution appear to be nearly independent of annealing temperatures, at least over the ranges just cited, but the electrical conductivity of the samples increase sharply with temperature, such that annealing temperatures about 1800° C. and particles annealed at this temperature appear to be preferred, as giving the best balance of power and energy capacity. Without being bound to any particular theory, it may be that the annealing step provides the requisite quality of graphitic surface, by converting the nanodiamond surface structure to a more thermodynamically stable graphitic structure. Particles produced by these methods (i.e., annealing at these temperatures or temperature ranges) represent additional embodiments of the present invention.

While the alliform carbon particles have been described thus far as spherical or quasi-spherical, it should be appreciated that surface imperfections exist on these particles. Indeed, in some embodiments, the surface roughness or contours may be deliberately modified to enhance the actual total surface area of the particles, using techniques known well in the art.

Additional characteristics of alliform carbon particles are described in C. Portet, G. Yushin, Y. Gogotsi, Carbon, 2007, v. 45, 2511-2518 and C. Portet, J. Chmiola, Y. Gogotsi, S. Park, K. Lian, Electrochimica Acta, 2008, v. 53, 7675-7680, each of which is incorporated by reference in its entirety, at least for this purpose.

Carbon Electrodes

In a "double-layer capacitor," high-surface-area carbon (~1000 $m^2/g$) serve as at least one of the two electrodes which are separated by a liquid electrolyte contained in a thin layer at the electrode surface. Because carbon is available in high surface area, and because it is electronically conducting, it is an attractive material for use in such supercapacitor applications. In addition, carbon is relatively stable in the capacitor environment.

Carbon black and/or activated carbon is currently used as an additive, at levels of about 2 weight percent to about 50 weight percent, typically at about 5 weight percent, based on the weight of the entire electrode. One of the several purposes for adding the alliform carbon is to improve conductivity and the overall performance of the cell.

In certain embodiments of the present invention, the carbon black and/or activated carbon is replaced in these carbon electrodes, at least in part, with alliform carbon. In various embodiments, the alliform is used instead of carbon black and/or activated carbon in this application, and the alliform carbon comprises greater than about 50 wt %, greater than about 60 wt %, greater than about 70 wt %, greater than about 80 wt %, greater than about 90 wt %, or greater than about 95 wt % of the total carbon in the electrode. In other embodiments, alliform carbon is added to carbon electrodes at lower levels, in the range of about 2 to about 50 weight percent, in the range of about 1 weight percent to about 40 weight percent, about 2 weight percent to about 30 weight percent, about 2 to about 20 weight percent, about 2 to about 10 weight percent, about 10 to about 50 weight percent, about 10 to about 40 weight percent, about 10 to about 30 weight percent, or in the range of about 5 to about 8 weight percent or about 20 to about 25 weight percent, in each case relative to the weight of the total carbon in the electrode. In part, the percentages of alliform carbon depend on the relative size of the various particles employed. While higher packing percentages are preferred, some porosity is preferred to allow the electrolyte or electrolyte solutions to penetrate into the internal void volumes of the electrodes.

In this regard, the use of alliform carbon offers several advantages. Additions of alliform carbon have the potential to further improve the overall performance considering the higher surface area and, hence, higher capacitance compared to carbon black and/or activated carbon. Also, the small particle size of alliform carbon, 5-10 nm, compared to that of carbon black (~40 nm) and/or activated carbon allows for better dispersion throughout the electrode which would lead to an overall better conductive network and performance. Additionally, the formation of a double layer on the outer surface of the alliform carbon particle, not inside pores, provides for an increased capacitive behavior of the alliform carbon particles. The closed graphitic surface with little or no defects has been shown to be beneficial for fast charging and discharging. Porous carbons, like activated carbon, comprise a pore which, depending on the size of the carbon particle, may lead to diffusion limitations as the ions attempt to move through the porous network at high rates.

TABLE 1

Comparison of the properties of carbon black and alliform carbon particles.

| | Conductivity (S/cm) | Capacitance (F/g) | Surface Area (m$^2$/g) | Particle Size (nm) |
|---|---|---|---|---|
| Carbon Black | 8 | 2 | 80 | 35 |
| Alliform Carbon | 4 | 30 | 500 | 5-8 |

In certain embodiments, the present invention provides for the substitution of at least a portion and, in some cases, all of the carbon black in electrodes. Exemplary embodiments include those devices, and the methods of making and using said electrodes, wherein alliform carbon is substituted for carbon black or activated carbon in U.S. Pat. No. 7,651,647 (related to methods of producing highly conductive battery electrodes), U.S. Pat. No. 7,443,650 (related to electrodes and current collectors for electrochemical capacitors), U.S. Pat. No. 7,312,976 (related to heterogeneous electrochemical supercapacitors and methods of making same), U.S. Pat. No. 6,906,911 (electric double layer capacitor having electrodes containing carbon black), U.S. Pat. Nos. 6,830,594, 5,953,204 (electric double layer capacitor having positive electrode containing carbon black), U.S. Pat. No. 5,786,555 (polarizable electrodes for electric double-layer capacitors), and U.S. Pat. No. 5,646,815 (electrodes for electrochemical capacitors comprising electrolyte layers having the same polymer and solvent), and United States Published Patent Application No. 20090272946, 20090190286, each of which is incorporated by reference in its entirety herein.

Binderless Alliform Carbon Electrodes for Supercapacitor Electrodes

Carbon electrodes made from spheroidal carbon powders (including so-called "carbon onions" and/or "onion-like carbon") have been made using a non-conductive binder, such as PTFE, to hold it together. As demonstrated in Pech, et al. "*Nature Nanotechnology* 5, 651-654 (2010), which is incorporated by reference herein in its entirety, the binder greatly reduces the overall properties of the electrode. Accordingly, it would be advantageous to construct monolithic carbon electrodes, comprising alliform carbon, that are "substantially free" of organic binder. The term "substantially free" means having less than 4 weight percent added organic binder, preferably less than 2 weight percent, and more preferably less than 1 weight percent, and most preferably no added organic binder, where the weight percent is based on the total weight of the body. This absence of organic binder is consistent with the description that the particles are "substantially physically connected." The term "substantially physically connected," as used herein, refers to the scenario wherein adjacent particles are positioned such that the π-electrons of the sp$^2$ graphene surface of a given alliform carbon particle is capable of interacting with the π-electrons of the sp$^2$ graphene surfaces of at least one adjacent alliform carbon particle. In some embodiments, adjoining alliform carbon particles are proximal to one another. In other embodiments, adjoining alliform carbon particles are at least in direct physical contact in their packed structures (i.e., surface to adjoining surface). Still other embodiments provide that the alliform carbon particles be actually sintered together. While not wishing to be bound by any particular theory, it appears that the connectivity of the external graphene or graphene-like shells is responsible for the rapid movement of electrical charge within the matrix. This would indicate that separate embodiments, wherein the alliform carbon particles are joined by molecular layers of sufficiently conductive metallic or organic conductors, would provide a similar performance as to that observed and described herein. These separate embodiments are also within the scope of the present invention.

Where monolithic bodies of alliform carbon particles are described herein, it appears that performance tends to fall off as the diameters of individual particles approach 1 nm (approaching the diameters of fullerenes). Without being bound by any particular theory, it appears as the diameters approach this level, the spheres have a tendency to pack too densely when assembled, thereby preventing free flow of electrolytes or electrolyte solution through the three-dimensionally interconnected pore structure of the matrices of alliform carbon particles. At higher diameters, the performance becomes limited by the reduced surface area of the particle surfaces. It appears that the size range described herein (e.g., about 2 to about 20 nm) provides the best balance of properties for the superior performance achieved and achievable.

Figure 4:
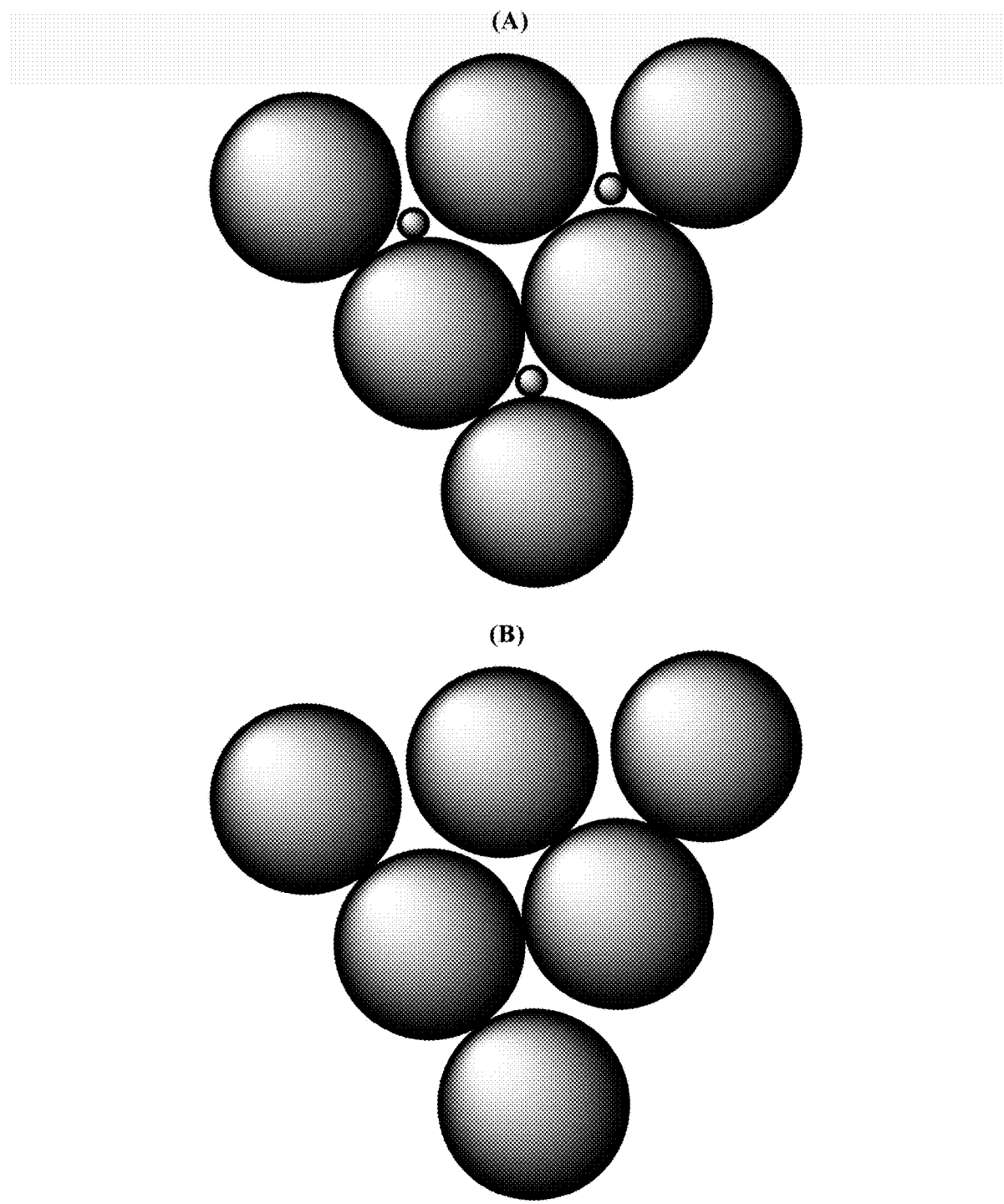
FIG. 4 is a two-dimensional (not necessarily to scale) illustration of the increase in internal surface area for a given volume by the addition of an additional modality of particle sizes. The internal surface of the matrix of particles in FIG. 4(A) is greater than that of the matrix of particles in FIG. 4(B) by an amount approximately equal to the surface area of the smaller particles. Both arrangements provide for the facile ability of electrolyte or electrolyte solution to penetrate the matrix.

As alluded to above, the packing of the alliform carbon particles and presence of three-dimensional interpenetrating porosity within the electrode matrices is an important parameter in the design of these devices. The interconnectivity of the pores within the matrices provides for interpenetration of the electrolytes necessary for optimal performance. In certain embodiments of this invention, the alliform carbon particles may be unimodal or nearly unimodal, where "nearly unimodal" indicates a size variance in the range of about 2 percent to about 50 percent, preferably in the range of about 2 percent to about 25 percent, about 2 percent to about 10 percent, or about 2 percent to about 5 percent, where size variance is defined as the standard deviation of the particle size distribution divided by the average size of the particles in the particle size distribution. Other embodiments provide that the alliform carbon particles may have a bimodal or even trimodal distribution. Such distributions may be used to improve the packing density (i.e., the density of the internal surface structure per unit volume), provided such additional particles do not compromise the interpenetratability or mobility of electrolyte or electrolyte solution. See, e.g., FIG. 4.

Perfectly packed monodispersed spheres can have a theoretical void volume of 26 percent by volume (depending on packing arrangement). However, various embodiments of this invention provide for void volumes both smaller and larger than this. Larger void volumes accommodate any additional porosity needed for interconnectivity of these void volumes; smaller void volumes allow for the incorporation of specifically designed sized particles (e.g., in a bimodal particle size distribution) needed to maximize performance. Accordingly, the present invention provides for void volumes wherein the lower end of the range is independently about 10, 15, 20, or 25 volume percent and wherein the upper end of the range is independently about 50, 45, 40, or 30 volume percent. Non-limiting exemplary ranges include, then, from about 10 to about 50 volume percent, from about 15 to about 40, from about 15 to about 35, from about 15 to about 30, from about 20 to about 40, from about 25 to about 40 volume percent, or about 26 volume percent Alliform carbon may be described as having a surface which is fully accessible to ion adsorption (FIG. 2A) but which does not have a significant porous network inside the particles (in contrast to activated carbon, for example). Therefore, at least as important as the internal void volumes are the mean pore diameters of the matrices. Again, the ability of the electrolyte to interpenetrate the matrix provides a lower limit of about 0.5 to about 1 nm as to the pore sizes of the interconnected porosity. However, the various embodiments wherein the mean pore diameters have a range wherein the lower end of the range is independently about 1, 2, 3, 4, 5, 10, 15, or 20 nm and wherein the upper end of the range is independently about 50, 40, 30, 25, 20, 15, or 10 nm are within the scope of the present invention. Exemplary mean pore sizes include those having a range of about 1 to about 20 nm, of about 2 to about 10 nm, and of about 5 to about 10 nm are most preferred.

This description of a "binderless" structure refers to the absence or substantial absence of organic or added organic material. It does not preclude the use of inorganic salts or other materials which alter the isoelectric point of the particles, allowing for close packing of said particles (i.e., acting as an "inorganic binder"). Examples within this specification describes the use of $MgCl_2$ for this purpose, but other salts or materials known to the skilled artisan, are also suitable for this purpose, provided that their presence does not interfere with the essential features of facile electrical interconnectivity of the alliform carbon particles. In this respect, to the extent that the invention is alternatively described in term of the term "consisting essentially of," when referring to the composition of the body, it is this facile electrical conductivity and/or device performance that constitutes the essential feature.

The carbon electrodes may comprise films, coatings, or monolithic structures. Several embodiments by which such monolithic carbon electrodes may be made include hot press, cold press/vacuum annealing, and/or furnace tube annealing. In some embodiments of the hot press method, the an amount of detonated nanodiamond precursor to the alliform carbon is placed with or without a small amount of an organic binder, and heated in a hot press in inert (i.e., reduced oxygen) atmosphere, at an elevated temperature, typically 1200° C. to about 2500° C., at temperatures in the range of about 1500° C. to about 2000° C., or at temperatures in the range of about 1800° C. to about 2000° C., for a time sufficient to form films of alliform carbon. Alternative embodiments provide that films may be achieved by sintering performed alliform carbon particles, again with or without a small amount of organic binder in an inert atmosphere, at lower temperatures than just described for sufficient time to sinter them together.

In those embodiments described as a cold press/vacuum annealing, a pellet of nanodiamonds or alliform carbon particles are compressed under high pressure (such as available for producing KBr pellets), with or without an organic binder, and the resulting body is placed in a vacuum oven at temperatures sufficiently high to sinter and fuse the particles together In those embodiments characterized as processed in a tube furnace, alliform carbon particles and an organic binder are rolled into a thin film, and placed in a tube furnace in an inert atmosphere, for a time and at temperatures sufficient to remove the functional groups of the binder and convert the carbon from the binder into amorphous carbon.

Supercapacitive Devices Comprising Binderless Alliform Carbon Particles

Certain embodiments of this invention provide energy storage devices, wherein each device comprises (a) a first and a second electrode, each electrode comprising a body in electrical communication with a current collector; and (b) an electrolyte; wherein at least one body comprises a three dimensionally porous matrix of alliform carbon particles, said alliform carbon particles having a mean diameter as measured by TEM (transmission electron microscopy) photomicrograph image analysis of from 2 to about 30 nanometers, the alliform carbon particles being substantially physically connected; and wherein the electrolyte physically contacts and is in electrical communication with said matrix of alliform carbon particles.

Other embodiments of this invention include electrical circuits or a devices comprising at least one of the energy storage devices described herein.

Still other embodiments include methods of making these energy storage devices comprising organizing the plurality of alliform carbon particles into a 3-dimensional porous matrix. In some embodiments, these 3-dimensional porous matrices are substantially free of binder material. As used in this section, the terms "substantially free" and "substantially physically connected" are intended to have the same meaning as described above.

Various embodiments include those in which an energy storage device is superposed on a substrate, and the electrodes are configured so as to comprise interdigital fingers.

In other embodiments, these storage devices may be multiplexed, such that they comprise more than a single pair of electrodes. For purposes of brevity, however, the invention will be described herein in terms of a single pair of electrodes.

These energy storage devices comprise embodiments in which the alliform carbon bodies are in physical contact and electrical communication with a current collector. In terms of the devices, these current collectors link the devices and the outside world. In the context of EDLC or supercapacitor devices, the purpose of the current collector is to polarize the alliform carbon particles and to provide a path for electrical charge to and from the electrode materials. In this invention, the current collectors can be a conductors or semi-conductors, made from compositions comprising metals, metalloids (including inorganic conductors), conducting organic polymers, or conductive carbon. In preferred embodiments, the current collectors comprise metals, typically aluminum, copper, gold, nickel, or titanium, most preferably aluminium, gold, or titanium. The current collectors may be applied onto the matrices of alliform carbon particles, after they are formed, or the matrices of alliform carbon particles may be organized onto preformed current collectors. The order depends on the design criteria of the user, and the means of making such assemblies is within the skill set of one of ordinary skill in the art of electrochemical capacitors.

There is no requirement that the matrices of alliform carbon particles are attached or mounted to a substrate, though this arrangement is certainly within the scope of this invention. That is, it is possible that these matrices may be applied to an energy storage unit as free standing monoliths, immersed within a pool of electrolyte or electrolyte solution. This may be achieved by organizing these alliform carbon particles into hollow "sleeves," such as hollow carbon or inorganic nanotubes or nanowires, or organic polymer "sleeves," wherein organic polymers may be conductive or exhibit capacitive behaviour in their own right, and the "sleeves" have a nominal internal diameter of greater than about 10, 50, 100, 500, or 1000 nm, or greater than about 1, 5, 10, 50, or 100 microns Where the alliform carbon matrices are mounted on substrates, the carbon particles can be organized into said matrices either directly on the substrate or onto to preformed, optionally patterned current collectors. Methods of depositing particle matrices or first-formed current collectors onto planar substrates are well established in this field, and generally involve lithographic methods, the specifics of the methods depending on the required resolution. Chemical and physical vapor deposition and sputtering methods can be used, in accordance with the materials being deposited. For larger dimensioned electrodes or matrices, high-resolution ink-jet, or transfer printing may be used. In general, micro-dimensioned (i.e., containing electrodes having at least one dimension—e.g., the widths—in the micrometer scale; 1 micron to 1000 microns) or millimeter-dimensioned arrays can be achieved using optical lithography methods and materials, including either positive or negative photoresists, and etchants as required. Nano-dimensioned arrays (i.e., containing electrodes having at least one dimension—e.g., the widths—in the nanometer scale; 1 nm to 1000 nm) can be achieved using nanolithographic techniques known in the art, including but not limited to various X-ray or extreme UV lithography methods, Electron-Beam Direct-Write Lithography, or ion beam or nanoprint lithography. If the alliform carbon matrices are to be organized/deposited on top of preformed current collectors, patterned or otherwise, electrochemical deposition techniques may be employed to focus and organize the alliform carbon particles.

When the devices are configured on substrates, those substrates comprise materials and have characteristics appropriate for the operation of those devices. For example, the substrates may comprise inorganic or metalloid (including, for example, silicon, silicon dioxide, or organic polymer materials. The materials must present surfaces which are chemically inert or resistant to the electrolytes or electrolyte solutions employed. The materials may present surfaces which are electrically conductive or non-conductive. Non-conductive surfaces are preferred. The materials should comprise that have thermal conductivities and expansion coefficients consistent with the demands of the operation of the devices. Finally, the dimensions of the device electrodes will define the requirements of the quality of the surface finish (e.g., nanodimensioned electrodes require much smoother finishes—e.g., polished silicon wafers—than micron- or millimeter-dimensioned electrodes). Choosing the appropriate materials and material characteristics is well within the capabilities of the person of ordinary skill in the art of micro- and nano-device construction.

Electrodes made using these methods provide intimate contact between the matrices of the alliform carbon particles and the current collectors, so as to provide efficient electrical communication between the alliform carbon particles and the current collectors.

According to the teachings herein, there is no limit to the type of patterns available to making the electrodes using these methods. Obviously, to maximize energy density from any energy storage device, for a given working surface area, it is most desirable to maximize the amount of contact between the electrodes and the electrolyte. In defining the types of arrangements of the electrodes, it is most convenient to describe them as being superposed on a substrate and arranged in a planar matrix, with the electrolyte interposed between and physically separating said electrodes, wherein said planar matrix is characterized as occupying a lateral planar area and having a vertical depth. One preferred configuration for such an electrode array is one wherein a given pair of oppositely polarized electrodes are arranged in an interdigital arrangement, wherein each electrode comprises a plurality of interdigital electrode fingers, said fingers characterized as having a length, width, and vertical distance, and said interdigital arrangement characterized as having an interdigital spacing between said fingers. See, for example, FIG. 5 for an exemplary design. Plurality is defined as having more than 2, more than 5, more than 10, more than 20, more than 50, and more than 100 interdigital fingers. The fingers of a given interdigital electrode "hand" may have the same or different dimensions than the fingers of the opposing interdigital electrode "hand," though typically the dimensions of both would be the same. Similarly, the dimensions of one electrode pair may be the same or different than those of another such electrode pair.

In various embodiments the widths of the electrode fingers of each electrode are independently in ranges independently having a lower range of about 10 or 100 nm or about 1, 5, 10, 20, 50, 100, 150, 200, 250, 500 or 1000 microns and independently having an upper range of about 100 mm, 10 mm, or 2000, 1500, 1000, 500, 250, 100, or 50 microns. Non-limiting exemplary ranges include those of about 1 mm to about 10 mm, 10 microns to about 2000 microns, about 10 microns to about 1000 microns, about 50 micron to about 500 microns, or about 5 microns to about 50 microns. Narrower fingers and so higher number of fingers per unit width preferred to maximize the contact between the electrodes and electrolyte per unit area, as described above.

According to the teachings herein, in various embodiments, the practical thickness of each body of three-dimensionally porous matrix of alliform carbon particles is independently in the range of about 1 micron to about 20 microns, about 5 micron to about 15 microns, or about 5 microns to about 10 microns. Packing arrangements within these bodies may be as described above.

In various embodiments, these electrodes or electrode fingers area physically separated by at least one electrolyte or body of electrolyte solution.

As used throughout this disclosure, in some embodiments, the electrodes, coatings, films, or composites comprising alliform carbon are in electrical communication with an electrolyte. It is well within the skills of the person of ordinary skill to determine which electrolytes are compatible with a given application. In some of these embodiments, the electrolyte solution is aqueous based. In others, the electrolyte is contained within a polar organic solvent. In still other embodiments, the electrolyte solvent may comprise both water and organic solvent. Solvents well known to be useful for this purpose may be used. Exemplary, non-limiting organic solvents comprise acetonitrile, γ-butyl lactone, butyronitrile, dimethylformamide, 1,2-dimethoxyethane, dimethyl carbonate, diethyl carbonate, dipropyl carbonate, ethylene carbonate, methyl ethyl ketone, 1-methyl-2-pyrrolidone, nitromethane, propylene carbonate, sulfalone, or tetrahydrofuran.

As a non-limiting example, in some embodiments, the composition may include two or more ion species of differing—i.e., larger and smaller—cross-sectional dimensions. Ion species used in these devices are suitably chosen such that the ions are capable of remaining stable when subjected to a voltage. Ions or solvated ions suitably have a cross-sectional dimension in the range of from about 0.1 nm to about 3 nm, typically about 0.1 nm to about 1 nm. But ions may also have a cross-sectional dimension in the range of from about 0.5 nm to about 2 nm, or even in the range of from about 1 nm to about 1.5 nm.

Exemplary electrolytes include sulfuric acid or a salt thereof, perchloric acid or a salt thereof, hexafluorophosphoric acid or a salt thereof, tetrafluoroboric acid or a salt thereof, a tetraalkyl amine salt of perfluoroalkylsulfonic acid, or a combination thereof. Alternatively or additionally stated, the electrolyte comprises an anion-cation pair, wherein the cation comprises an alkali metal, an alkaline earth metal, a lanthanide, a tetraalkyl ammonium cation (including $NEt_4^+$, $NPr_4^+$, and $NBu_4^+$), aluminum or zinc and the anion comprises a halide, sulfate, hydroxide, $PF_6^-$, $ClO_4^-$, $BF_4^-$, $CF_3SO_3^-$, or $SbF_6^-$.

In those embodiments described herein wherein the alliform carbon electrodes are described with respect to fabric, plastics, paper, glass, or other material, the electrolyte is typically chosen to be chemically compatible and non-reactive toward the substrate. Similarly, in those embodiments described herein as coming in contact with dermal, bone, or other body tissues, the electrolyte is chosen to be chemically, physiologically compatible with those tissues. Exemplary examples in such cases include alkali or alkaline earth or ammonium halides or sulfates, more preferably alkali or alkaline earth halides.

In still other embodiments, the electrolyte may be solvent-free, comprising for example ionic liquids or molten salts.

Where the electrolyte is an ionic liquid, such a liquid typically includes cations of ethylmethylimmidazolium, tetraalkylammonium, dialkylimidazolium, trialkylimidazolium, tetraalkylimidazolium, alkylpyridinium, dialkylpyrrolidinium, dialkylpiperidinium, tetraalkylphosphonium, trialkylsulfonium, or any combination thereof. Suitably ionic liquids also include anions of $BF_4$, $B(CN)_4$, $n$-$C_3F_7BF_3$, $CH_3BF_3$, $CH_2CHBF_3$, $CF_3BF_3$, $C_2F_5BF_3$, $n$-$C_4F_9BF_3$, $PF_6$, $CF_3CO_2$, $CF_3SO_3$, $N(SO_2CF_3)_2$, $N(COCF_3)(SO_2CF_3)$, $N(SO_2F)_2N(CN)_2$, $C(CN)_3$, SCN, SeCN, $CuCl_2$, $AlCl_4$, spyro-bipyrrolidinium, or any combination thereof. Ethyl-Methyl Immidazolium-Trifluoromethane-Sulfonyl Imide is a particularly suitable ionic liquid.

Figure 20:
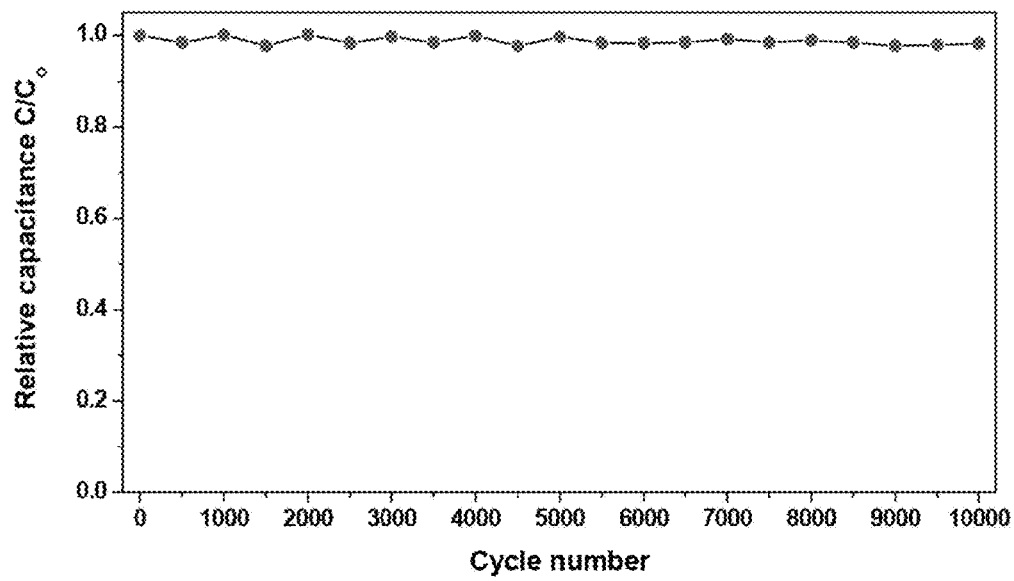
FIG. 20 graphically illustrates the evolution of the relative capacitance vs. the number of electrochemical cycles of an alliform carbon particle based micro-supercapacitor made of 16 interdigital electrodes in a 1M $Et_4NBF_4$/anhydrous propylene carbonate. $C_o$ refers to the capacitance obtained for the first cycle. The capacitance remains almost unchanged after 10,000 cycles, confirming the stability of the deposited layers.

The performances demonstrated as capable or available by embodiments of the energy storage devices are key features of this invention. In various general embodiments of the specific device embodiments described herein, such energy storage devices exhibiting a capacitance when a voltage polarity is applied across the pair of electrodes. Other embodiments include those where such energy storage devices further exhibit the ability to maintain more than 50%, more than 75%, more than 80%, more than 85%, more than 90% or more than 95% of their original capacitances when the polarity of the electrodes is cycled more than 10,000 times (see, e.g., FIG. 20).

Still other general embodiments include those where the energy storage devices described herein further exhibit a linear relationship between discharge current and scan rate up to and including scan rates which exceed 100 $Vs^{-1}$.

Still other embodiments of these devices include those where the energy storage devices described herein further exhibit a near-linear relationship between discharge current and scan rate up to a scan rate of at least 175 V/s. In these embodiments, the term "near-linear relationship" refers to a relationship in which the values of the discharge current continue to increase at increasing scan rates, but where the discharge current values begin to fall below the projected linear projections at higher scan frequencies (i.e., fall away from linearity) yet remains within 25%, within 20%, within 15%, within 10%, or within 5% of the values projected from the linear slope at the higher frequencies (see, e.g, FIG. 21B).

Beyond the individual energy storage devices, this invention includes those embodiments in which at least one such energy storage device is incorporated into electrical circuits or electrical or electronic devices. In some embodiments, these include those devices which are used to deliver or capture (harvest) "instantaneous" power, where "instantaneous" refers to separate embodiments where power is delivered or captured in less than 1 second, less than 100 milliseconds, less than 10 milliseconds, or less than 1 millisecond, or less than 100 microseconds, or in the range of about 1 millisecond to about 1 second, in the range of about 1 millisecond to about 100 milliseconds, or in the range of about 10 milliseconds to about 100 milliseconds. Even further, embodiments of this invention include those electrical or mechanical systems which incorporate these inventive storage devices, circuits, or devices in those applications which currently use supercapacitors or electrical double layer capacitor devices, or could use the devices described herein. These include, but are not limited to, nomad electronic devices (including any device or devices that have antennas for receiving/transmitting signals or where those devices not connected to grid power supplies), cell phones or portable game systems, wireless sensor network devices, medical implants, active radiofrequency identification (RFID) tags, embedded microsensors, PC cards, flash photography devices, flashlights, portable media players, automated meter reading devices, piezoelectric devices harvesting energy harvesting from high-frequency processes (including those separate embodiments wherein the frequencies are 10 Hz or higher, 100 Hz or higher, 1 KHz or higher, 10 KHz or higher, 100 KHz or higher, or 1 MHz higher), or back-up power system for electronics devices or systems. Additional contemplated embodiments include those involving transportation (including automobiles, boats, trains, and aircraft), commercial electronics applications, pulsed lasers, or launching fighter jets from aircraft carriers. The scope of this invention is also considered to include, as separate embodiments, those applications which do not currently exist, but which will be enabled and come into existence because of the capabilities available by embodiments of this invention. Further improvements in the configuration of the patterned electrodes (e.g. three dimensional current collector arrangements), the density and homogeneity of the deposited electrode and viscosity/conductivity of electrolytes are expected to allow the design of high-energy supercapacitors with even higher power and energy characteristics than those described herein.

Current Collectors

Alliform carbon may also be used to enhance the performance of current collectors. The purpose of the current collector is to polarize the electrode particles and to provide a path for electrical charge to and from the electrode materials. In existing supercapacitor and fuel cell systems, carbon black and/or activated carbon is often used as an additive in a conducting polymer-based paint, typically a polyurethane, said paint being used to coat current collectors in supercapacitor applications. In certain embodiments of the present invention, this carbon black and/or activated carbon is replaced in part or entirely with alliform carbon particles, at loading levels comparable to or less than those used currently for carbon black and/or activated carbon. Independent embodiments include, but are not limited to, those compositions and articles made therefrom having alliform carbon particles present in a range bounded at the lower limit of about 1 wt %, about 2 wt %, about 5 wt %, about 10 wt %, or about 20 wt % and at the upper limit of about 100 wt %, about 95 wt %, about 75 wt %, about 50 wt %, about 25 wt %, or about 10 wt % alliform carbon particles, such that exemplary, non-limiting embodiments provide compositions having alliform carbon particles in the range of about 5 wt % to about 100 wt %, about 5 wt % to about 75 wt %, about 5 wt % to about 50 wt %, about 5 wt % to about 25 wt %, about 10 wt % to about 75 wt %, about 10 wt % to about 50 wt %, about 25 wt % to about 75 wt %, about 75 wt % to about 100 wt %, or about 95 wt % to about 100 wt % alliform carbon particles, all relative to the combined weight of total carbon added to the polymer. Without being bound by a particular theory, it would appear that the enhanced supercapacitor cell performance expected as a result of this substitution results from the relative properties of the two materials—namely the comparable conductivity and increased capacitance of the alliform carbon relative to the carbon black.

In certain embodiments of this invention, the current collectors can be a conductors or semi-conductors, made from compositions comprising metals, metalloids (including inorganic conductors), conducting organic polymers, or conductive carbon. In preferred embodiments, the current collectors comprise metals, typically aluminum, copper, gold, nickel, or titanium, most preferably aluminium, gold, or titanium.

In various embodiments, the paints or conductive coatings comprise thermoset or thermoplastic resins or ionomers, which are chemically compatible with the electrolytes and electrolyte solutions. Exemplary, non-limiting embodiments include those where the polymers comprise benzoxazines, bismaleimides, epoxies, fluorinated and perfluorinated polymers (including polytetrafluoroethylene, polyhexafluoropropylenes, polyvinylidene difluorides, polyvinyl fluorides), melamine resins (including alkylated melamine formaldehyde resins), polyalkylenes, polyamides, polyamide-imides, polyaryletherketones, polyether etherketones, polyesters (including polyethylene- and polybutylene-terephthalates and -naphthalates), polyethylenenimines, polyethersulfones, poly (p-phenylene sulfide)s, polyimides, polyurethanes, polyvinyl chlorides, vinyl esters, or a copolymer or mixture thereof.

In certain embodiments, the present invention provides for the substitution of at least a portion, and preferably all of the carbon black in current electrode paints, glues, or coatings. Exemplary embodiments include those devices, and the methods of making and using said paints, glues, or coatings, wherein alliform carbon is substituted for carbon black or activated carbon, in part or in entirely as described above, in U.S. Pat. Nos. 7,443,650, 7,382,602, and 6,341,057, each of which is incorporated by reference in its entirety herein.

Conducting Polymers Impregnated with Alliform Carbon

In other embodiments, the present invention provides for compositions comprising conducting polymers incorporating alliform carbon particles, and the articles made therefrom. Independent embodiments include those compositions and articles made therefrom having alliform carbon particles present in a range bounded at the lower limit of about 1 wt %, about 2 wt %, about 5 wt %, about 10 wt %, or about 20 wt % and at the upper limit of about 75 wt %, about 50 wt %, about 25 wt %, about 10 wt %, or about 5 wt % alliform carbon particles, such that exemplary, non-limiting embodiments provide compositions having alliform carbon particles in the range of about 1 wt % to about 50 wt %, about 1 wt % to about 25 wt %, about 1 wt % to about 10 wt %, about 1 wt % to about 5 wt %, about 5 wt % to about 25 wt % alliform carbon particles, all relative to the combined weight of alliform carbon and the polymer.

Certain embodiments include those compositions and articles made therefrom where the conducting polymer comprises poly(fluorene), polypyrene, polyazulene, polynaphthalene, poly(pyrrole), polycarbazole, polyindole, polyazepine, polyaniline, polyquinoline, poly(thiophene), poly(p-phenylene sulfide), poly(acetylene), poly(polyphenylene vinylene), or a mixtures thereof, or a copolymer thereof. Additional specific embodiments include compositions and articles made therefrom wherein the ionomers comprise of methacrylic or acrylic acid-based ionomers, cationic and anionic urethane ionomers, butadiene-styrene-acrylic acid terpolymer ionomers, perfluorinated ionomers, sulfonated-2,6-dimethyl polyphenylene oxide; sulfonated-(or phosphonated-)2,6-diphenyl polyphenylene oxide; polysulfone; polyethersulfone; polybenzimidazole; polyimide; polystyrene; polyethylene; polytrifluorostyrene; polyetheretherketone (PEEK) and liquid crystal polymers (e.g., Vexar, PBO). Useful ionomers are polymers or copolymers of compounds that contain, but are not limited to, carboxylate, sulphonate or phosphonate that is neutralized or partially neutralized by $Na^+$, $Li^+$, $Ca^{2+}$, $Mg^{2+}$, $Zn^{2+}$, $Ba^{2+}$ or $Al^{3+}$ or other metallic ions. The percentage of the ionic content in the copolymer can be varied and the percentage of neutralization can also be varied. Ionomers for use in the practice of the invention are commercially available. For example, there are acrylic acid based-ionomers, such as ACLyn® from Honeywell, Surlyn® from DuPont, and Escor® and Iotek® from ExxonMobil, that are copolymers of ethylene and acrylic acid or methacrylic acid neutralized by metallic ions. Also available are butadiene-styrene-acrylic acid terpolymer such as Hycar® from B. F. Goodrich. Useful ionomers include perfluorinated ionomers. Such ionomers are commercially available. Examples include DuPont's Nafion®, and Asahi Glass Company's Flemion®. In still further embodiments, the conductive polymer is graphite or graphene. Such compositions may be formed, for example, by heating composites of alliform carbon particles dispersed within organic polymer, phenolic-based or other suitable resins known to provide graphitic structures when so treated, under non-oxidizing (e.g., anaerobic or nearly anaerobic) conditions. Graphitic compositions so produced are well known in the art, and methods and materials known in the art to produce such graphitic compositions may be used in this context. Exemplary compositions may result from the thermal decomposition (at temperatures below 850° C.) of polymers derived from mixtures of poly(ethylene oxide)-poly(propylene oxide)-poly(ethylene oxide) triblock copolymers gelled with resorcinol-formaldehyde oligomers and alliform carbon particles (for example, using the methods described in Example 4, below).

This invention also teaches that such compositions may also be used to improve the electrical properties of electro-optic devices (see below), textile fabrics (see also below), and other applications, including those cited herein, where the ability to integrate energy storage devices in important into conductive or semi-conductive organic polymers is important (e.g., for capturing, storing, and later releasing static or delivered charge).

Electro-Optic, Laser, Waveguide, and Solar Cells and Derivative Devices

Other embodiments of the present invention teach the use of thin layers of alliform carbon and their ability to act as conductors and supercapacitors in electrical devices, either alone or coupled with the filled or unfilled (by alliform carbon particles) polymers described above. In particular, the small particle sizes of alliform carbon particles (described above) make them transparent across a wide spectrum of electromagnetic radiation, and as such, may be viewed as replacements for other materials which act as transparent conductors. While indium-tin oxides (so-called "ITO") are most commonly used in this capacity, other like-performing materials may also be replaced in part or entirely by alliform carbon, for example tin oxide ($SnO_2$), fluorine-doped tin oxide ($SnO_2$:F), zinc oxide ($ZnO_2$) or the like, or from a mixture of these. Independent embodiments provide compositions having alliform carbon particles present in a range bounded at the lower limit of about 1 wt %, about 2 wt %, about 5 wt %, about 10 wt %, about 20 wt %, or about 50 wt % and at the upper limit of about 100 wt %, about 95 wt %, about 75 wt %, about 50 wt %, about 25 wt %, about 10 wt %, or about 5 wt % alliform carbon particles, such that exemplary, non-limiting electrode embodiments provide compositions having alliform carbon particles in the range of about 1 wt % to about 100 wt %, 1 wt % to about 50 wt %, about 1 wt % to about 25 wt %, about 1 wt % to about 10 wt %, about 1 wt % to about 5 wt %, about 5 wt % to about 25 wt %, about 50 wt % to about 100 wt %, about 75 wt % to about 100 wt % or about 95 wt % to about 100 wt % alliform carbon particles, all relative to the weight of the entire conducting material. In addition to acting as conductors, in the presence of suitable electrolytes, such as described above, the alliform carbon may act as electrical double layer capacitors, thereby providing a functionality not otherwise available from the materials being replaced. In various embodiments of the present invention, the use of alliform carbon conductors in devices complement the performance of charge-transport materials used in those devices, including accelerating the local switching speeds associated with those devices.

As such, various embodiments of the present invention describe alliform carbon electrodes being used in applications including semi-conductor devices, electro-optic devices, light emitting diodes and laser devices, self-shading windows, either alone or coupled with the filled or unfilled (by alliform carbon particles) polymers described above. Other embodiments describe those articles or devices incorporating these devices. As but one exemplary example, one embodiment includes the incorporation of electrochromic devices containing transparent alliform carbon electrodes into radio frequency identification device with visual indicator, as consistent with the descriptions of a similar device described in U.S. Pat. Nos. 7,504,953 and 7,233,250, each of which is incorporated by reference herein for the device architecture and methods of making and using.

In some embodiments, the alliform carbon layer or film is superposed on a substrate, wherein the film comprising the alliform carbon is in the range of about 10 to about 2500 nm, of about 20 nm to about 2000 nm of about 20 nm to about 500 nm, of 20 nm to about 200 nm, or in the range of about 20 nm to about 100 nm. In other embodiments, the alliform carbon layer or film is transparent to electromagnetic radiation, subsets of said electromagnetic radiation including infrared, visible, and ultraviolet light.

Various embodiments of the current invention provide that flat layers or films, including patterned (pixilated) layers or films, may be applied by any appropriate method described above. In certain of these embodiments, these films are deposited on substrates which are likewise transparent in the frequency range of interest, for example optically transparent glass, quartz, or flexible or rigid plastic materials. Still other embodiments provide for devices and methods of making these devices wherein the alliform carbon electrodes are incorporated in or onto a non-transparent substrate which include a textile fabricated from natural or synthetic fibers, a sheet of polymeric material or paper, and combinations thereof. In some embodiments, the electrode(s) and/or an interlayered organic polymer may comprise alliform carbon.

By way of additional teaching, the invention of using alliform carbon particles as conductors, electrodes, and/or or energy storage devices in such devices include those which follow, each of which is incorporated by reference so as to include their teaching as to the materials of constructions, device architectures, and/or methods of making and/or use. Embodiments of the present invention include those devices and methods of treatment wherein alliform carbon conductors, electrodes, and/or energy storage devices are compatible with and can be used within the device architectures and/or methods of making and/or use of each cited reference. The following references are incorporated by reference herein for that purpose or those purposes. To the extent allowed, the references described within these incorporated references are also incorporated by reference.

U.S. Pat. No. 7,787,169 describes electro-optic (including electrochromic) displays, and methods for driving same, including those devices with charge transport layers. As with many of the devices described as follows, the devices of this patent use of "a transparent conductive material, usually indium-tin oxide (ITO)," which the presently described thin layers of alliform carbon may replace, in part or entirely (i.e., at levels as described above).

Additional teaching of the device architectures, and methods of making and/or using such devices may be found in U.S. Pat. Nos. 7,436,577; 7,369,295; 7,352,500; 7,279,752; 7,250,930; 7,180,649; 6,950,220; 6,940,092; 6,809,343; 6,785,036; 6,697,035; 6,674,136; 6,580,094; 5,384,578; 5,220,317; 4,723,656; 4,322,133; and 4,225,216 and in International Publication No. WO 01/37244.

As used herein, the term "electro-optic device" is used herein in its conventional meaning in the art to refer to a device or display using an electro-optic material having first and second display states differing in at least one optical property, the material being changed from its first to its second display state by application of an electric field to the material. Embodied within this term are those devices also characterized as active or passive light emitting diodes (LEDs), organic light emitting diodes (OLEDs), liquid crystal displays (LCDs), or electrophoretic displays, including colored, rotating bichromal member type, electroluminescent, or electrochromic displays (ECDs). The characteristics and advantages/disadvantages of each of these devices is summarized in U.S. Pat. No. 7,787,169). The optical property is typically color perceptible to the human eye, but may be another optical property, such as optical transmission, reflectance, luminescence or, in the case of displays intended for machine reading, pseudo-color in the sense of a change in reflectance of electromagnetic wavelengths outside the visible range.) Devices that currently use electro-optic displays include digital wristwatches, calculators, personal digital assistants (PDA's), flat screen computer displays, laptop personal computers, and cellular phones. As the electro-optic display has evolved into an important and versatile interface to modern electronic appliances, the microelectronics industry and the display technology industry have formed a powerful technology partnership in developing new applications. The display industry has continually introduced new technologies for improved electro-optic display performance and the microelectronics industry has followed with the hardware and software to support these new displays.

In other embodiments, films of alliform carbon may be used as the transparent electrode materials in lasers, and devices incorporating and methods involving the use of such lasers. For example, such films comprising alliform carbon particles may be incorporated into devices and associated methods of use such as described in U.S. Pat. Nos. 7,279,751; 7,091,411; 6,950,453; 6,879,618; 6,808,523; 6,404,789; 6,327,413; 5,617,436; 5,309,464; 5,212,585; 5,179,565; 5,070,509; 4,734,558; 4,606,613; 4,292,092; 3,975,082; or 3,938,058.

In still other embodiments, films comprising alliform carbon, in the present or absence of may be used as the transparent electrode materials in waveguides, and devices incorporating such waveguides. For example, such films comprising alliform carbon particles may be incorporated into devices and associated methods of use such as described in U.S. Pat. Nos. 7,794,629; 7,601,942; 7,454,103; 7,279,833; 7,183,050; 7,095,041; 7,082,236; 7,079,730; 7,030,556; 7,024,094; 6,901,175; 6,895,138; 6,842,573; 6,819,386; 6,816,140; 6,766,082; 6,754,408; 6,687,040; 6,661,034; 6,472,817; 6,436,613; 6,392,338; 6,385,355; 6,357,904; 6,333,458; 6,327,413; 6,215,920; 5,982,529; 5,818,983; 5,640,021; 5,559,330; 5,410,630; 5,381,507; 5,307,186; 5,093,874; 5,075,043; 5,070,509; 5,046,803; 5,029,979; 5,008,043; 4,900,127; 4,886,339; 4,796,971; 4,792,208; 4,172,333; or 3,975,082, each of which is incorporated by reference herein in its entirety.

In still other embodiments, films comprising alliform carbon may be used as the transparent electrode materials in (electrochromic) mirrors, and devices incorporating and methods involving the use of such mirrors. For example, such films may be incorporated into devices and associated methods of use such as described in U.S. Pat. Nos. 7,643,201; 7,528,907; 7,394,140; 7,327,509; 7,092,046; 7,088,490; 6,961,105; 6,888,305; 6,525,759; 6,437,903; 6,338,882; 6,285,486; 6,023,364; 6,014,247; 5,805,367; 5,760,853; 5,751,467; 5,640,274; 5,592,314; 5,245,453; 5,168,378; 5,128,799; 5,056,895; 4,878,743; 4,848,878; 4,820,933; 4,729,638; 4,693,558; 4,623,222; or 4,589,735, each of which is incorporated by reference herein in its entirety.

In still other embodiments, films comprising alliform carbon may be used in photovoltaic cells, and electronic devices or energy recovery systems incorporating such cells and methods involving the use of such cells, where carbon black or carbon nanotubes or nanowires are otherwise considered, for example as an electrode, battery, or energy conversion material. For example, alliform carbon may be incorporated into devices and associated methods of use such as described in U.S. Pat. Nos. 7,645,933; 7,635,810; 7,635,600; 7,622,667; 7,605,327; 7,586,035; 7,507,903; 7,462,774; 7,047,080; 6,946,597; 6,791,024; 6,706,961; 6,515,218; 6,472,594; 6,414,235; 6,069,313; 5,759,291; 5,681,402; 4,260,429, each of which is incorporated by reference herein in its entirety.

Textile-Based Supercapacitors and Batteries

Figure 6:
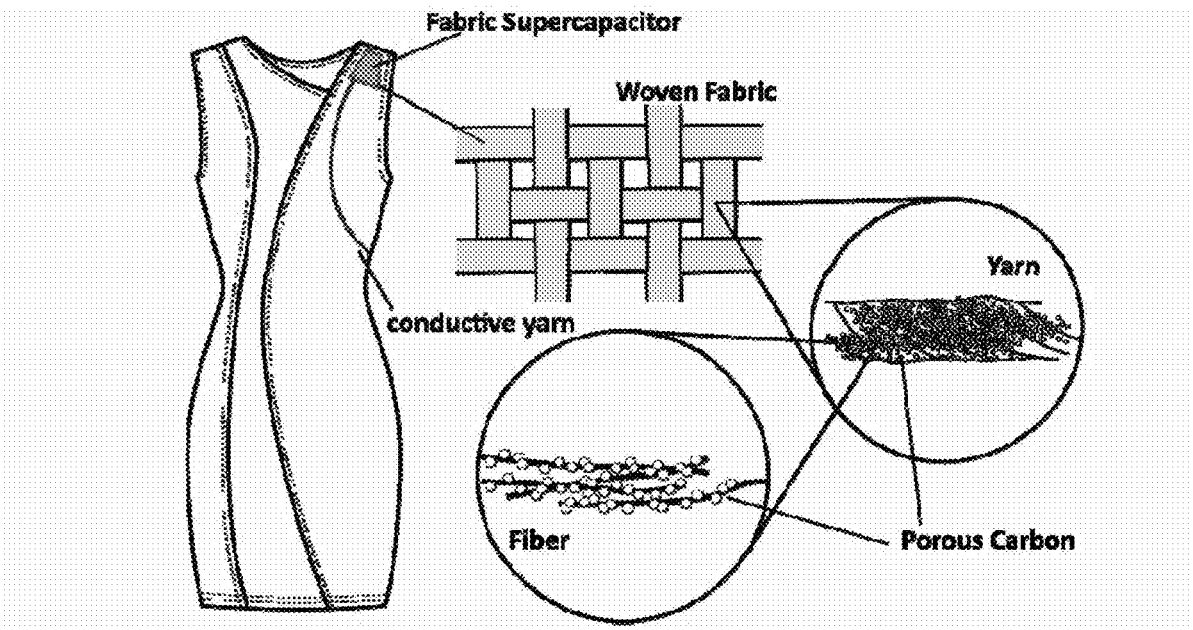
FIG. 6 provides two schematic representation of an alliform carbon device incorporated into a piece of clothing.
Figure 6:
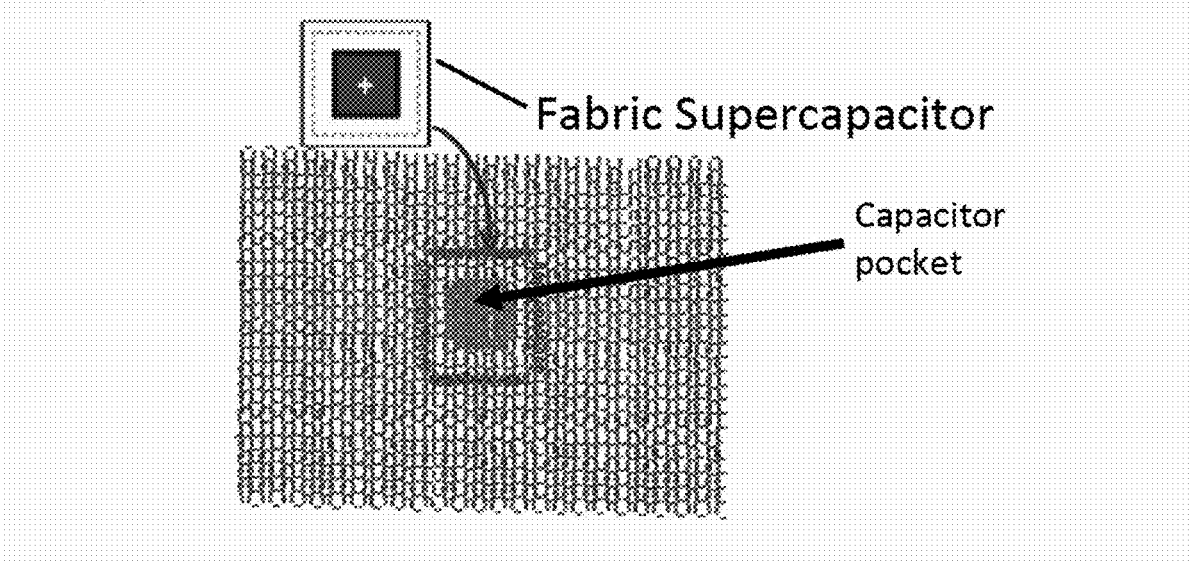
Figure 7:
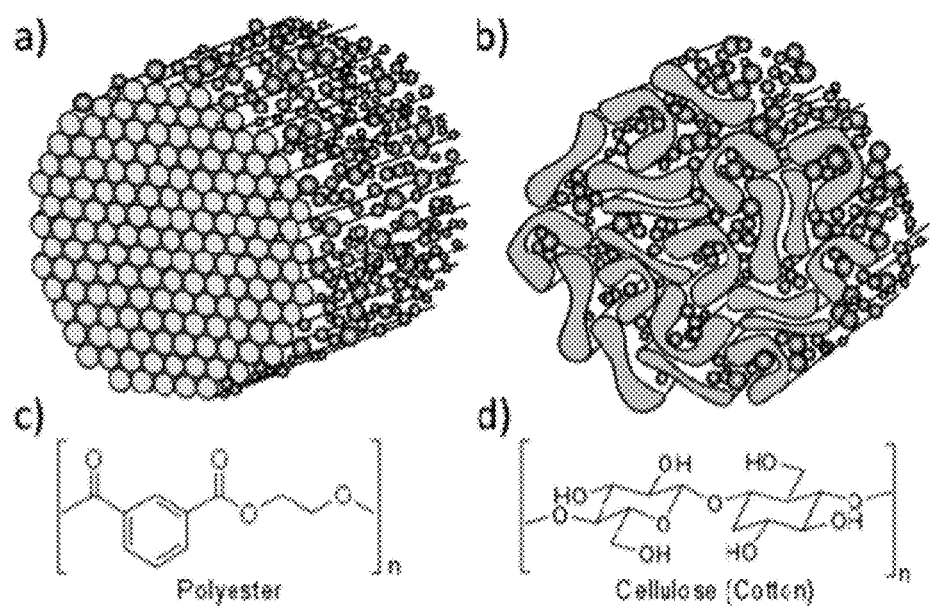
FIG. 7 provides a model of particle impregnation into yarns: (A) densely packed cylindrical polyester fibers (10 µm diameter) do not allow for particle penetration into fiber bundle; (B) cotton fibers' organically shaped structure (16-30 µm width) allows for improved impregnation of particles and ion transport; (C) chemical diagram of polyester; and (D) chemical diagram of cotton.

Textile based supercapacitors can be made by a layer by layer process of coating the textile with activated carbon. See, e.g., FIGS. 6-7 for exemplary designs. The present invention provides for applying layers of alliform before, instead of, or in combination with the layers of activated carbon to enhance the conductivity and the performance of a superposed supercapacitor cell. Without being bound to any particular theory, it appears that the layer of alliform carbon particles creates a conducting network across the insulating textile or fiber or significantly improves the conductivity across even a conducting textile or fiber. In various embodiments of the present invention, at least one layer of alliform carbon particles, preferably 2 or more or 4 or more, more preferably 6 or more, and still more preferably 10 or more layers of alliform carbon particles are applied to the textile before the activated carbon is applied, will enhance the properties of the supercapacitor cell. In other embodiments, the layers of alliform carbon particles completely replace the use of activated carbon particles.

As used herein, the term textiles includes woven and non-woven materials, comprising filaments, fibers, or yarns.

Non-woven fabrics are broadly defined as sheet or web structures bonded together by entangling fiber or filaments (and by perforating films) mechanically, thermally or chemically. They are flat, porous sheets that are made directly from separate fibers or from molten plastic or plastic film. They are not made by weaving or knitting and do not require converting the fibers to yarn. Non-woven fabrics are engineered fabrics that may have a limited life, may be single-use fabric or may be a very durable fabric. As used herein, non-woven fabrics include paper.

In some embodiments, the textiles comprise polymeric materials. In other embodiments, the materials are non-polymeric. In general, the materials can be natural or synthetic, biodegradable or non-biodegradable. Unless specifically restricted to one or more of these categories, the fabrics may comprise materials from any one of these categories. For those medical application described below, especially those to be applied internally, it should be apparent to the skilled artisan that the materials of construction must be at least biocompatible, and preferable approved by the United States Food and Drug Administration in the United States (or the corresponding regulatory agency in another country). In some cases, these materials may also be biodegradable or biosorbable.

The phrase "synthetic polymer" refers to polymers that are not found in nature, even if the polymers are made from naturally occurring biomaterials. Examples include, but are not limited to, aliphatic polyesters, poly(amino acids), copoly(ether-esters), polyalkylenes oxalates, polyamides, tyrosine derived polycarbonates, poly(iminocarbonates), polyorthoesters, polyoxaesters, polyamidoesters, polyoxaesters containing amine groups, poly(anhydrides), polyphosphazenes, polysiloxanes, and combinations thereof.

Suitable synthetic polymers for use according to the teachings of the present invention can also include biosynthetic polymers based on sequences found in collagen, elastin, thrombin, fibronectin, starches, poly(amino acid), poly(propylene fumarate), gelatin, alginate, pectin, fibrin, oxidized cellulose, chitin, chitosan, tropoelastin, hyaluronic acid, polyethylene, polyethylene terephthalate, poly(tetrafluoroethylene), polycarbonate, polypropylene and poly(vinyl alcohol), ribonucleic acids, deoxyribonucleic acids, polypeptides, proteins, polysaccharides, polynucleotides and combinations thereof.

The phrase "natural polymer" refers to polymers that are naturally occurring. Non-limiting examples of such polymers include, silk, cotton, collagen-based materials, chitosan, hyaluronic acid and alginate.

The phrase "biocompatible polymer" refers to any polymer (synthetic or natural) which when in contact with cells, tissues or body or physiological fluid of an organism does not induce adverse effects such as immunological reactions and/or rejections and the like. It will be appreciated that a biocompatible polymer can also be a biodegradable polymer.

The phrase "biodegradable polymer" refers to a synthetic or natural polymer which can be degraded (i.e., broken down) in the physiological environment such as by enzymes, microbes, or proteins. Biodegradability depends on the availability of degradation substrates (i.e., biological materials or portion thereof which are part of the polymer), the presence of biodegrading materials (e.g., microorganisms, enzymes, proteins) and the availability of oxygen (for aerobic organisms, microorganisms or portions thereof), carbon dioxide (for anaerobic organisms, microorganisms or portions thereof) and/or other nutrients. Aliphatic polyesters, poly(amino acids), polyalkylene oxalates, polyamides, polyamido esters, poly(anhydrides), poly(beta-amino esters), polycarbonates, polyethers, polyorthoesters, polyphosphazenes, and combinations thereof are considered biodegradable. More specific examples of biodegradable polymers include, but are not limited to, collagen (e.g., Collagen I or IV), fibrin, hyaluronic acid, polylactic acid (PLA), polyglycolic acid (PGA), polycaprolactone (PCL), poly(Lactide-co-Glycolide) (PLGA), polydioxanone (PDO), trimethylene carbonate (TMC), polyethyleneglycol (PEG), Collagen, PEG-DMA, alginate or alginic acid, chitosan polymers, or copolymers or mixtures thereof.

The phrase "non-biodegradable polymer" refers to a synthetic or natural polymer which is not degraded (i.e., broken down) in the physiological environment. Examples of non-biodegradable polymers include, but are not limited to, carbon, nylon, silicon, silk, cotton, polyurethanes, polycarbonates, polyacrylonitriles, polyanilines, polyvinyl carbazoles, polyvinyl chlorides, polyvinyl fluorides, polyvinyl imidazoles, polyvinyl alcohols, polystyrenes and poly(vinyl phenols), aliphatic polyesters, polyacrylates, polymethacrylates, acyl-substituted cellulose acetates, nonbiodegradable polyurethanes, polystyrenes, chlorosulphonated polyolefins, polyethylenes, polypropylenes, polytetrafluoroethylenes, polyethylene or polypropylene terephthalates, polydialkylsiloxanes, silicones, and shape-memory materials such as poly (styrene-block-butadiene), copolymers or mixtures thereof.

The phrase "biosorbable" refers to those polymers which are absorbed within the host body, either through a biodegradation process, or by simple dissolution in aqueous or other body fluids. Water soluble polymers, such as poly (ethylene oxide) are included in this class of polymers.

The textile fibers may be coated or uncoated before transforming them into fabrics, depending on the application for which the fabric is considered. Exemplary coating materials may include those described above, including conductive or semi-conductive polymers or ionomers. Additionally, textiles may also include interwoven or co-deposited metallic nano- or microfilaments, fibers, or yarns.

The fabrics or fibers may be coated by conventional methods used in the relevant industries. Such methods include, but are not limited to dip or spray coating (including electrostatic spray coating) and screen printing. Alliform carbon and other powders may be applied with or without organic binders, surfactants, or adherents, such as are used in the industry for this purpose. In independent embodiments, the alliform carbon content is present in a range bounded at the lower limit of about 1 wt %, about 2 wt %, about 5 wt %, about 10 wt %, or about 20 wt % and at the upper limit of about 25 wt %, about 10 wt %, or about 5 wt % alliform carbon particles, such that exemplary, non-limiting embodiments provide compositions having alliform carbon particles in the range of about 1 wt % to about 25 wt %, about 1 wt % to about 10 wt %, about 1 wt % to about 5 wt %, about 2 wt % to about 20 wt %, about 5 wt % to about 25 wt % or about 10 wt % alliform carbon particles, all relative to the weight of the alliform carbon and fabric or fiber.

In several embodiments, the present invention provides for garments having meshes of conductive and electrically capacitive fabrics. These fabrics can be formed by coating individual filaments, fibers, or yarns before forming them into the fabrics, or the fabrics themselves may be coated using standard industry techniques and materials for depositing particles.

In some embodiments, these enhanced electrically conductive fabrics may be used to simply provide electromagnetic shielding, wherein the addition of the alliform carbon improves the performance of the fabric relative to the performance of the corresponding fabric without the alliform carbon, for example by improved conductivity or reduced loading requirements. One such embodiment can be derived from the teachings described in U.S. Pat. No. 6,868,854, which is incorporated by reference. This patent teaches methods and articles useful in the treatment of fibromyalgia, though its teachings also apply to those applications where general electromagnetic screening or shielding is required. In this case, the garments comprise woven nylon cloth, into which from 2 to 35 percent by weight of the fabric comprises an electrically conductive filament, preferably stainless steel. The ability of the present invention to incorporate lightweight alliform carbon particles, including functions energy storage elements, improves the performance of the existing device and provides for additional functional flexibility. Interesting, the U.S. Pat. No. 6,868,854 also teaches methods of relieving muscle pain and soreness and reducing nervousness in horses, based on the teachings disclosed in U.S. Pat. No. 4,825,877, the contents of which are incorporated herein by reference, and a similar method can be used to alleviate delayed onset muscle soreness as disclosed in U.S. Pat. No. 6,146,351, the contents of which are also incorporated herein by reference. A further extension of the concept of shielding can be found in U.S. Pat. No. 6,613,977, which describes apparatus and methods for containing radio frequency energy within a housing of an electronic device.

The ability to incorporate energy storage devices comprising conductors, electrodes, batteries, and/or supercapacitors, according to the present invention, presents opportunities for improvements in sensing, including individual location and medical monitoring or treatment, and enhanced mobility for functional electronics and networking not previously available.

For example, the use of alliform carbon and articles and devices derived therefrom, incorporated into garments, provides for improvements to existing devices. By way of additional teaching, the invention of using alliform carbon particles as conductors, electrodes, and/or or energy storage devices in textiles or garments include those which follow, each of which is incorporated by reference so as to include their teaching as to the materials of constructions, device architectures, and/or methods of making and/or use. Embodiments of the present invention include those devices and methods of treatment wherein alliform carbon conductors, electrodes, and/or energy storage devices are compatible with and can be used within the device architectures and/or methods of making and/or use of each cited reference. As such, the following references are incorporated by reference herein to more fully describe that embodiment or those embodiments.

U.S. Pat. Nos. 7,618,267, 7,599,652, 7,428,395, 4,408,862, 4,050,802, and 3,936,184 describe the used of conductive cloths for use in an image forming apparatus, whose purpose is to remove static charge from an electric charge on a transfer sheet. In general, the ability of the present invention to capture and store charges at demonstrated rates of 200 V/s is especially appealing for these and other applications where there is an advantage in harvesting and storing electrical or piezoelectric energy onto flexible fabrics.

One important area where functionalized clothing can find particular value is in medical monitoring. Various medical procedures require receiving electrical signals from various parts of the body or applying electrical signals to other points of the body. Among these procedures are T.E.N.S. (Transcutaneous Electrical Nerve Simulation), E.M.S. (Electrical Muscle Stimulation), F.E.S. (Functional Electrical Stimulation), EMG (Electromyograph), EEG (Electroencephalogram), EKG (Electrocardiogram), computer generated signal transmission for the purpose of motor stimulated movement in quadraplegic or paraplegic patients, transmission of signals to specific sites for the purpose of transcutaneous bone growth stimulation, and eductional systems to allow immediate and accurate identification of known anatomical points of importance in sending or monitoring biomedical signals. By allowing electrodes to be incorporated into form fitting garments, the present invention greatly improves the utility of such garments.

For example, U.S. Pat. No. 7,664,476 describes a human body communication system for communicating data at KHz or MHz frequencies via an electric field formed by intervention of a human body. Such a device is compatible with the teachings of the present invention, and the present invention would provide for light weight, faster, and more integrated communications systems.

More specifically, U.S. Pat. Nos. 7,412,281, 4,608,987, and 4,026,278 describe the integration of a wireless transmitted electrocardiogram monitoring device into patient garb. Here again, the ability of the present invention to integrate energy storage devices into such garb only serves to provide additional functionality to said garb. U.S. Pat. Nos. 4,729,377, 4,580,572, 6,381,482, and 6,145,551 further describe garments used for collecting, processing, transmitting and receiving information, for monitoring physical aspects of the wearer, and for monitoring one or more body vital signs by including a selected sensing component or components. U.S. Pat. No. 5,649,061 even discloses similar technology for estimating a mental decision.

U.S. Pat. Nos. 7,558,622 and 7,539,533 also describe methods and systems for monitoring a person. While focusing on the ability to detect and communicate medical conditions in patients (including blood pressure, heart rates, and the incidents of strokes), these patents describe more generally the technology available for using wireless nodes to communicate a patients physical location and condition.

In some exemplary embodiments, the present invention provides for devices which deliver and/or receive and store electrical impulses, including those embodiments wherein the designated sites on the garment can be activated by soaking the site with conducting fluid. Such devices are disclosed in U.S. Pat. Nos. 4,729,377, 4,583,547, and 4,580, 572. These patents describe garments having the means to apply electrodes to any part of the body while allowing body movement and keeping such electrodes secure, to provide electrodes and conductors for every potentially useful point on the skin, and to hold conducting fluid in the garment at designated points without staining outer garments. The skilled artisan will appreciate the advantages of incorporating the additional functionality of the present invention into these devices.

In other exemplary embodiments, functionalized fabrics may be used for similar sensing purposes. For example, U.S. Pat. Nos. 7,633,179, 6,960,841, 6,559,555, 6,556,137, and 6,404,074 describe passenger detections systems and methods, based on electrical capacitance, wherein sensors comprising conductive cloth containing interwoven thin metal wires provide the conductive paths.

Such functionalization may include the incorporation of alliform-based conductors, electrodes and/or energy devices in textiles or garments, where it is useful to deliver or capture (harvest) "instantaneous" power, where "instantaneous" refers to separate embodiments where power is delivered or captured in less than 1 second, less than 100 milliseconds, less than 10 milliseconds, or less than 1 millisecond, or less than 100 microseconds, or in the range of about 1 millisecond to about 1 second, in the range of about 1 millisecond to about 100 milliseconds, or in the range of about 10 milliseconds to about 100 milliseconds. These include, but are not limited to, nomad electronic devices (including any device or devices that have antennas for receiving/transmitting signals or where those devices not connected to grid power supplies), cell phones or portable game systems, wireless sensor network devices, medical implants, active radiofrequency identification (RFID) tags, embedded microsensors, PC cards, flash photography devices, flashlights, portable media players, automated meter reading devices, piezoelectric devices harvesting energy harvesting from high-frequency processes (including those separate embodiments wherein the frequencies are 10 Hz or higher, 100 Hz or higher, 1 KHz or higher, 10 KHz or higher, 100 KHz or higher, or 1 MHz higher), or back-up power system for electronics devices or systems.

For example, as to the utility of incorporating microstrip microwave (MHz and GHz) antennae into clothing is described in U.S. Pat. Nos. 7,567,209 and 7,463,198, wherein the clothing fabric provides the dielectric substrate for said antennae and the alliform carbon coating improves the electrode. These reference describe as an advantage of incorporating antennae into non-woven fabrics as backing for the conductive parts of these antennas and as spacer materials, patch and stripline antennas can also incorporate an increased separation between the patch array and the ground plane, while remaining lightweight and inexpensive.

In other embodiments the present invention enables and/or improves the performance of wearable data processing system and apparel. Wearable computer systems are systems that can be worn by the computer operator on his or her body. For example, U.S. Pat. No. 6,324,053 describes a system and method for the electrical interconnection of the devices included in a wearable computer, so that a light cable network can be deployed that does not limit the body movements of a human being. This patent describes the problems with previous wearable computer systems and the attractive properties of more viable systems. In particular, it describes the longfelt need for methods of electrically interconnecting the devices included in a wearable computer that does not limit the body movements of a human being. It describes a network is formed by attaching to clothing, as stitches, extremely fine conductive wire that is used to connect devices included in a wearable computer, wherein an I/O device and a computer system main body are separately located. As a result, conventional, complicated cabling is eliminated, which permits the free and natural movement of a human body, and reliable communications, for which a light cable network is used, are possible. The incorporating of alliform carbon coated filaments and/or energy storage devices provide lighter weight and higher performing garments In other embodiments, the conductors, electrodes, and/or energy storage devices can be incorporated into athletic wear (e.g., fencing gear) or footwear, including athletic footwear and booties used in medical or semi-conductor processing environments. U.S. Pat. No. 7,424,782 describe the utility and advantages of incorporating electrically conductive components into such footwear. The significant technical and commercial advantages in incorporating additional electrical functionality into such athletic or footwear, especially where that functionality provides for the capture and storage of energy associated with the movement of the wearer, including through use of a piezoelectric device, should now be apparent to the artisan skilled in this field.

Biological Bandages and Wound Healing

In various embodiments of the invention, the high conductivity and supercapacitive properties of alliform carbon particles allow these particles and/or constructs thereof to be used in bandages or other medical devices to improve healing and/or treat bodily ailments, including dermatological disorders. In certain current applications where silver is used in bandages to accelerate wound healing by applying a current across the bandage that releases ions that assist the healing process, certain embodiments replace the silver in the bandages with alliform carbon and in such, increase the effectiveness of the bandage.

Alliform carbon particles have a high conductivity, so they will still be able to effectively pass the current across the bandage and/or body membrane. The advantages of alliform carbon particles would be the price compared to silver, and most importantly, alliform carbon particles are biologically inert, while silver will react with bioreagents.

The art of applying a low voltage electric current to control microbes and promote healing action for medical and hygienic purposes has been developing for many years. In particular, it is known that the use of a low voltage electric field applied through a reservoir can be used to deliver drugs or agents in the reservoir systematically or to produce a localized therapeutic effect. Moreover, the application of electricity to the body, with or without drugs or agents, can be used therapeutically. Direct current fields can exert a microbicidal effect, and electric voltage can also, via electrophoresis, induce agents or medications to penetrate tissue more deeply, and can induce the agents to penetrate structures or implants such as biofilms. Further therapeutic effects of electricity include control of pain, edema and acceleration of wound healing. Moreover, the localized effect of drugs and agents can be greater at the delivery site than the effect that is seen with topically or systemically delivered agents alone, due to higher available concentrations at the site, over time.

Low voltage antibacterial devices are able to infuse charged molecules, i.e., iontophoresis, as well as uncharged molecules into the body, i.e., electro-osmosis. In electricity-assisted devices, an electric potential (voltage) is applied to the membrane to facilitate drug transport. In transdermal iontophoresis, an ionized drug migrates into the skin driven by an applied electric potential gradient. Anionic drugs are delivered into the skin under the cathode (negatively charged electrode), while cationic drugs are delivered under the anode (positively charged electrode).

Another embodiment includes the use of iontophoresis in diagnosing cystic fibrosis by delivering pilocarpine salts iontophoretically. The pilocarpine stimulates sweat production; the sweat is collected and analyzed for its chlorine content to detect the presence of the disease.

However, iontophoretic drug delivery is not limited to delivery of ions into the body via electrical current. For example, iontophoretic devices can deliver an uncharged drug into the body via electroosmosis. Electroosmosis is defined as the transdermal flux of a liquid solvent containing an uncharged drug or agent induced by an electric field. Iontophoresis avoids the gastrointestinal side effects sometimes associated with orally ingested drugs and is preferable to subcutaneous injection because of its relatively benign and painless nature.

Another technique, known as electroporation, facilitates the transdermal or intradermal delivery of uncharged substances by electrically inducing the formation of transient dermal micropores that allow mobilization of the uncharged substances by diffusion.

Thus, the terms "iontophoretic" and "electrotransport", as used herein, include, but are not limited to, (1) the delivery of charged drugs or agents by electromigration, (2) the delivery of uncharged drugs or agents by the process of electroosmosis, (3) the delivery of charged drugs or agents by the combined processes of electromigration and electroosmosis, (4) the delivery of a mixture of charged and uncharged drugs or agents by the combined processes of electromigration and electroosmosis, and (5) the delivery of agents through pathways created in situ by electroporation. Therefore, a general definition of "iontophoresis" or "electrotransport", as used herein, is the transport of a substance induced or enhanced by the application of an electric potential. The term "iontophoresis" will collectively represent any of the terms iontophoresis, electrophoresis, electroosmosis and/or electroporation, and the term "iontophoretic" will encompass the respective adjectives.

Typically, the power to drive such iontophoretic or electrotransport devices is provided from external sources or galvanic cells incorporated into the devices. Obviously, the ability to integrate a power source into the bandage fabric would allow for improved patient mobility and/or improved reliability. Further, the ability to deliver higher local power, such as available with the present invention, is desirable.

Accordingly, various embodiments of the present invention provide for the incorporation of alliform carbon particles into woven and non-woven fabrics, and of flexible polymeric materials, said fabrics and materials being used in bandages for wound healing. Such embodiments provide for the use of the alliform carbon constructs to function as conductors or energy storage devices or both. Other embodiments provide for the methods of treatments associated with said bandages for wound healing.

Devices encompassed by the present invention include those bandages or wound healing or treatment devices wherein the conductors, electrodes, or energy storage devices comprise alliform carbon, and the bandages or wound healing or treatment devices are used to treat skin conditions, including skin infections, to deliver actively or passively pharmaceuticals by iontophoresis, or electrotransport, or electroporation As used herein, the term "treating" or "treatment" describes independent embodiments for the treatment (e.g., alleviation or elimination of symptoms and/or cure), prevention or inhibition of the condition (e.g., a skin condition or scarring), or desirable change in tissue (e.g., wound healing, scar reduction, tissue repair and/or tissue regeneration).

The term "skin condition" refers to individual embodiments of a dermatological disease or disorder (including, but not limited, acne, rosacea, or skin infections such as folliculitis or pseudo-folliculitis barbae) or skin characteristic (non-limiting examples being pigmentation, age spots, hair growth regulation, skin texture, skin firmness, skin elasticity, skin vasculature, dark circles, cellulite, sebum regulation, or skin shine). Examples of skin infections include, but are not limited to, those due to susceptible pathogens such as acne, rosacea, impetigo, folliculitis, furunculosis, eethyma, eczema, psoriasis, atopic dermatitis, herpes, epidermolysis bullosa, iethyosis, and infected traumatic lesions (e.g., ulcers, minor burns, cuts, abrasions, lacerations, wounds, biopsy sites, surgical incisions and insect bites).

The bandages of the present invention include those both applied external to the body, but may also include those applied internally (for example in bone or tissue healing). In general, the materials can be natural or synthetic, biodegradable or non-biodegradable, as described for textiles above. For those applied internally, it should be apparent to the skilled artisan that the materials of construction must be at least biocompatible, and preferable approved by the United States Food and Drug Administration in the United States (or a corresponding regulatory agency in other countries). In some cases, these materials may also be biodegradable or biosorbable. Unless specifically restricted to one or more of these categories, the fabrics may comprise materials from any one of these categories.

Active drug forms which have been delivered by previously known such iontophoretic or electrotransport devices may also be delivered with devices incorporating alliform carbon. Exemplary non-limiting examples include thymol, cetylpyridinium chloride, benzalkonium chloride, chlorhexidine, stannous fluoride, octenidine, decapinal, triclosan, nystatin, chlortrimazole, fluconazole, miconazole, ketoconazole, itraconazole, amphotericin B, acyclovir, idoxuridine, ibuprofen, flurbiprofen, ketoprofen, naproxen, aspirin, piroxicam, hydrocortisone, betamethasone, dexamethasone, beclomethasone dipropionate, fluocinonide, pilocarpine, and retin A.

Other pharmaceuticals include lidocaine hydrochloride, hydrocortisone, fluoride, penicillin, dexamethasone sodium phosphate, and insulin.

Other active agents useful for treating acne and rosacea include antibiotics, retinoids, antimicrobials, and keratolytic agents such as tretinoin, isotretinoin, motretinide, adapalene, tazarotene, azelaic acid, retinol, salicylic acid, benzoyl peroxide, resorcinol, sulfur, sulfacetamide, tetracycline, clindamycin, metronidazole, erythromycin, and salts thereof.

Depigmentation agents so delivered include soy isoflavones, retinol, kojic acid, kojic dipalmitate, hydroquinone, arbutin, transexamic acid, niacin, vitamin C, azelaic acid, linolenic acid, linoleic acid, and salts thereof.

Still others agents include nicotine, antiinfectives, antibiotics, antiviral agents, analgesics, fentanyl, sufentanil, buprenorphine, analgesic combinations, anesthetics, anorexics, antiarthritics, antiasthmatic agents, terbutaline, anticonvulsants, antidepressants, antidiabetic agents, antidiarrheals, antihistamines, antiinflammatory agents, antimigraine preparations, antimotion sickness, scopolamine, ondansetron, antinauseants, antineoplastics, antiparkinsonism drugs, cardiostimulants, dobutamine, antipruritics, antipsychotics, antipyretics, antispasmodics, gastrointestinal and urinary, anticholinergics, sympathomimetics, xanthine derivatives, cardiovascular preparations, calcium channel blockers, nifedipine, beta-blockers, beta-agonists, salbutamol, ritodrine, antiarrythmics, antihypertensives, atenolol, ACE inhibitors, diuretics, vasodilators, coronary, peripheral and cerebral, central nervous system stimulants, cough and cold preparations, decongestants, diagnostics, hormones, parathyroid hormone, growth hormone, insulin, hypnotics, immunosuppressives, muscle relaxants, parasympatholytics, parasympathomimetics, anti-oxidants, nicotine, prostaglandins, psychostimulants, sedatives, tranquilizers, skin acting antioxidants, caretenoids, ascorbic acid (vitamin C), vitamin E, anti wrinkling agents, retinoids, retinol (vitamin A alcohol), alpha-hydroxic acids, beta-hydroxy acid, salicylic acid, combination-hydroxy acids and poly-hydroxy acids, and hydrolyzed and soluble collagen, moisturizers, hyaluronic acid, anticellulite agents, aminophyllines, skin bleaching agents, retinoic acid, hydroquinone, peroxides, botanical preparations, extracts of aloe-vera, wild yam, hamamelitanin, ginseng, witch hazel, water and green tea.

Still other agents include miconazole, econazole, ketoconazole, sertaconazole, itraconazole, fluconazole, voriconazole, clioquinol, bifoconazole, terconazole, butoconazole, tioconazole, oxiconazole, sulconazole, saperconazole, clotrimazole, undecylenic acid, haloprogin, butenafine, tolnaftate, nystatin, ciclopirox olamine, terbinafine, amorolfine, naftifine, elubiol, griseofulvin, mupirocin, neomycin sulfate bacitracin, polymyxin B, 1-ofloxacin, chlortetracycline, oxytetracycline, tetrachcycline, clindamycin, gentamicin, metronidazole, hexylresorcinol, methylbenzethonium, phenol, tea tree oil, Iodopropynyl butylcarbamate, diazolidinyl urea, chlorhexidene digluconate, chlorhexidene acetate, chlorhexidene isethionate, chlorhexidene, benzalkonium, benzethonium, triclocarbon, polyhexamethylene biguanide, cetylpyridinium chloride, methyl benzothonium, 2,4,4',-trichloro-2-hydroxy diphenyl ether, parachlorometa xylenol, or salts thereof.

By way of additional teaching, the invention of using alliform carbon particles as conductors, electrodes, and/or or energy storage devices in bandages or wound healing or treatment devices include those which follow, each of which is incorporated by reference so as to include their teaching of materials of constructions, device architectures, and/or methods of treatment. Embodiments of the present invention include those devices and methods of treatment wherein alliform carbon conductors, electrodes, and/or energy storage devices are compatible with and can be used within the device architectures and/or methods of treatment of each cited reference. As such, the following references are incorporated by reference herein to more fully describe that embodiment or those embodiments.

Such references include U.S. Pat. No. 5,298,017 (describes an iontophoretic process by which drugs are delivered transdermally or transmucosally under the influence of an electrical potential); U.S. Pat. Nos. 4,141,359, 4,398,545, 4,250,878, and 3,991,755 (disclose examples of iontophoretic devices and applications thereof, including the use of agent reservoirs comprising a porous sponge or pad, a pouch or cavity, and a preformed gel body).

Other patents include U.S. Pat. No. 7,672,719 (disclose embodiments referred to as "medical batteries," which provide an electrical stimulus that may contact an area of "target tissue," and/or may electromotivate one or more therapeutic materials toward an area of target tissue (e.g., iontophoresis), and/or may cause one or more biologic or other materials within target tissue (including soft tissue and bone) to be affected (e.g., attracted, killed, neutralized, etc.)); and U.S. Pat. No. 7,662,176 (discloses apparatus and methods of manufacture and treatment of footware, including those whose benefits include regenerating connective tissue, regenerating skin, reforming collagen fibrils, regenerating blood supply to tissue, attracting microbes toward a reservoir, and neutralizing or eliminating the microbes through contact with reservoir material, iontophoresis, stimulating, augmenting, or simulating biologic currents normally produced and present at acute tissue injury sites, contracting or healing wounds, altering capillary permeability, and reducing pain); U.S. Pat. No. 7,657,297 (discloses implantable sensor for wound healing);

Still other patents include U.S. Pat. No. 7,643,874 (teaches a kit and patch for transdermal or intradermal delivery of at least one substance into the skin wherein the active substance is retained in a conductive fluid that can be applied topically to the skin.

Still other patents include U.S. Pat. No. 6,294,582 (discloses a device for treating asthma transdermally); U.S. Pat. No. 5,899,856 (discloses a dermal patch for detecting alcohol consumption); U.S. Pat. No. 6,291,677 (teaches the transdermal administration of antiviral protease inhibitors); U.S. Pat. No. 6,266,560 (discloses the transdermal treatment of erectile dysfunction); U.S. Pat. No. 6,238,381 (discloses the transdermal delivery of antiviral, antibacterial and anti-aging substances); and U.S. Pat. No. 6,288,104 (discloses the transdermal administration of substances for treating congestive heart failure).

Other patents include U.S. Pat. Nos. 7,507,228 and 7,479,133 (describe devices for and methods of treating skin conditions, especially acne and rosacea); U.S. Pat. No. 7,495,146 (discloses wound dressings or bandages, further comprising suspended metal particles); U.S. Pat. No. 7,486,989 (teaches a method of treating an infection in a barrier membrane by applying to the membrane a device having a barrier membrane contacting surface that administers an oxidizing agent to the barrier membranes); U.S. Pat. No. 7,480,530 (discloses methods of treating skin); U.S. Pat. No. 7,477,941 (discloses methods of exfoliating the skin with electricity); U.S. Pat. Nos. 7,477,940, 7,477,939, and 7,477,938 (describe methods of administering an active agent to a human barrier membrane with galvanic generated electricity); U.S. Pat. No. 7,476,222 (describe methods of reducing the appearance of pigmentation); U.S. Pat. No. 4,556,051 (disclose apparatus and non-intrusive methods for promoting healing of body tissue, such as a fracture in a bone of a primate or animal).

None of these reference describe the use of alliform carbon, or any conductive carbon material, in their teachings. Each of these are incorporated by reference herein for their methods of constructing devices to more fully describe that embodiment or those embodiments as to the devices and methods of treatments themselves, into which alliform carbon may be incorporated.

The present subject matter is further defined in the following Examples. It should be understood that these examples, while indicating preferred embodiments of the subject matter, are given by way of illustration only. From the above discussion and these examples, one skilled in the art can ascertain the essential characteristics of this subject matter, and without departing from the spirit and scope thereof, can make various changes and modifications of the subject matter to adapt it to various usages and conditions. Such modifications are considered to be within the scope of the present invention.

EXAMPLES

Example 1

Alliform Carbon Synthesis, Modelling and Characterization—Dataset 1

Nanodiamond soot UD50 (Nanoblox, Inc.) was synthesized by detonation of explosives in an oxygen-deficient environment. The characteristics of the resulting particles are described in Osswald, S., et al., Control of $sp^2/sp^3$ carbon ratio and surface chemistry of nanodiamond powders by selective oxidation in air. J. Am. Chem. Soc. 128, 11635-11642 (2006), which is incorporated by reference herein for this purpose. See also Table 2.

TABLE 2

| Selected properties of alliform carbon produced by graphitization of nanodiamond at 1800° C. in vacuum | |
|---|---|
| Average pore size (nm) | 6 |
| Specific surface area ($m^2\ g^{-1}$) | 520 |
| Raman $I_D/I_G$ ratio | 1.2 |
| Electrical conductivity at 298 K (S/cm) | 4 (powder) |
| | 2.5-3.0 (electrode) |

The nanodiamond particle size was around 5 nm with a specific surface area of 350 $m^2$/g and negligible pore volume. UD50 constituted of diamond cores surrounded by graphitic carbon shells where more than 50% of the surface is $sp^2$ carbon. The nanodiamond soot (UD50) was annealed under high vacuum ($10^{-6}$ torr) at temperatures in the range of 1200 to 2000° C. for 2 h (Solar Atmosphere, Pa.) to produce alliform carbon particles following the procedure described in Kuznetsov, V. L., et al., Alliform carbon from ultra-disperse diamond. Chem. Phys. Lett. 222, 343-348 (1994). Because the specific surface area, pore size and pore size distribution remained nearly the same for samples annealed at different temperatures, but the electrical conductivity of the samples increased sharply with temperature, alliform carbon particles prepared at 1800° C. were selected for device fabrication. Raman analysis and transmission electron microscopy (TEM) studies showed particle growth and polygonization above 1800° C.

Molecular Dynamics simulations of a spherical nanodiamond cluster of 4 nm in diameter (5995 carbon atoms) were performed in an NVT [where NVT refers to constant Number of atoms or particles, constant Volume, and constant Temperature] ensemble. Simulations were performed for 1 nanosecond at 1200° C. (the lowest experimentally determined temperature for the transformation of nanodiamonds to alliform carbon) and for 0.4 ns at 1800° C. (the temperature used in our experimental study) with time steps of 0.5 femtoseconds (at 1200° C.) and 0.2 femtoseconds (at 1800° C.). Shorter time step was necessary to use at higher temperature to prevent ejecting extremely hot carbon atoms from the nanodiamond cluster resulting in Molecular Dynamics run error. A Brenner reactive empirical bond order (REBO) potential was been used (see Brenner, D. W. et al. A second-generation reactive empirical bond order (REBO) potential energy expression for hydrocarbons. J. Phys. Condens. Matter. 14, 783-802 (2002). The system was allowed to reach equilibrium geometry at 300 K for 1 picosecond and after that the temperature was raised. The atom positions were recorded every 1000 (in the case of 1200° C. run) or 2000 (in the case of 1800° C. run) time steps to trace the evolution of the system. The modelling was performed using GULP 3.4 module in Accelrys Materials Studio 4.4 suite. Formation of alliform carbon particles with some imperfections was observed at both temperatures, but the ordering increased with the temperature.

Figure 3:
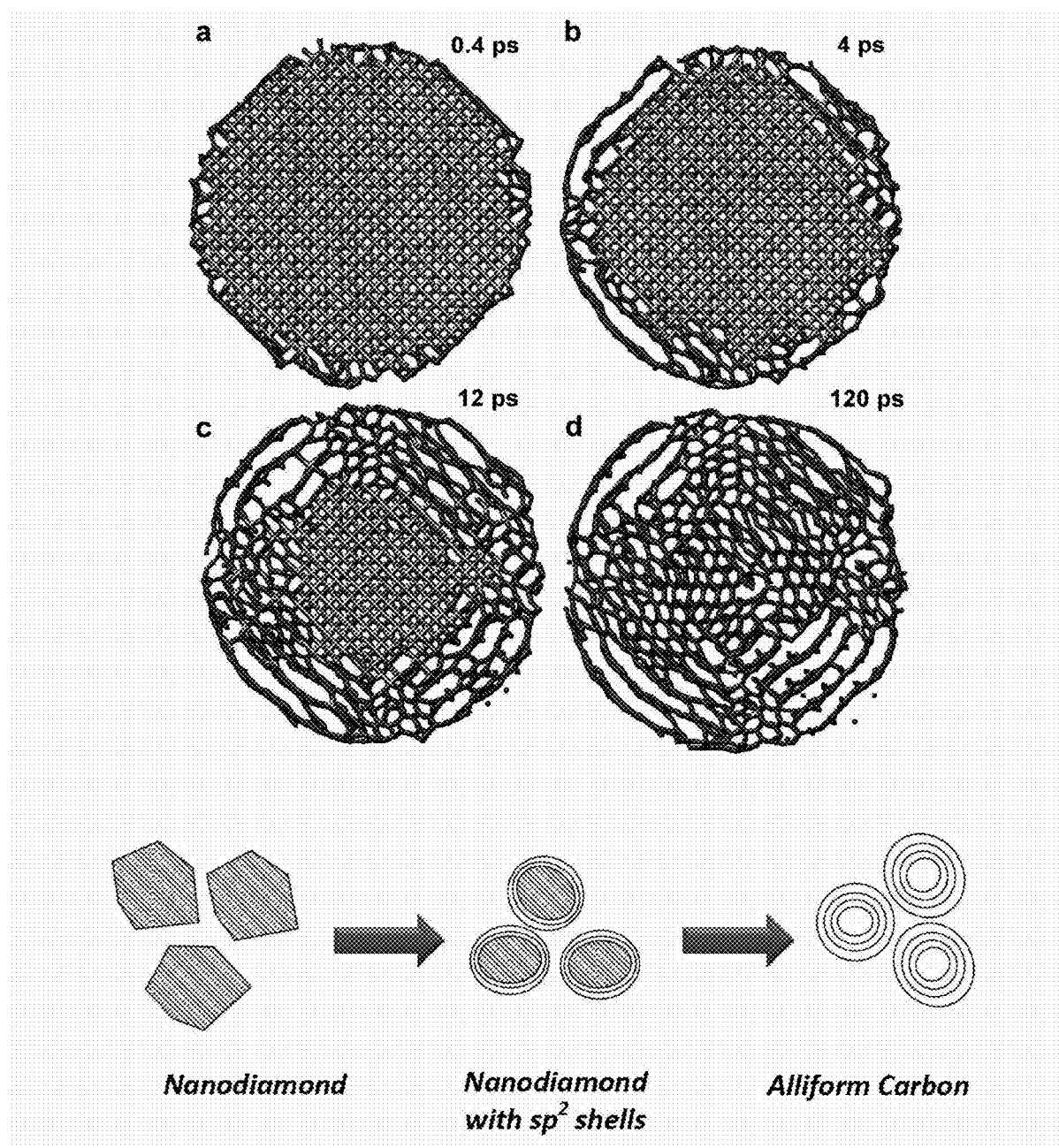
FIGS. 3 (A-D) provide illustrates the results of a molecular dynamics simulation of evolution of diamond into alliform carbon for a nanodiamond crystal of 4 nm in diameter. 0.6 nm thick slices through the center of the particle are shown for four different times starting from the initial stage (diamond) to the fully formed graphitic alliform carbon particle.

The results of these calculations are shown in FIG. 3.

Example 2

Alliform Carbon Synthesis, Modelling and Characterization: Comparison with Carbon Black—Dataset 2

Two varieties of detonation nanodiamond (ND), UD50 (detonation soot), and UD90 (acid-purified ND), were used as supplied by NanoBlox, Inc. (Clarion, USA). The $sp^3$ content of the resultant powders was ~25% and ~75% for UD50 and UD90, respectively. For both ND powders, the average particle size was ~5 nm. UD-90 contained ~75% diamond which was obtained by purification of UD-50 in oxidizing acids; with the latter detonation soot being a lower-cost raw material for alliform carbon particle synthesis. Alliform carbon particles were produced by annealing nanodiamond in vacuum (~$10^{-5}$-$10^{-6}$ torr) for three hours at temperatures between 1300 and 1800° C. in a custom-made furnace (Solar Atmospheres, Lansdale, USA). Carbon black (100% compressed, 99.9%) was purchased from Alfa Aesar (Ward Hill, USA). Activated carbon (Acticarbone L4S) was provided by Arkema (Colombes, France).

Transmission electron microscopy (TEM) was performed using a JEOL 2010F transmission electron microscope (JEOL, Japan) at 100 keV. Samples were prepared by sonicating in isoproanol and placed on a lacey carbon coated copper film.

Figure 8:
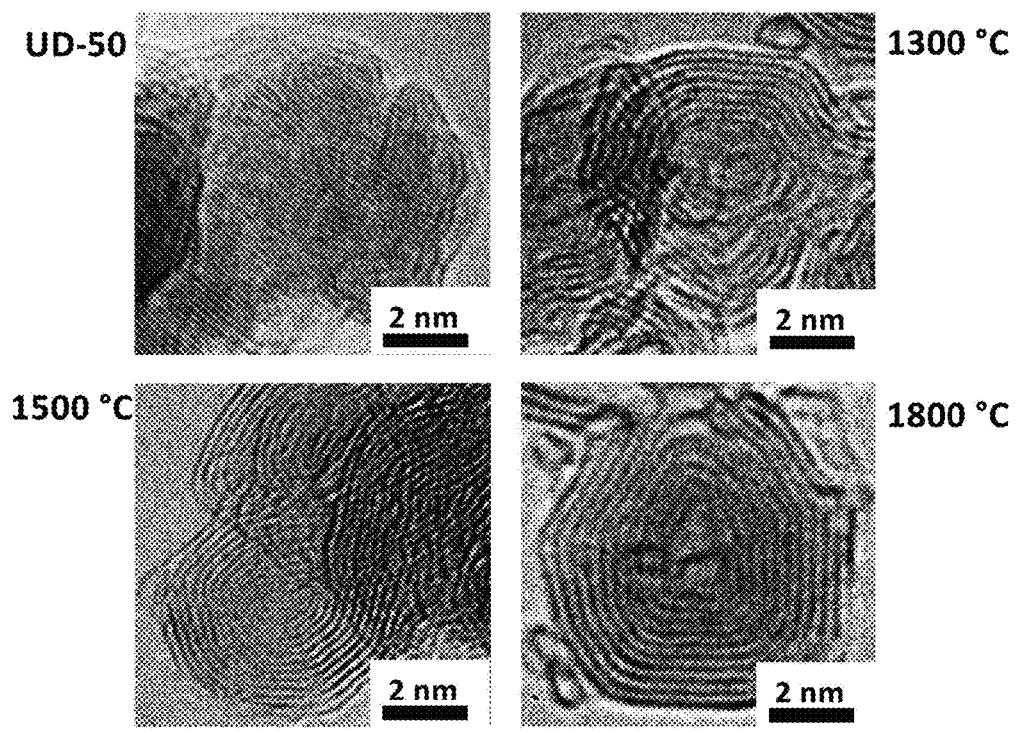
FIG. 8 provides transmission electron micrographs of particles as transformed illustrated Example 2.

High resolution TEM images of as-received nanodiamond soot (LTD-50) showed a lattice spacing of 2.06 Å as characteristic for $sp^3$ bonded carbon surrounded by $sp^2$ carbon with lattice spacing ~3.4 Å (FIG. 8A). After annealing, the alliform carbon particles became somewhat larger than the size of the ND precursor because of a lower density of graphitic carbon compared to diamond and showed an increasing degree of structural order with annealing temperature (FIGS. 8B-8D)). The lowest degree of alliform carbon order was present at the lowest annealing temperature (FIG. 8B) with a defective $sp^2$ graphitic structure, sometimes surrounding untransformed diamond nanocrystals. The graphitic layers were not perfectly conformal and did not have a continuous structure. With higher synthesis temperatures, a higher ordering of the graphitic layers was observed and polygonization of the alliform carbon particles occurred (FIG. 8D).

Figure 9:
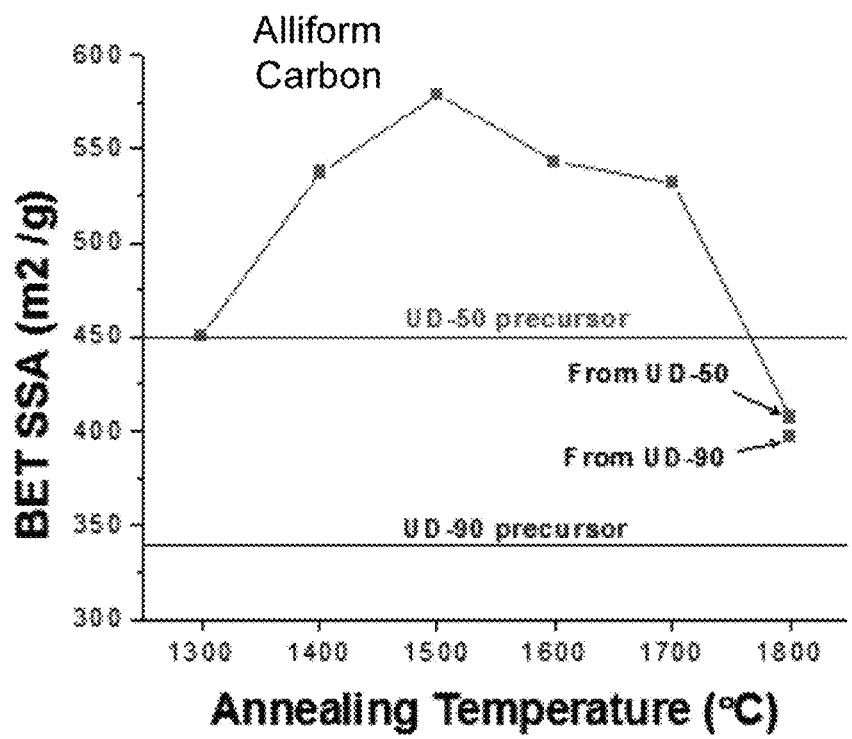
FIG. 9 illustrates BET surface area (SSA) (A) and pore size distribution (B) of nanodiamond detonation soot (UD-50), acid purified nanodiamond (UD-90) and alliform carbon annealed at 1300, 1500, and 1800° C.
Figure 9:
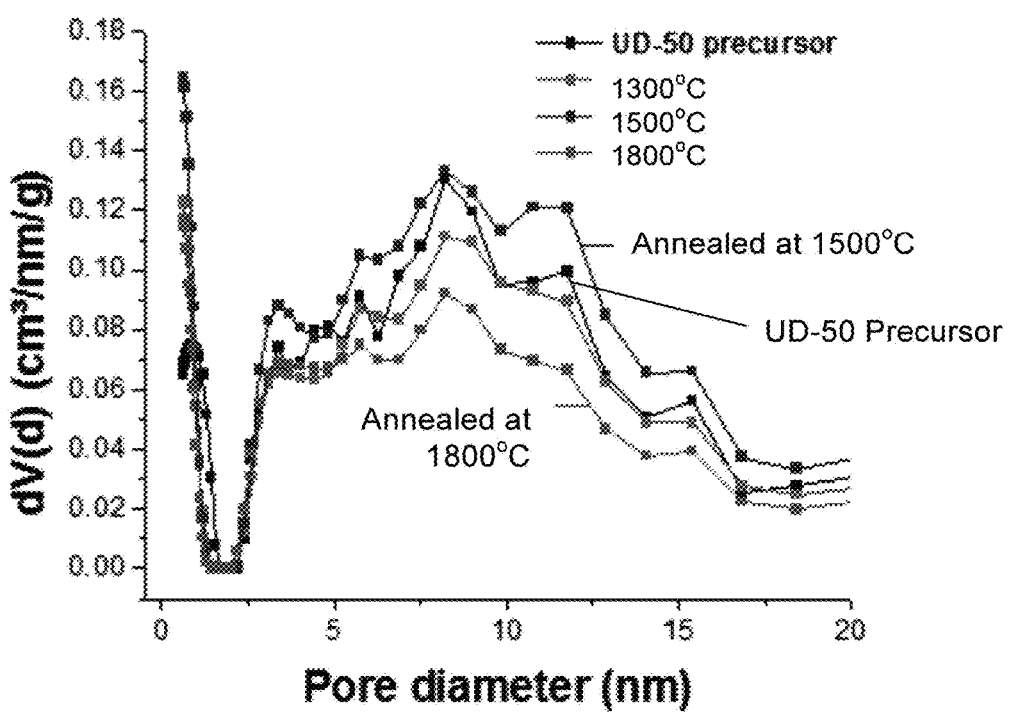

At higher temperatures, the alliform carbon particles still retained some degree of disorder and are present as dense sphere-like or polygonal particles. This was in agreement with gas sorption measurements. The BET (FIG. 9A) specific surface area (SSA) of the UD-50 precursor (450 $m^2/g$) is in the same order of magnitude as the ND-derived alliform carbon particles (397-579 $m^2/g$) and higher than UD-90 (337 $m^2/g$) which contained only small amounts of disordered $sp^2$ bonded carbon in the nanodiamond precursor. An ideal spherical solid particle of a diameter of 5 nm corresponds to a surface area of 343 $m^2/g$ assuming a density of 3.5 $g/cm^3$ (diamond) and 545 $m^2/g$ for a density of 2.2 $g/cm^3$ (graphitic carbon) and the values found for UD-50, UD-90 and alliform carbon are in this range. The surface area increased after annealing and had a maximum of ~580 $m^2/g$ at 1500° C., which corresponded to complete transformation from nanodiamond to graphitic carbon. Alliform carbon particles produced at this temperature were the most spherical. A minimum of the SSA was identified at the highest annealing temperature corresponding with dominant polygonization and low defect/disorder concentration. There was no significant difference in SSA of samples produced from purified nanodiamond, UD90, and the less pure, cheaper raw diamond soot, UD-50.

Prior to gas sorption analysis, all samples were degassed at 300° C. in low vacuum (0.2 torr) for 24 hrs to remove any adsorbed species. $N_2$ gas sorption measurements were performed using a Quadrasorb apparatus (Quantachrome Instruments, Boynton Beach, USA) at 77 K. The pore size distribution was calculated using the quenched sold density functional theory (QSDFT) method that was part of the software package in QuardaWin (Quantachrome Instruments) assuming a slit pore geometry.

When deriving the pore size distribution based on DFT calculations from the sorption isotherms, a distinct minimum at ~2 nm was seen (FIG. 8B). This corresponded to the boundary between pore space enclosed between single alliform carbon particles (<2 nm) and between alliform carbon clusters (>2 nm). It was evident that the overall distribution had not changed when comparing UD-50 and alliform carbon.

Figure 10:
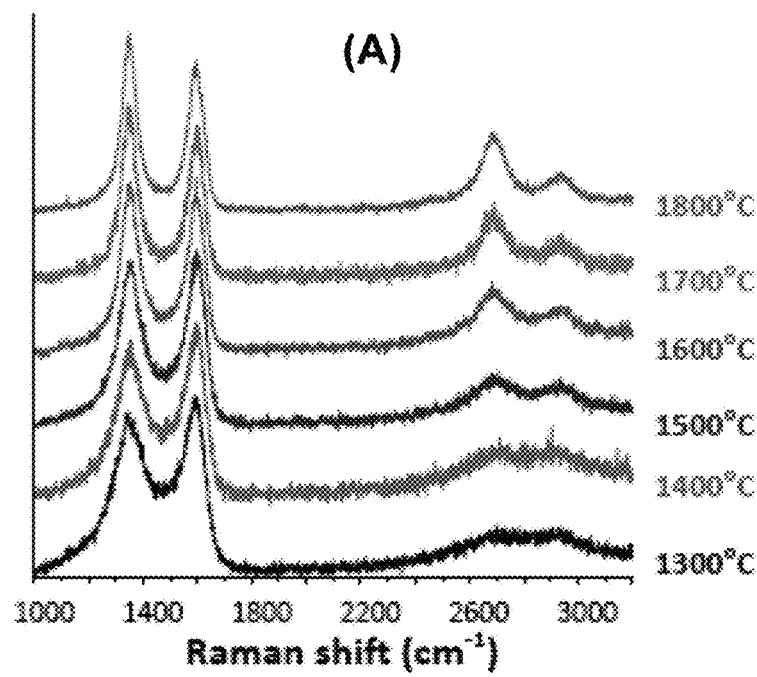
FIG. 10 provides (A) Raman spectra for alliform carbon particles prepared at various annealing temperatures, showing the increasing ordering of the graphitic shells with increasing annealing temperature; and (B) calculated D- and G-band linewidth and corresponding $I_D/I_G$ ratios.
Figure 10:
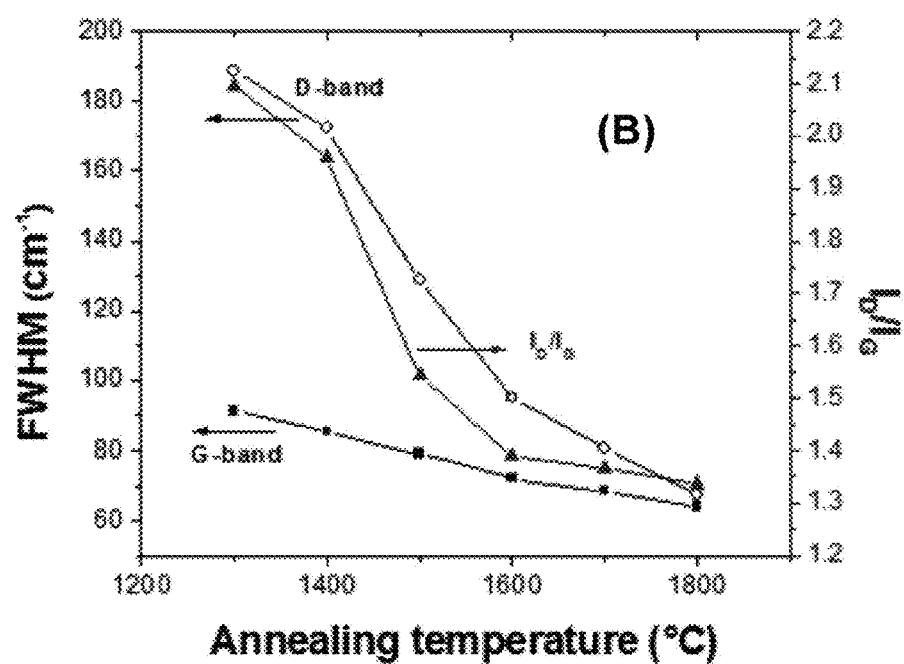
Figure 11:
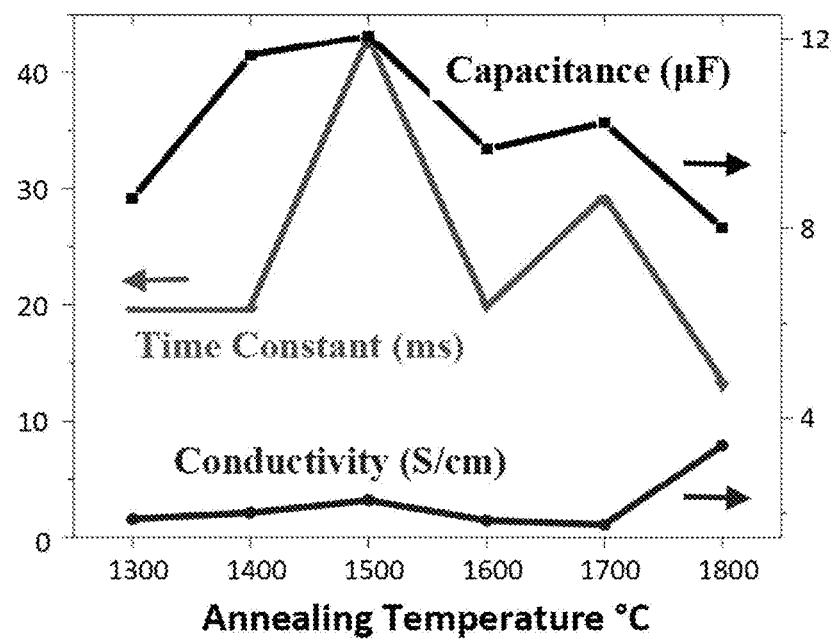
FIG. 11 provides conductivity, capacitance and time constant data as a function of annealing temperature of alliform carbon particles. As shown here, the maximum conductivity (3.5 S/cm) and extremely low time constant (~10 ms) is observed at the highest synthesis temperature. At lower synthesis temperatures, a maximum capacitance is reached while maintaining a time constant is still two orders of magnitude lower than for activated carbon.

The higher degree of structural order with increased annealing temperature (FIG. 8) with TEM was corroborated with Raman spectroscopy (FIG. 10). Raman spectroscopy was performed using a Renishaw 1000 micro-spectrometer (Gloucestershire, UK) operating at 514.5 nm excitation wavelength and a 1,800 lines/mm grating. The instrument had a spectral resolution of 1.5 $cm^{-1}$ and a spatial resolution of ~2 µM. Broad Raman modes indicated disordered graphitic carbon at low synthesis temperatures and narrower modes with pronounced second order modes 2D and D+G (FIG. 10A) showed the higher degree of carbon order in the alliform carbon. Peak deconvolution (FIG. 10B) yielded a significant decrease of the FWHM (full width at half maximum) with synthesis temperature mainly for the disorder-related D-mode while the overall $I_D/I_G$ ratio decreases. The increasing graphitization of alliform carbon particles with annealing temperature correlated with a higher electronic conductivity (FIG. 11).

Figure 12:
FIG. 12 illustrates the microcavity electrode testing apparatus used to test the alliform carbon particles. A cavity (125×30 µm) was etched into the platinum wire at the base of the electrode. Each powder was pressed into the cavity and tested 20 times to ensure reproducibility. Aqueous 1 M $H_2SO_4$ and 1.5 M TEA-$BF_4$ in acetonitrile were used as the electrolytes. Conductivity measurements were carried out on pressed alliform carbon pellets without the addition of any binder.
Figure 12:
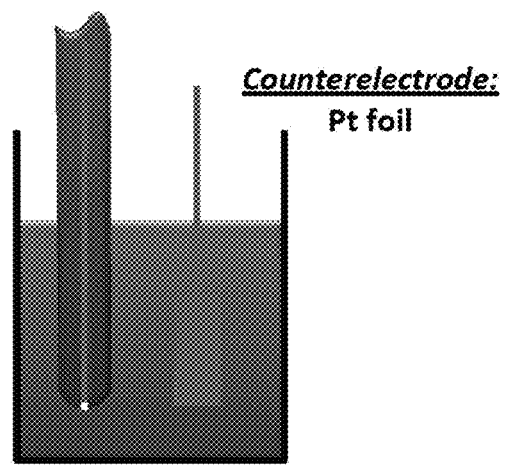

Cavity Microelectrode Assembly:

The assembly and methods used were similar to those described in R. Lin, et al., Journal of the Electrochemical Society, 2009, v. 156, A7-A12, which is incorporated by reference in its entirety. A platinum wire of 127 µm diameter was encased in a hollow glass capillary (FIG. 12). The platinum was sanded down to be flush, with the bottom of the capillary, then etched using aqua regia for 10 minute intervals at 80° C., 150 minutes in total, to create a small cavity for the carbon material to be tested in. In between each interval, the electrode was sonicated in water and the aqua regia solution was refreshed. A copper wire was threaded down the glass and connected to the platinum wire for connection with the potentiostat. Electric connection between the platinum and copper wire was ensured by drawing a small amount of indium-gallium liquid metal alloy into the capillary. The depth of the etched cavity, 35±5 µm, was determined by optical microscopy.

The microelectrodes were loaded with alliform carbon particles by repeatedly pressing the tip of the capillary several times into a mound of powder to ensure the cavity is completely filled. The electrode was then placed in a two electrode set-up using a platinum wire as the counter electrode in the different electrolytes. Each test was repeated 20 times using sonication to clean the microelectrode between test runs and all presented data represents the average values of 20 individual runs.

The active material was tested as is in a microelectrode (i.e., without binder) and as a thin binder-blended film in a symmetrical two-cell setup. For the film electrodes, alliform carbon particles and 15 wt % of an aqueous polymeric binder (PTFE, Sigma Aldrich) was mixed to ensure adhesion and mechanical stability of the films. The small particle size of alliform carbon particles required the addition of more binder as compared to ~5 wt % for the activated carbon with micron sized particles. Stainless steel foils coated with a polyurethane based conductive paint were used as current collectors and the paint was added to minimize the contact resistance of the electrode current collector interface. The carbon/PTFE films were rolled out to 4 cm² at 15 mg/cm² and laminated onto a 50 µm thick current collector. The constant density ensured a constant thickness of the film to be around 300 µm. Two layers of a 23 µm thick PTFE separator (W. L. Gore, Newark, USA) were placed between the two film electrodes.

Cyclic voltammetry, galvanostatic cycling, and electrochemical impedance spectroscopy were performed using a VMP3 potentiostat (Biologic, Claix, France). Cyclic voltammetry of the microelectrode was performed in a voltage window between 0 V and 0.8 V at scan rates of 0.5, 1, 5, 10, and 15 V/s. Selected materials were also tested at scan rates up to 100 V/s. Galvanostatic cycling of the films was performed at a constant current of 20 mA between 0 and 1 V. Electrochemical impedance spectroscopy (EIS) was performed at 0 V with a 5 mV amplitude between 1 Hz and 200 kHz.

Electrical conductivity was determined using a four point probe (Alessi, Irvine, USA) and a source meter (Keithley, Cleveland, USA) on pellets obtained from cold pressing at 8 MPa, then attaching gold wires using a silver paint with a distance between wires of 6 mm. The conductivity σ was calculated via (1)

$$\sigma = \frac{\ln(2)}{\pi * t} \frac{i}{V} \quad (1)$$

where t is the thickness of the pellet, i is the input current and V is the output voltage.

Microcavity electrode testing, albeit having the advantage of providing fast and reliable results for a large number of samples, is somewhat limited in the accuracy of derived specific capacitance (i.e., F/g or F/cm³) as filling the cavity depended on the particle agglomeration, particle size, applied pressure, and other properties. Using the same MCE and the similar sample materials, a series of measurement were used to establish a comparison of different synthesis temperatures and their impact on the electrochemical behavior of alliform carbon particles and the precursor material.

For cyclic voltammetry, as the scan rate increased above 20 mV/s, the shape of the CV and behavior of materials typically used as supercapacitor electrodes (e.g., activated carbon) became less capacitive and more resistive, which was evident as the shape deviates from a square. The capacitance could be calculated from a CV through the equation (2)

$$C = \frac{1}{\Delta E} \int \frac{iV:1V}{v} \quad (2)$$

where ΔE is the voltage window, i is the current, V is the voltage, and v is the scan rate.

Figure 13:
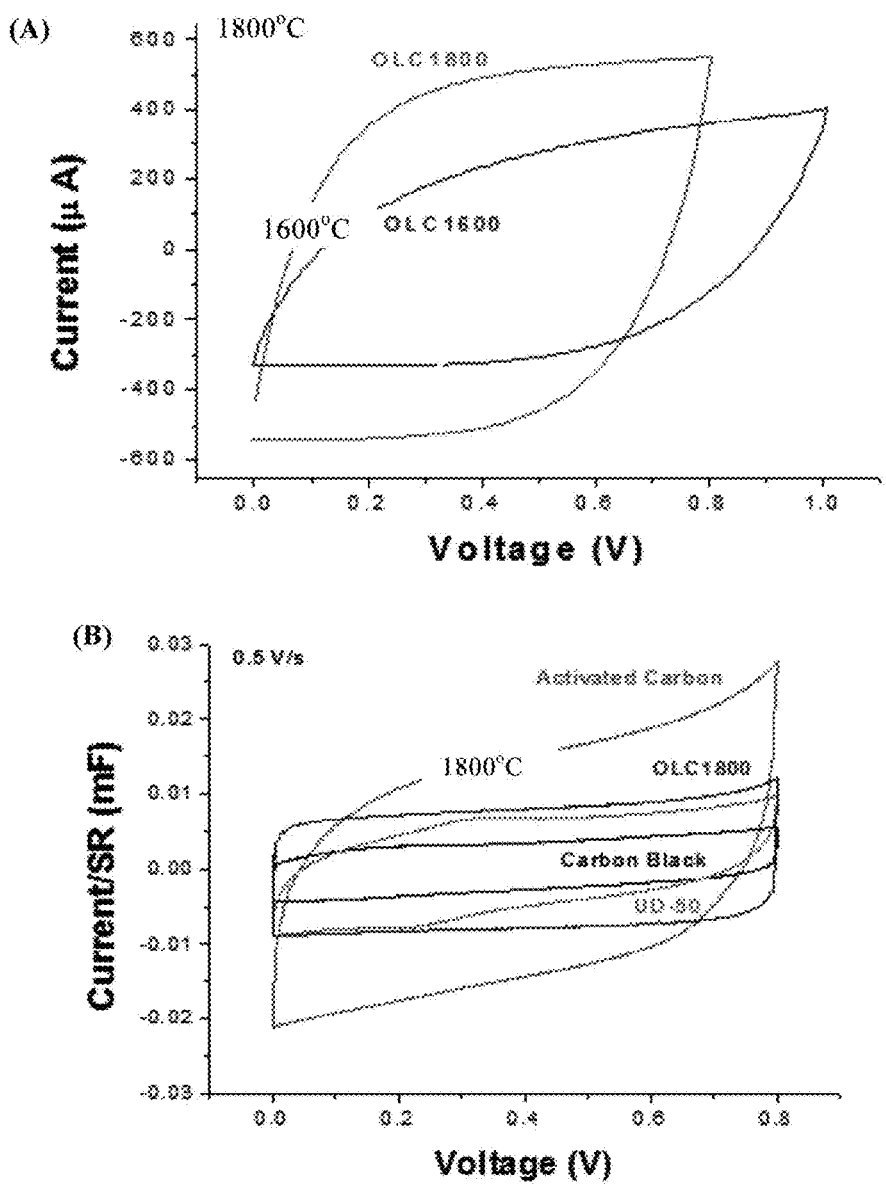
FIG. 13 (A-C) shows cyclic voltammograms of UD50, alliform carbon, carbon black, and activated carbon in 1 M $H_2SO_4$ at different scan rates. Comparison of alliform carbon annealed at 1800° C. and other carbon materials at (A) 50 V/s; (B) 0.5 V/s; and (C) 15 V/s.
Figure 13:
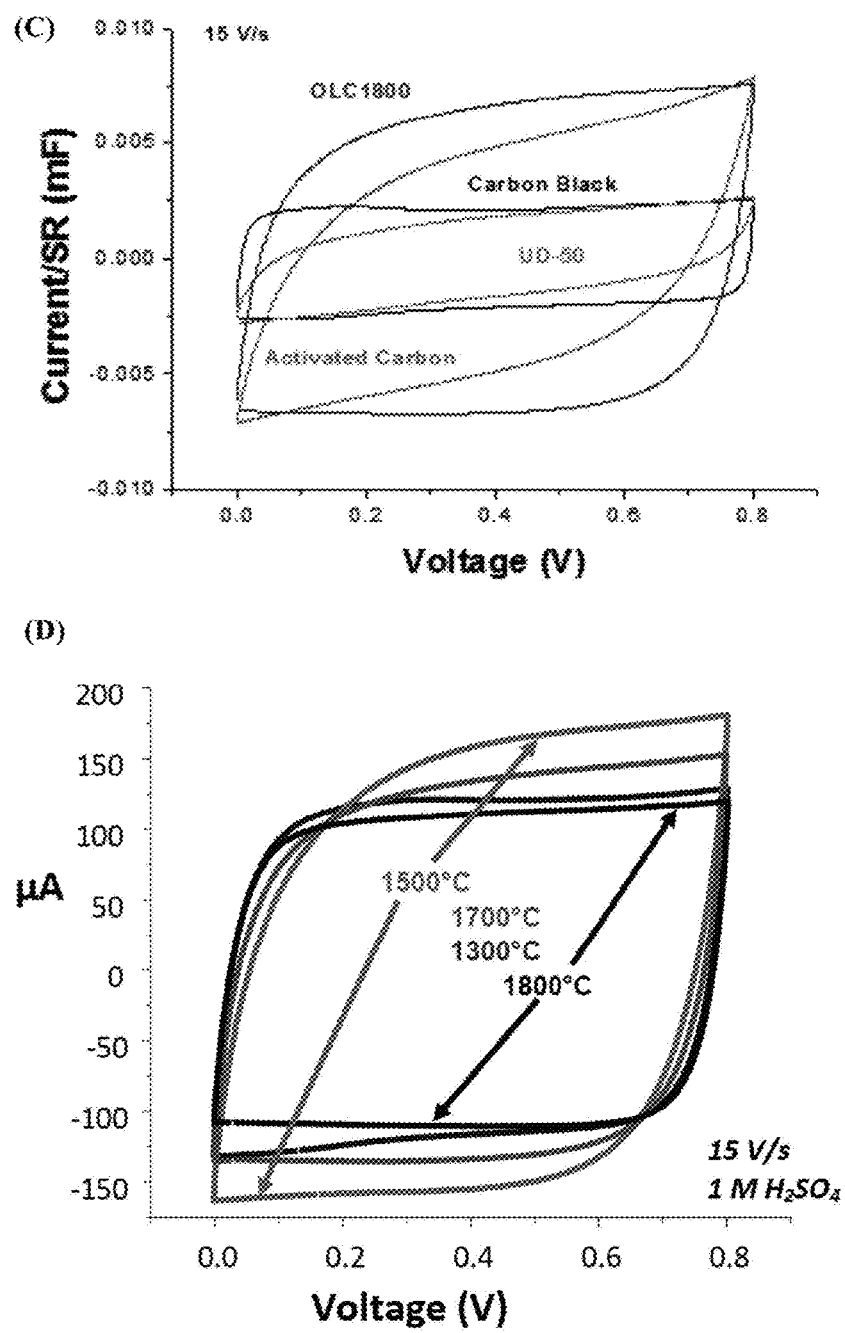
Figure 13:
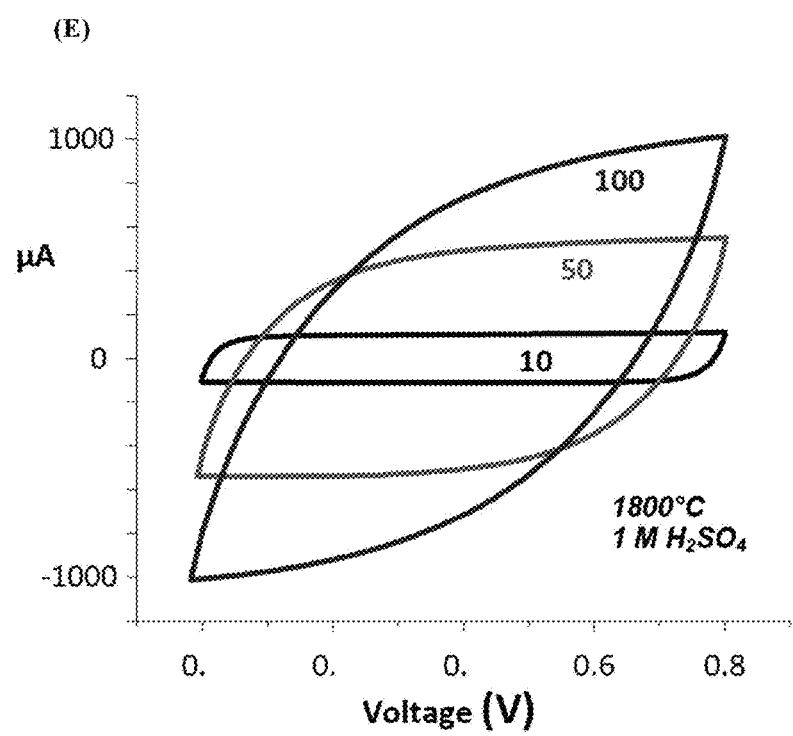

For large, highly porous particles, ion mobility posed a limitation because of the long diffusion path though the micropore network translating into a limited rate handling ability. This limitation can be improved by employing nanosized materials. Exohedral carbon surfaces, with the less-confining interparticle pore volume was expected to pose much less mobility limitations resulting in a higher power handling ability with scan rates in the V/s range. Alliform carbon resembled a material with a closed surface which indicated it will show capacitive behavior at high scan rates as evident in FIG. 13.

FIG. 13A compares the CVs of alliform carbon particles annealed at 1600° C. and 1800° C. at an ultra-high scan rate of 50 V/s. For both materials, the rectangular shapes of the curves reflected their capacitive behavior; alliform carbon annealed at 1800° C. outperformed the alliform carbon annealed at 1600° C., possibly due to increased graphitization at higher annealing temperatures and a better rate handling ability results. The materials were also tested for scan rates up to 100 V/s at which the material was predominantly resistive indicating the rate limits of the material had been reached.

The best performing sample, the alliform carbon annealed at 1800° C., was compared to other similar materials including activated carbon, carbon black, and the nanodiamond precursor, UD-50 at 0.5 V/s and 15 V/s (FIG. 13B-13C). At a lower scan rate, activated carbon had the highest capacitance although it has a higher intrinsic resistance than alliform carbon annealed at 1800° C. as seen from the pronounced knee which was related to the shunt resistance. Alliform carbon annealed at 1800° C. and carbon black both show highly capacitive behavior at this scan rate, but the alliform carbon significantly outperformed carbon black in capacitance. Nanodiamond is an intrinsically poor material for supercapacitor electrodes, but its capacitance was still higher than for carbon black. Some peaks in CVs of UD-50 may have related to reactions of residual iron impurities. While activated carbon has the highest capacitance at 0.5 V/s, the alliform carbon annealed at 1800° C. was the material with the largest energy storage capacity at higher scan rates (15 V/s, FIG. 13C) because of rate limitation. Carbon black also largely maintained its capacitive behavior but had a significantly lower capacitance, exhibiting a capacitance approximately 20% that of alliform carbon annealed at 1800° C. at all scan rates.

Figure 14:
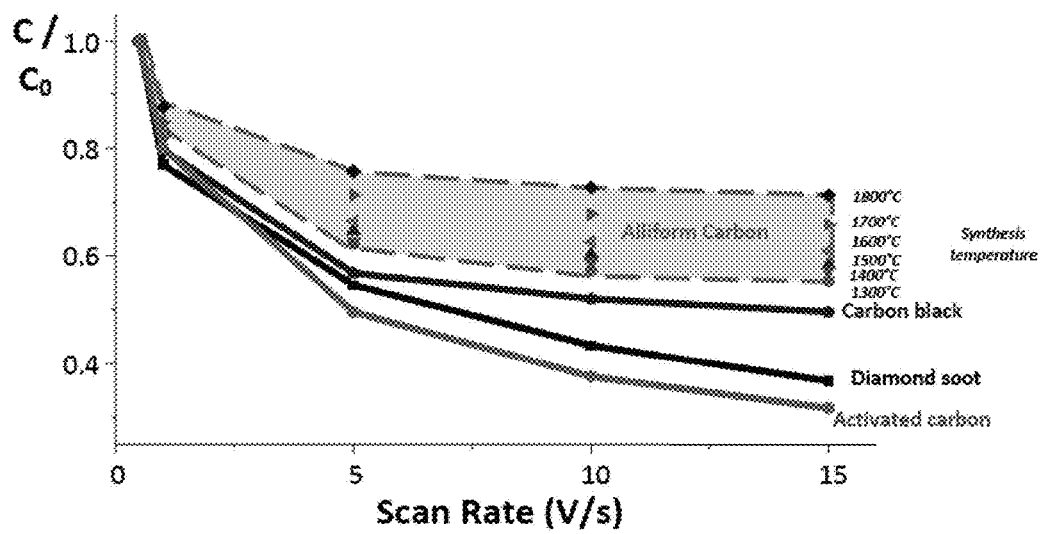
FIG. 14 compares the performance of various forms of carbon, in terms of relative capacitance vs. scan rate. Alliform carbon particles are able to store a larger amount of energy at high scan rates when compared to other carbon materials used for energy storage. Capacitance normalized by capacitance at 1 V/s.

FIG. 14 shows that the capacitance of activated carbon at a high scan rate of 15 V/s retains less than 40% of its initial value at 0.5 V/s. In comparison, alliform carbon annealed at 1800° C. retains about 80% of its initial capacitance at that rate. Alliform carbon, independent from the synthesis temperature, showed a large drop in the capacitance when going from 0.5 V/s to 5 V/s, but then only a small further decrease indicating that the rate limitations of the material had not been reached at scan rates up to 15 V/s.

Figure 15:
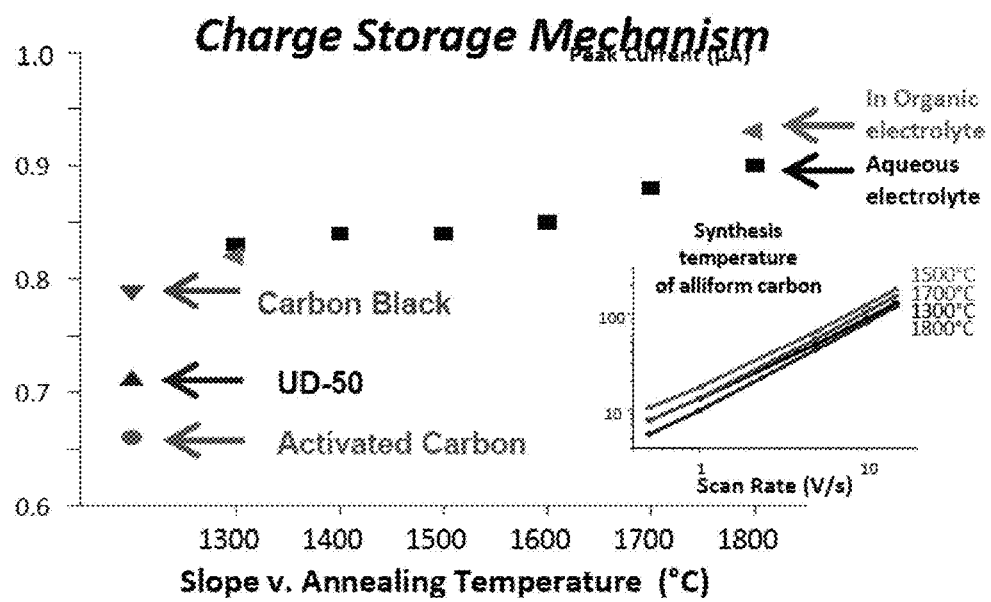
FIG. 15 provides data supporting a potential mechanism for charge storage, whereby the slope of peak current vs. scan rate characterizes the charge storage mechanism. A slope of 1 represents an ideal ELDC (purely capacitive) behavior. A slope of 0.5 would indicate diffusion controlled processes. The higher annealed alliform carbon particles show a mechanism that is almost purely capacitive.

More insights on the power handling limitations were obtained from plotting the peak current versus the scan rate (inset in FIG. 15). As seen from FIG. 15, and using the calculation methods described in Conway, B. E., Electrochemical Supercapacitors: Scientific Fundamentals and Technological Applications, 1999, which is incorporated by reference herein, all slopes for alliform carbon materials obtained from various synthesis temperatures ranged between ~0.8 and 0.9. With higher synthesis temperature, the slopes are closer to 1 which is in agreement with the improved power handling ability at higher temperatures because of the higher degree of graphitization/structural order. This trend was observed for measurements that were carried out in aqueous electrolytes and organic electrolytes. Even the alliform carbon with the lowest synthesis temperature still had more capacitive behavior and a larger slope than carbon black. Activated carbon showed the least preferable rate performance, with a slope of 0.66, which was most likely due to diffusion of ions in and out of pores as the rate limiting factor.

Figure 16:
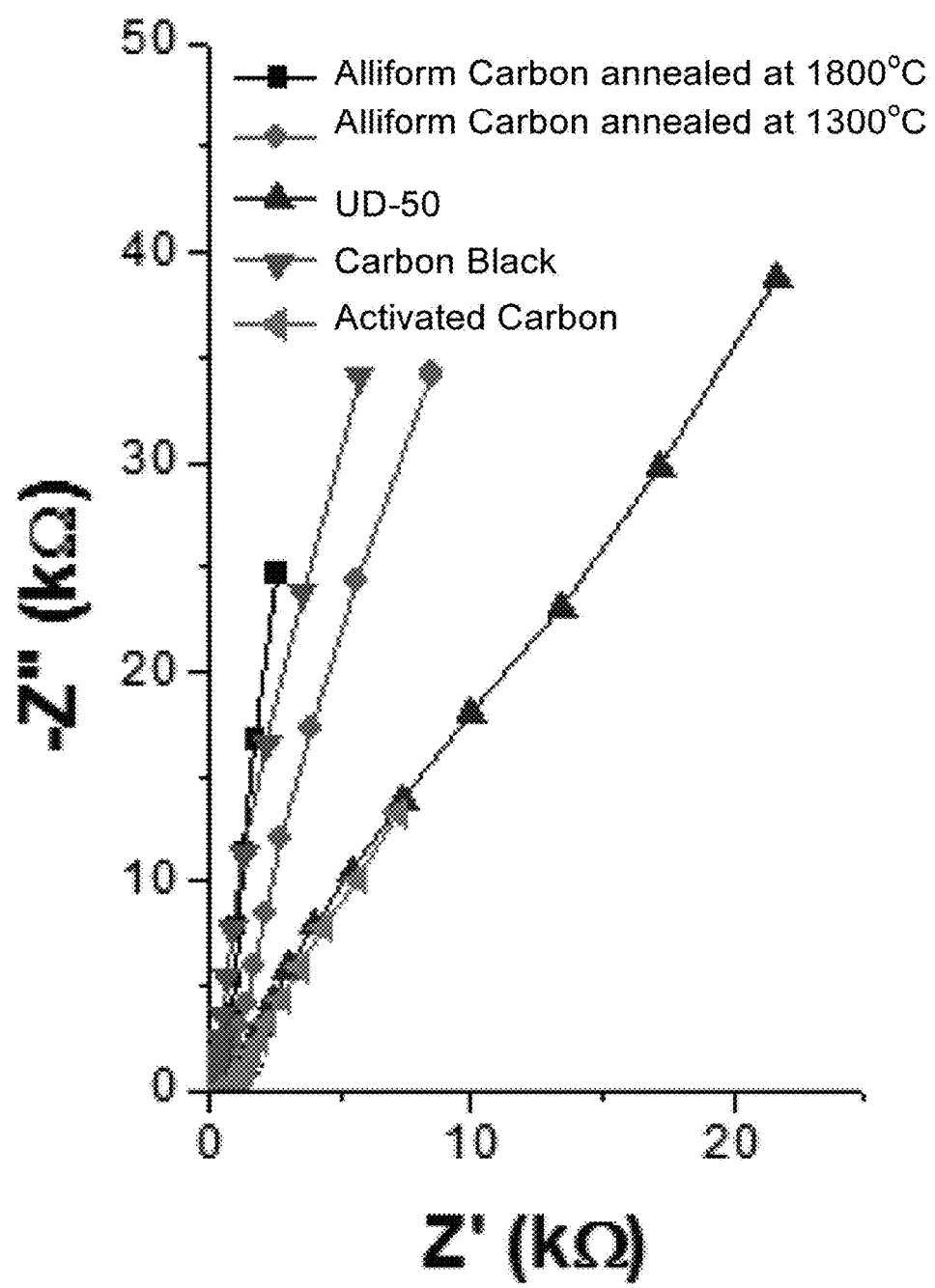
FIG. 16 shows a Nyquist plot of alliform carbon, UD-50, carbon black, and activated carbon in 1 M $H_2SO_4$.

Electrochemical Impedance Spectroscopy (EIS) in Aqueous Electrolyte:

A supercapacitor device will behave as a resistor at high frequency and as a capacitor at low frequency and the charge storage mechanisms can be deduced from analyzing the impedance data in a Nyquist plot. EIS analysis of alliform carbon particles, activated carbon, carbon black, and the UD-50 precursor are shown in FIG. 16. A high slope in the Nyquist plot at low frequencies, which was the case for carbon black and alliform carbon samples, is distinctive of capacitive behavior, while a small slope, as in UD-50 and activated carbon, is distinctive of resistive behavior that arises from conductivity and diffusion limitations. The highly graphitized alliform carbon annealed at 1800° C. exhibited a more capacitive behavior at low frequency when compared to alliform carbon annealed at 1300° C.

From the EIS data, the real and imaginary capacitances, C' and C'', were calculated. Comparing C' for different materials will show which material will have a higher total capacitance, while the time constant of the material could be found from the inverse of the maximum of the C'' vs frequency curve. The time constant of all of the alliform carbon samples were very short, between 9 and 14 ms, which approached the range of electrolytic capacitors. Activated carbon supercapacitors typically have a time constant in the range ~1 s.

Figure 17:
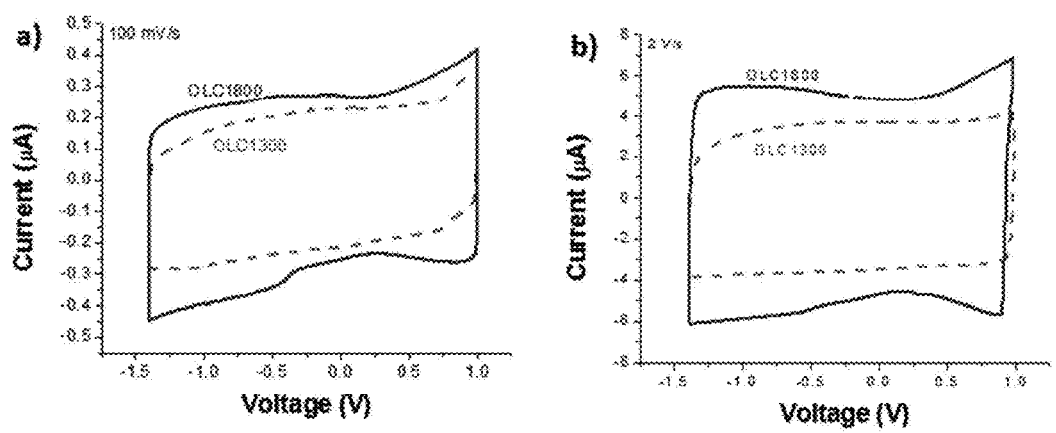
FIG. 17 shows cyclic voltammograms comparing alliform carbon annealed at 1300° C. and 1800° C. at 0.1 and 2 V/s in 1 M TEA-$BF_4$ in acetonitrile.

Cyclic Voltammetry and Rate Performance in Organic Electrolytes:

The CVs of alliform carbons tested in 1M TEA-BE) in acetonitrile are shown in FIG. 17 and a trend similar to the data presented for aqueous electrolyte was observed. Higher annealing temperatures translate into improved rate handling ability as seen from FIG. 15. With a value close to 1 (i.e., 0.93), the slope plot in FIG. 15 indicated for alliform carbon obtained after synthesis at 1800° C. a behavior close to that of an ideal supercapacitor.

Figure 18:
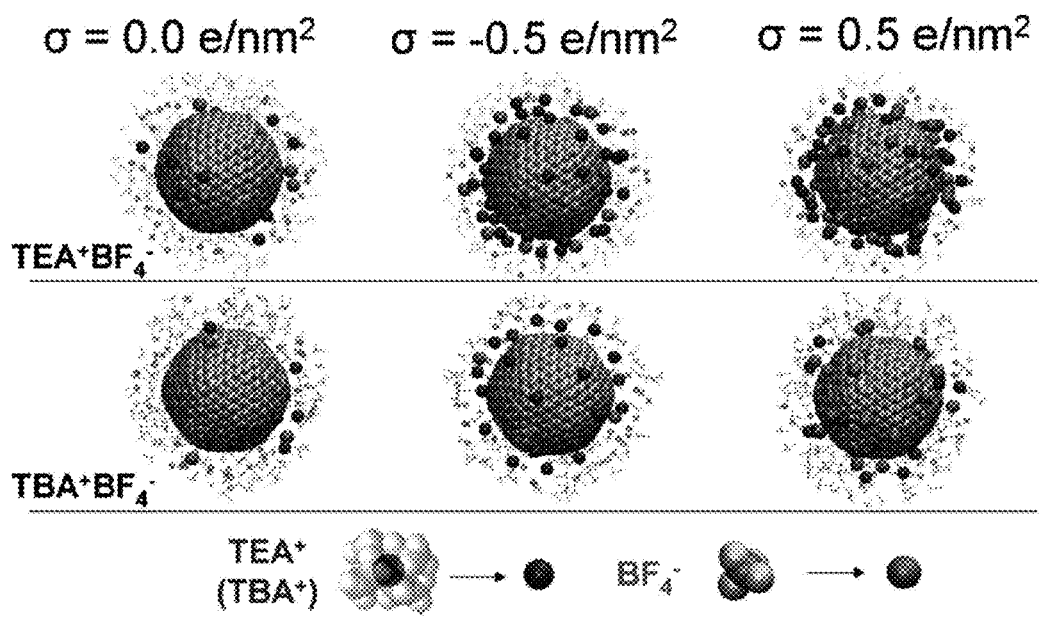
FIG. 18 illustrates the distribution of particles around alliform carbon anions for three surface charge densities and two electrolytes (solvents): 1.3 M TEA-$BF_4$ and TBA-$BF_4$, both in acetonitrile. Only those molecules in the simulation boxes are represented which are within 1.0 nm from the alliform carbon particle surface. (TEA=tetraethyl ammonium; TBA=tetrabutyl ammonium)

The experimental electrical performance of alliform carbon was supplemented by molecular dynamics simulations that show the behavior of ions at the carbon—electrolyte interface. The orientation of the ions around the neutral alliform carbon particle (FIG. 18) shows the system to prefer adsorption of molecular anions vs. cations for both electrolyte solutions (FIG. 18A). There was an early onset of anions adsorbed on the surface for the neutral particle, followed by a much larger cation peak. This is attributed to the fact that the solvated cations (1.3 nm) are larger and possess non-polar hydrophobic chains in comparison to smaller solvated anions (1.16 nm). The long hydrophobic tails of the cations have a strong affinity to the surface of the neutral alliform carbon particle via Van der Waals forces, leaving the central charged nitrogen atom oriented away from the particle. For this reason, the cation peak is a greater distance from the alliform carbon particle than the anion peak.

It can also be seen in FIG. 18A at zero charge density that the $TBA^+$ ion showed several peaks, in comparison to the single peak of $TEA^+$, which was attributed to a stronger adsorption due to the much larger non-polar alkyl chains that are able to orient themselves around the alliform carbon particle in many different conformations creating a thicker double layer region. The cation charge density was much larger because the interactions between like charges were minimized due to the large alkyl chains. The longer chains in the $TBA^+$ ion were able to minimize the repulsion energies more efficiently, creating three peaks.

The same scenario but more pronounced was seen for the charged alliform carbon particle at 0.5 and -0.5 e/nm². For the negatively charged alliform carbon particle, there was a diffuse layer of the $BF_4^-$ ions attracted to the adsorbed cations. Conversely for the positively charged alliform carbon particle, there was a diffuse layer of $TEA^+$ and $TBA^+$ ions attracted to the layer of adsorbed anions. The broad peak of the anions for the negatively charged alliform carbon particle can be attributed to the small relative size of the $BF_4^-$ ion. It is believed that the ion was able to maneuver around the large alkyl chains of the cation allowing for a broader distribution.

The adsorption of ions was stronger on the surface for the $TEA-BF_4$ rather than $TBA-BF_4$ with a negative surface charge, which could be attributed to the size difference between $TEA^+$ and $TBA^+$ (assuming that also solvated $TEA^+$ and $TBA^+$ represent a similar size difference as the unsolvated ions), as there are more $TEA^+$ ions able to be adsorbed to the surface of the alliform carbon. Interestingly, however, the cation-anion separation was larger for $TBA-BF_4$, possibly due to the larger non-polar alkyl chains. Also, the solutions containing the $TBA^+$ ions exhibited two small secondary peaks in the diffuse layer which could have interesting consequences compared to $TEA^+$ regarding electric double layer capacitors. Furthermore, for the positively charged alliform carbon particle, the adsorption of $BF_4$ in the $TEA-BF_4$ solution was also stronger because there are more counter-ions available at a closer distance for charge screening. Similar to their $TBA^+$ counter ion at a negative surface, the $BF_4^-$ ion has several small peaks in the diffuse layer for a positively charged surface. While the simulation was performed on smaller and idealized alliform carbon particles compared to the ones used in experiments, it gave insight into ion behavior at the alliform carbon particle surface.

Figure 19:
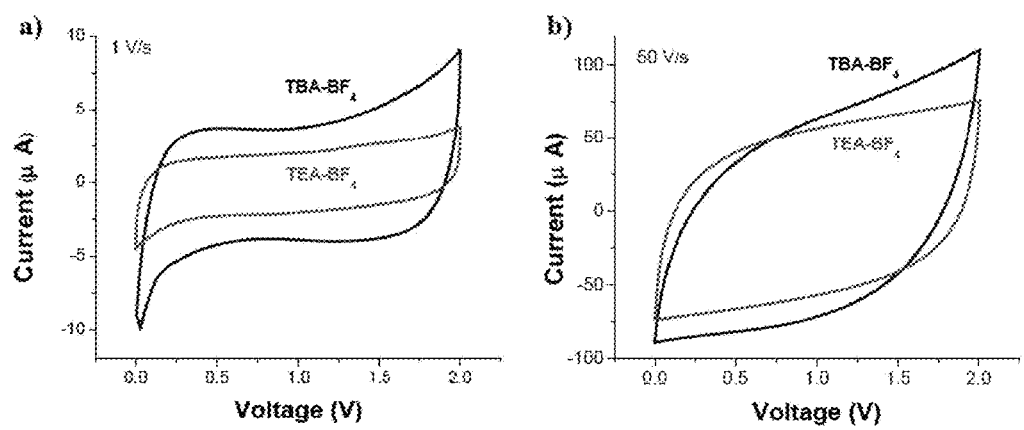
FIG. 19 provides cyclic voltammograms of alliform carbon annealed at 1800° C. comparing the effect of scan rate (A) 1 V/s and (B) 50 V/s, for two similar electrolytes, 1 M TEA-$BF_4$ and 1 M TEA-$BF_4$, each in acetonitrile.

Alliform carbon particles annealed at 1800° C. were tested in $TEA-BF_4$ and $TBA-BF_4$ and the results shown in FIG. 19 can be correlated with the modeling results of FIG. 18. It can be seen that $TBA-BF_4$ showed a considerable higher capacitance compared to $TEA-BF_4$ at lower scan rates FIG. 19A. At higher rates (FIG. 19B), $TBA-BF_4$ tended to a much more resistive curve, attributed to the larger, less mobile $TBA^+$ ion compared to the $TEA^+$ ion.

These results are somewhat unexpected. It was thought that the smaller $TEA^+$ ion would have a high capacitance because a larger charge density on the surface would arise from the smaller ion size. Without being bound by a particular theory, the anomalous higher capacitance from the $TBA-BF_4$ may arise from the greater distance between cations and anions at the surface compared to $TEA-BF_4$. The larger alkyl chains of the $TBA^+$ ion prevent the anions to come into close proximity with the cation, creating a larger absolute charge compared to the smaller $TEA^+$ ion.

Example 3

Figure 5:
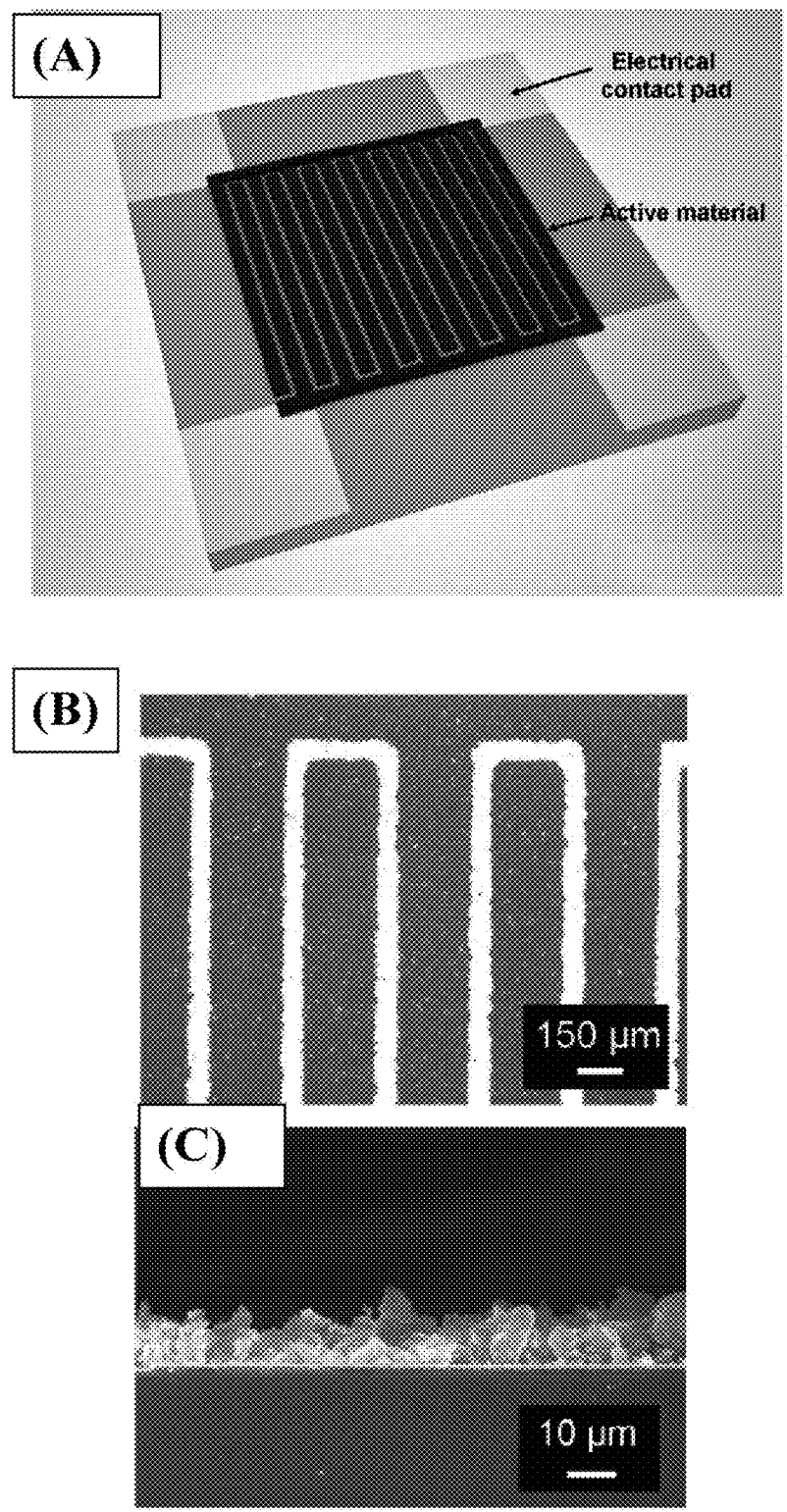
FIG. 5(A) diagrammatically represents an interdigital array of electrodes according to the present invention.
FIG. 5(b) is an optical image of the interdigital fingers with a 100 micron spacing.
FIG. 5(c) is a Scanning Electron Microscope (SEM) image of the cross section of the alliform carbon electrode.

Elaboration and Electrochemical Characterization of Supercapacitive Micro-Devices Alliform carbon particles were produced by annealing nanodiamond powder at 1800° C. (FIGS. 2B and 8) and deposited from colloidal suspensions using the electrophoretic deposition technique (EPD) onto interdigital Au current collectors patterned on Si wafers. This method allowed preparing electrodes without the use of an organic binder (FIG. 5). An adherent layer of alliform carbon particles was obtained on the Au current collectors, with a well-defined pattern and no short circuit between the electrodes (FIG. 5). The micro-device was composed with 16 interdigital electrodes of 7 μm in thickness (8 electrodes per polarity) as shown in FIG. 5C.

Preparation of Micro-Devices:

Micro-devices were prepared as follows. Silicon dioxide (300 nm) was first thermally grown on silicon wafer followed by the evaporation of 100 nm of titanium and 800 nm of gold. The current collectors with various geometries (4, 8 and 16 interdigital fingers; see e.g., FIG. 5A; Table 3) on which the active material was deposited were formed by conventional photolithography and etching of the titanium/gold layer. The active alliform carbon and activated carbon particles were then deposited by electrophoretic deposition (EPD) onto the patterned current collectors, by using 0.3 weight % of carbon in a 95%-5% ethanol-water solution. In order to stabilize the carbon particles (zeta potential+ 12.2±1.1 mV for alliform carbon) and obtain an adherent layer, 0.03 weight % of $MgCl_2$ were added to the suspension. Without limiting the scope of the invention, it has been indeed reported that hydroxyl ions accumulated near the electrode react with $Mg^{2+}$ ions adsorbed on the carbon particles to form magnesium hydroxide $Mg(OH)_2$ which acts as an inorganic binder for the deposited particles. The particle sizes (agglomerates in solution) were 0.8±0.9 and 4.2±1.1 μm, for the alliform carbon and activated carbon, respectively. A DC voltage of 50 V/cm was then applied between the micro-devices and a gold electrode. Thickness of the deposited layer was determined using SEM and confocal microscopy to be about 7 microns. The deposition rate was estimated to be around 0.5 μm/min, and the density of both alliform carbon and activated carbon deposit was ~0.5 g/cm$^3$. See FIG. 5C; Table 3.

TABLE 3

Dimensions of the micro-supercapacitors designed with 4, 8 and 16 interdigital electrodes

| Number of interdigital electrodes | 4 | 8 | 16 |
|---|---|---|---|
| Width, w (μm) | 1175.0 | 537.5 | 218.8 |
| Length, l (mm) | 4.5 | 4.5 | 4.5 |
| Interspace, i (μm) | 100 | 100 | 100 |
| Total surface S of the conducting electrodes (mm$^2$) | 21.15 | 19.35 | 15.75 |
| Mean path (μm)** | 176.1 | 86.3 | 46.1 |
| Total surface $S_p$ of the cell (mm$^2$) | 25 | 25 | 25 |

**The mean ionic path between 2 opposite electrodes has been deduced from the geometric distance between the interdigital fingers using a Matlab ™ routine.

The micro-devices were then filled with a 1M $Et_4NBF_4$/anhydrous propylene carbonate electrolyte in a glove box under Argon atmosphere with $H_2O$ and $O_2$ levels less than 1 ppm (in order to prevent any early oxidation of the electrolyte). They were placed in sealed cells then removed from the glove box to be connected to a Biologic VMP potentiostat to perform the electrochemical characterizations in the 2-electrode cell mode. Electrochemical impedance spectroscopy (EIS) measurements were carried out at open circuit voltage (OCV) by applying a sinusoidal signal of 10 mV amplitude at frequencies ranging from 100 kHz to 10 mHz.

The cell capacitances (in F/cm$^2$) were calculated using the voltammetric discharge integrated from the cyclic voltammogram over the whole potential range (3 V) according to the following equation:

$$C = \frac{Q}{\Delta E \times S} \text{ or } C = \frac{1}{v} \frac{\int_0^3 i(E) dE}{\int_0^3 dE} \quad (1)$$

where Q is the charge (in C or A.s), E is potential, ΔE is the potential window (in V), and S is the total surface of the positive and negative conducting electrodes (in cm$^2$).

The stack capacitance (in F/cm$^3$) was calculated by taking into account only the active material, the current collectors and the separator and, for all the devices tested, did not include the packaging. In the case of the micro-device, the same procedure has been used: the stack is defined from the whole projected surface area $S_p$ (25 mm$^2$) including the gap between the electrodes, and taking into account the thicknesses of the current collector and the active material.

The electrochemical performance of all devices reported in the Ragone plot (FIG. 1) was based on the volume of the stack and measured under the same dynamic conditions from cyclic voltammetry (using the same potential scan rate in charge and discharge) according to the following conditions.

For a given scan rate v (V/s), the discharged power P (W) was calculated by integrating the current (I) vs. potential (E) plots (equation (2)):

$$P = \int_0^3 I \times E \, dE \quad (2)$$

The discharged energy W(Wh) was obtained by using equation (3):

$$W = \frac{\Delta E}{v \times 3600} \times \int_0^3 I \times E \, dE \quad (3)$$

where ΔE was the discharge potential range (3V).

Cyclic Voltammetry Results:

The micro-device used for these experiments had 16 interdigital electrodes of 7 μm in thickness (8 electrodes per polarity) as shown in FIG. 5.

Figure 21A:
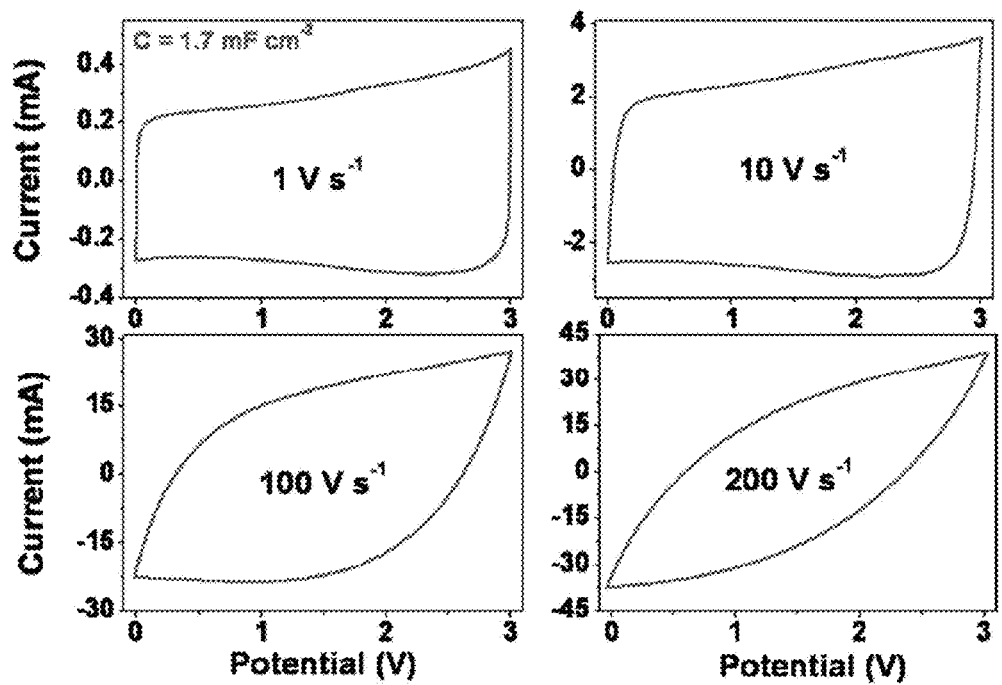
FIG. 21 illustrates several electrochemical characterizations of the micro-devices. (A) Cyclic voltammograms obtained at different scan rates in a 1 M $Et_4NBF_4$/anhydrous propylene carbonate on a 16 interdigital electrochemical micro-capacitor with a 7 μm thick alliform carbon deposit. A typical rectangular shape as expected for double layer capacitive materials is observed at an ultrahigh scan rate over a 3 V potential window. (B) Evolution of the discharge current vs. scan rate. A linear dependence is obtained up to at least 100 V/s in the capacitive region, indicating ultrahigh power ability for the micro-devices.
Figure 21B:
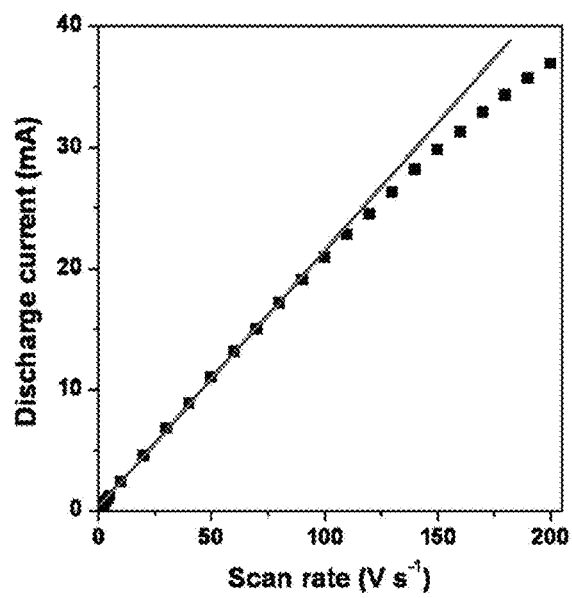
Figure 22:
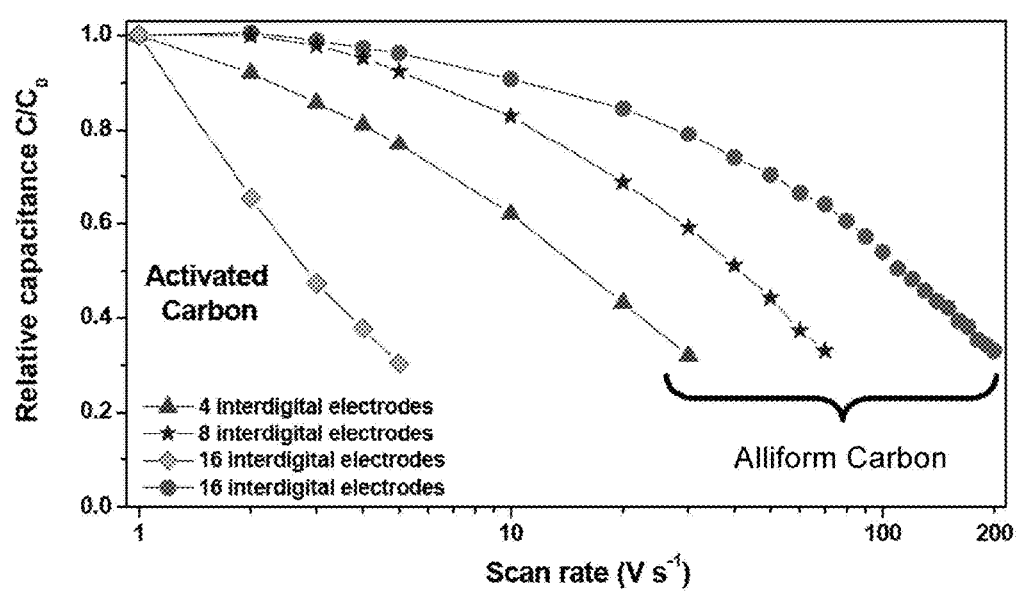
FIG. 22 shows the evolution of the relative capacitance vs. scan rate for micro-devices made of 4, 8 and 16 interdigital electrodes. The larger number of interdigital electrodes, the more power is extracted from a given micro-device, stressing the key role of the device architecture in the observed breakthrough electrochemical performance. The electrolyte resistance decreases with the reduction of the mean ionic diffusion path between the electrodes, with no more ion transport limitations. A 5 μm thick layer of activated carbon in a micro-device made of 16 interdigital electrodes shows nevertheless a lower performance. It clearly demonstrates that the power ability is attributable to the combination of the carbon nanomaterial with the micro-device architecture.

Cyclic voltammograms were recorded at scan rates from 1 to 200 V/s to test the power capability of the micro-system. A reproducible and stable capacitive behavior (up to 10,000 cycles, see FIG. 20) was obtained for the micro-device over a 3 V potential window in a 1M solution of tetraethylammonium tetrafluoroborate in propylene carbonate, with a linear dependence of the discharge current on the scan rate and low resistive contributions up to 100 V/s (FIG. 21). This scan rate is more than two orders of magnitude higher than any result reported with alternative devices, including micro-devices, or micro-cavity electrodes. Furthermore, the more interdigital electrodes per unit area, the more power is extracted from the micro-device. This is explained by a significant reduction of the mean ionic diffusion path between two electrodes (see FIG. 22 and Table 2).

Additionally, the specific capacitance of this micro-device was 0.9 mF/cm² at 100 V/s, which is comparable to values measured at much lower scan rates (1 to 100 mV/s) for electrochemical double layer micro-capacitors (0.4 mF/cm²-2 mF/cm²), as reported in In, N. J., et al., Origami fabrication of nanostructured, three-dimensional devices: electrochemical capacitors with carbon electrodes. *Appl. Phys. Lett.* 88, 0831041-0831043 (2006); Pech, D. et al. Elaboration of a microstructured inkjet-printed carbon electrochemical capacitor. *J. Power Sources* 195, 1266-1269 (2010); and Kaempgen, M., Chan, C. K., Ma, J., Cui, Y. & Gruner, G. Printable thin film supercapacitors using single-walled carbon nanotubes. *Nano. Lett.* 9, 1872-1876 (2009). The high scan rate, representative of a high instantaneous power, is thus concomitant with high specific capacitance, which is believed to be explained by the significant (7 μm) thickness of the active film. The combination of alliform carbon particles with a fully accessible surface area, with a binder-free deposition technique and a micro interdigital device design led to this high power/energy performance.

Figure 23A:
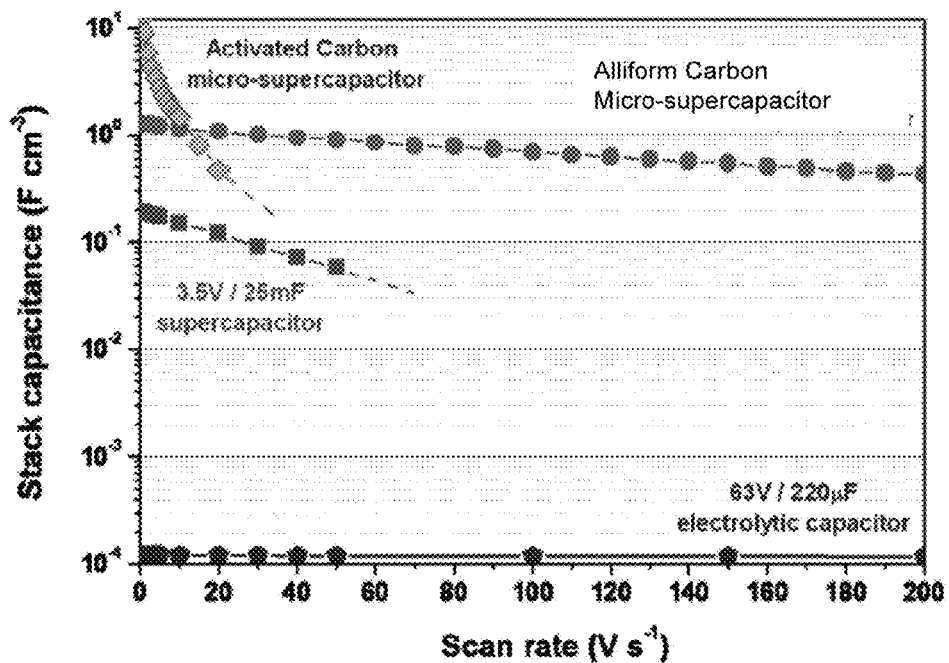
FIG. 23 provides comparisons of the micro-supercapacitors of the present invention with other energy storage devices. (A) Evolution of the stack capacitance vs. scan rate. Alliform carbon micro-supercapacitors can sustain very high scan rate like electrolytic capacitors. The stack capacitance is nevertheless 4 orders of magnitude higher than the one of electrolytic capacitors. (B) Evolution of the volumetric energy of different energy storage devices. (C, D) Evolution of the real and imaginary part (C' and C") of the stack capacitance of a 16 interdigital electrochemical micro-capacitor based on alliform carbon and activated carbon. An extremely low relaxation time constant $\tau_0$ (26 ms) was obtained for the alliform carbon revealing a fast accessibility of the ions for electrosorption.
Figure 23B:
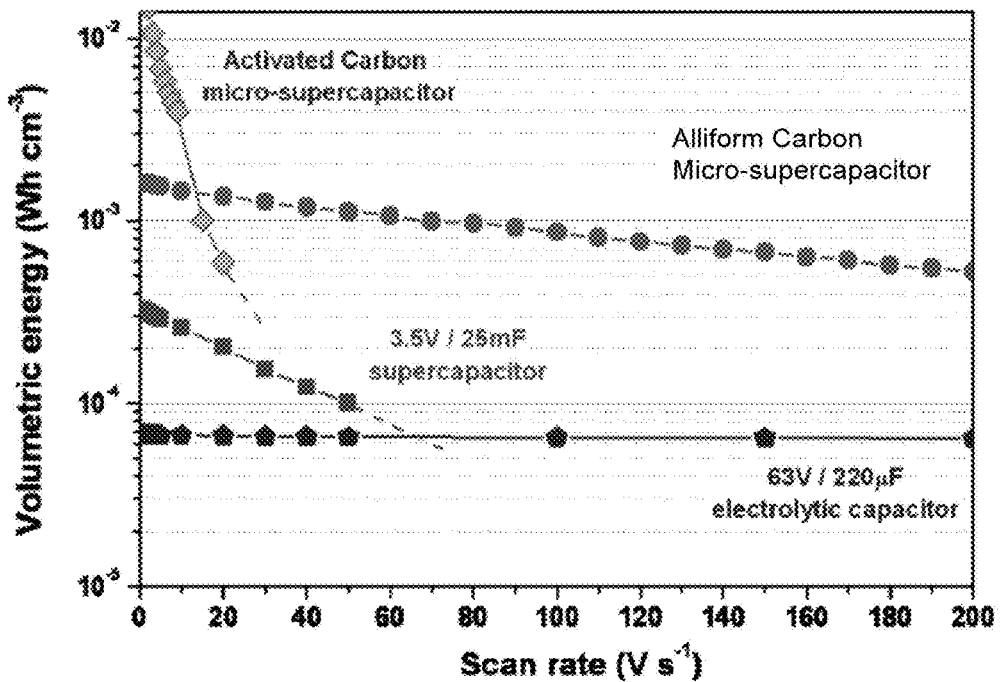
Figure 23:
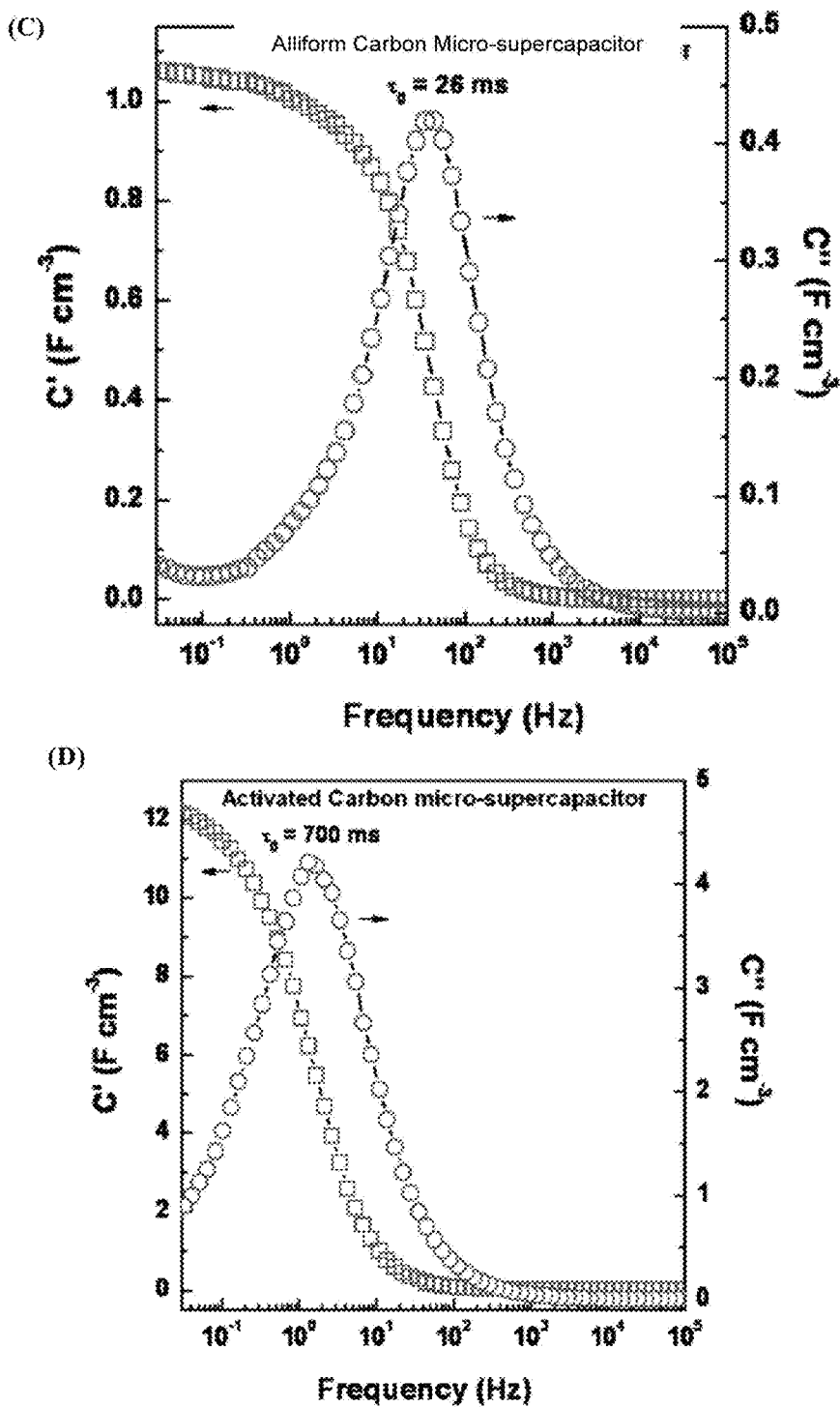
Figure 24:
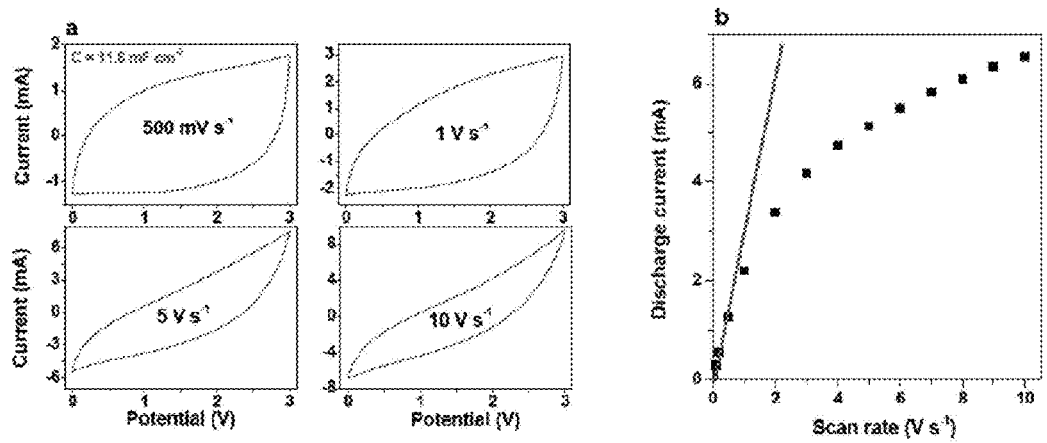
FIG. 24 shows (A) cyclic voltammograms obtained at different scan rates from a 16 interdigital micro-supercapacitor based on a 5 μm thick activated carbon in a 1M $Et_4NBF_4$/anhydrous propylene carbonate; (B) evolution of the discharge current vs. scan rate. A linear dependence is obtained to only 1 V $s^{-1}$, indicating the important role of the active material.
Figure 25:
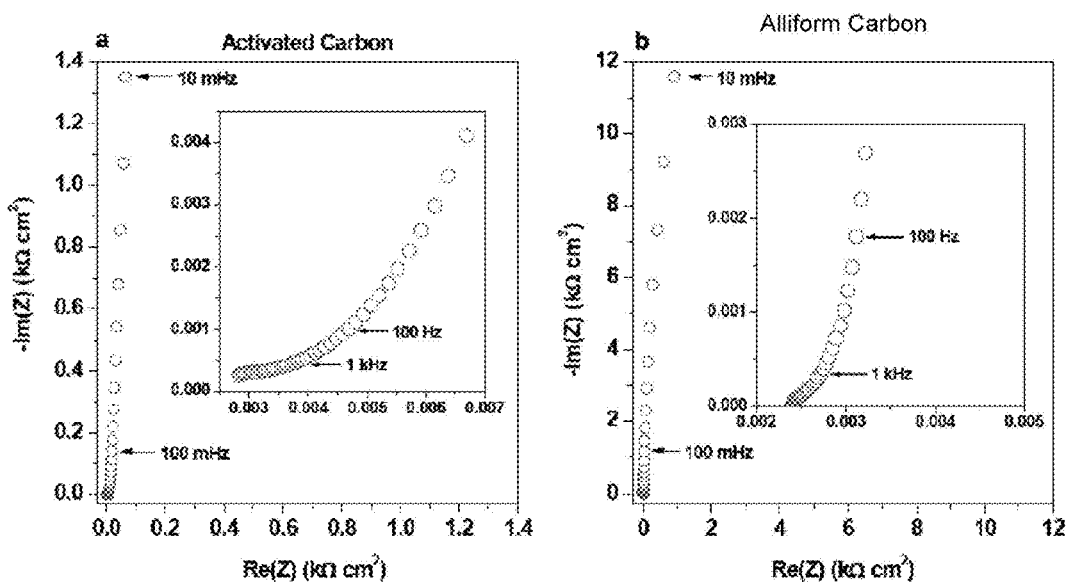
FIG. 25 shows (A) Nyquist plots obtained from a 16 interdigital micro-supercapacitor in a 1M $Et_4NBF_4$/anhydrous propylene carbonate. a, Micro-device based on activated carbon; (B) micro-device based on an alliform carbon. Differently from the activated carbon-based micro-device, the micro-supercapacitor containing alliform carbon as active material shows a pure capacitive behaviour even at high frequencies (>100 Hz) thanks to the full accessible surface area offered by the alliform carbon particles.

Comparison with Activated Carbon Electrodes:

To highlight the effect of the endohedral structure of alliform carbon particles on the cell performance, a 5.0 μm-thick high surface area activated carbon (1700-1800 m²/g, Kuraray Chemical Co.) was used as the active material in a micro-device made of 16 interdigital electrodes. The deposition technique and the cell assembly were kept the same. FIGS. 23A and 23B show the comparison of the stack capacitance and energy of the micro-devices, respectively, with activated carbon and alliform carbon. Despite a higher capacitance (9.0 F/cm³ compared to 1.3 F/cm³ for alliform carbon) and a capacitive behaviour up to 1 V/s (FIG. 24), the capacitance of micro-devices with activated carbon falls quickly at a higher scan rate, indicating severe decrease in the instantaneous power of activated carbon relative to alliform carbon-based micro-devices because of the limitation of the ion transfer in the inner porous network of the activated carbon. Both micro-devices exhibit a low Equivalent Series Resistance (ESR, FIG. 25), but since the entire outer surface of alliform carbon particle assembly is fully accessible to ion adsorption/desorption, it is characterized by an extremely small characteristic relaxation time constant $\tau_0$ of 26 ms ($\tau_0$ being the minimum time needed to discharge all the energy from the device with an efficiency>50%, FIG. 23C), much lower than the activated carbon-based micro-device ($\tau_0$=700 ms, FIG. 23D) or alliform carbon-based macroscopic devices ($\tau_0$>1 s). It was shown theoretically that the positive curvature causes the normalized capacitance to increase with decreasing particle size. Therefore, alliform carbon has the potential for delivering high power and energy as one of the smallest endohedral particles available.

Example 4

Performance of Alliform Carbon in Graphitic Mesoporous Carbon Matrices

Mesoporous carbon samples comprising 5 wt % and 25 wt % (additive content in the starting synthesis gels prior to thermal treatment, relative to the total weight of the gels) of alliform carbon particles were prepared using a synthesis method described in X. Q. Wang, et al., *Langmuir* 2008, 24, 7500, which is incorporated by reference in its entirety herein. Alliform carbon particles were obtained by vacuum annealing detonation nanodiamonds at 1500° C., yielding 4-6 nm alliform carbon particles. Mesoporous carbon samples were prepared by the self-assembly of resorcinol (Sigma-Aldrich, 99%) and formaldehyde (Sigma-Aldrich, 37 wt %) in the presence of triblock copolymer Pluronic F127 (E0106-P070-E0106, BASF, purchased from Sigma-Aldrich), according to Wang, et al. In a typical synthesis, approximately 1.1 g of resorcinol and 1.1 g of Pluronic F127 were dissolved in 4.5 mL of ethanol, 3.4 mL of water and 1.1 mL of concentrated (37 wt %) HCl. To this, 1.3 mL of formaldehyde solution (37 wt %) was added and the system stirred until phase separation was observed. The alliform carbon composites were prepared by substituting the resorcinol by weight percent (5-95 wt %) and amount of formaldehyde adjusted proportionately to the amount of resorcinol used. After stirring for an additional 30 minutes, the suspensions were centrifuged at 9500 rpm for 5 minutes and the aqueous phase discarded. The isolated polymer-rich phases were quickly redispersed using minimal amounts of enthanol with strong stirring followed by casting on Petri dishes. Thin films were cured at room temperature for 6 hours (and reference resorcinol/formaldehyde/F127 film overnight) and at 150° C. for 24 hours. The phenolic resin-triblock copolymer nanocomposites were then carbonized at 400° C. for 2 hours (1° C./min heating rate) and 850° C. for 2 hours in flowing nitrogen and using a 2° C./min heating rate.

For capacitive storage measurements, a slurry of the carbon and polyvinylidene difluoride (PVDF; 15 wt %) in N-methylpyrrolidone (NMP) was cast onto aluminium foil and dried under a heat lamp. Electrodes (13 mm diameter) were then cut out and subsequently dried at 120° C. under vacuum. The dry electrodes were then transferred to an inert atmosphere (Argon) glove box for construction of coin-type cells. The electrolyte was trimethylammonium tetrafluoroborate in acetonitrile (1.8 M). Cyclic voltammetry (CV) was performed on a Gamry G300 potentiostat with a potential range of 0.0-2.0 V. The gravimetric capacitance was calculated from the CV curve using the formula:

$$C_g = \frac{\left(\frac{\Delta I}{2}\right)}{mv}$$

where $\Delta I$ is the current difference at 1 V, m is the mass of the active material, and v is the scan rate.

Figure 26:
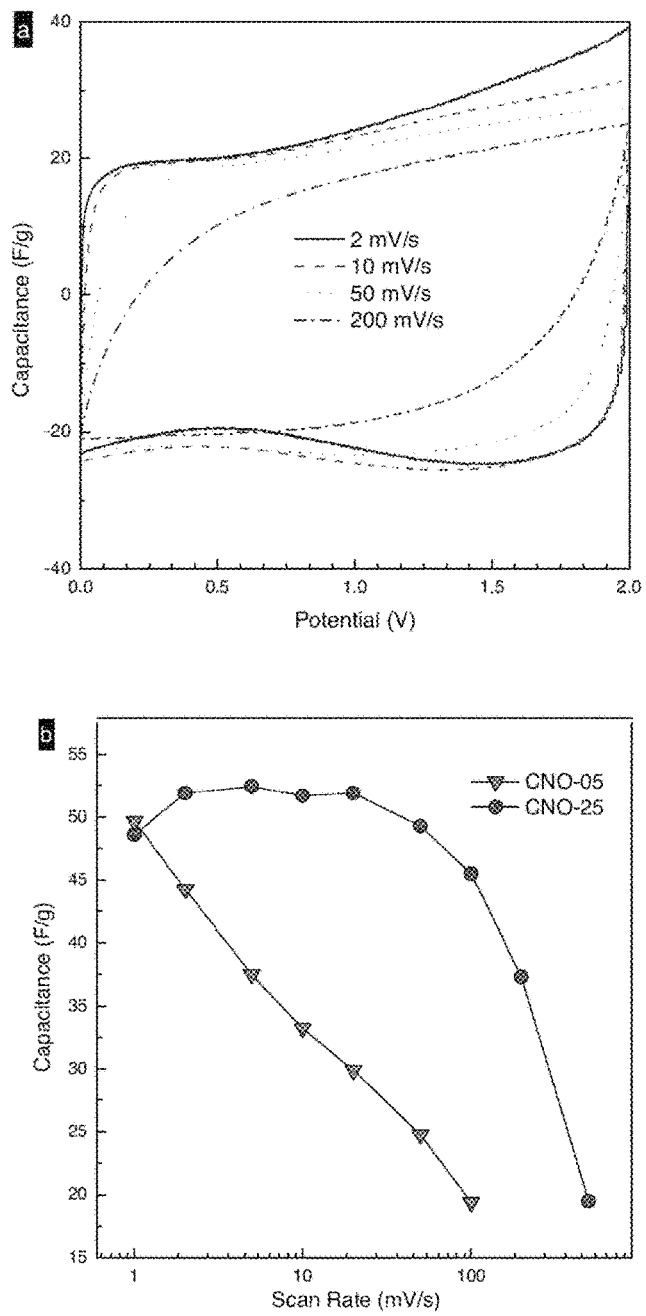
FIG. 26 shows (A) representative cyclic voltammograms for composites comprising 25 wt % alliform carbon; and (B) capacitance results as a function of sweep rates for composites comprising 5 wt % and 25 wt % alliform carbon; both as described in Example 4.

Representative cyclic voltammograms and capacitance as a function of sweep rates for nanocomposites containing 5 wt % and 25 wt % are shown in FIG. 26.

Example 5

Performance of Alliform Carbon in Textiles

Experimental—Carbon Materials:

Two sources of carbon materials were used in these studies: CXV and alliform carbon. CXV is an activated carbon is derived from pinewood (available from Arkema, France). CXV is a typical activated carbon used for preliminary testing of fabric electrodes. The CXV used in these experiments had a particle size of 10-32 μm; a pore size having a broad distribution with a peak at ~1 nm; and a surface area of 1300 m²/g. Alliform carbon was chosen as an additive to increase electronic conductivity of the electrodes. Alliform carbon particles are mostly dense spherical carbon nanoparticles consisting of concentric graphitic shells (multishelled fullerines). The alliform carbon particles used in these experiments were produced by vacuum annealing of UD50 diamond soot (NanoBlox, USA) at 1800° C. The alliform carbon had a particle size of 5-10 nm diameter; interparticle pores of 3-15 nm; and a surface area of 500 $m^2/g$.

Experimental—Fabrics:

An array of fabrics (cotton lawn, polyester microfiber, cotton twill, double knit polyester containing 2 wt % silver, and nylon neoprene) was selected to include both basic and complex strutures made of fiber contents commonly used in the textile and apparel industry. Pertinent to the results herein, the polyester microfiber was a high wicking fiber, made of filament fibers 10 µm in diameter, spun into a fine yarn and woven into a twill fabric (yarn thickness: 50 µm; textile thickness: 200 µm).

Experimental—Electrolyte:

Tests were carried out in 1 M sodium sulfate and 2 M lithium sulfate from Sigma Aldrich. These electrolytes were chosen because they are non-toxic and inexpensive, making them safe for use in smart garments as well as cost effective. Of course use of these or any other liquid of gel electrolyte will require sealing in a polymer film. CXV samples were tested in 1 M sodium chloride, another non-toxic electrolyte.

Experimental—Electrode Preparation:

For comparison with carbon coated textiles, YP17 conventional electrodes were made with each electrode weighing 60 mg containing 6 wt % PTFE binder. The electrodes were 2×2 $cm^2$, and ~200 µm thick.

Experimental—Slurry Preparation:

The carbon slurry consisted of 200 mg YP17 activated carbon per ml water with 5 wt % Liquitex as the binder (Liquitex™ matte medium is an emulsion of polymethyl methacrylate (PMMA) and polyethylene glycol (PEG)). Since the matte medium is completely miscible in water, 5 ml of water was added to the matte medium to disperse the binder. Binder and water were added and mixed slowly into the carbon to create a paste-like slurry. A second slurry was prepared with CXV and a third with CXV and 10 wt % alliform carbon particles, each containing 5 wt % binder.

Figure 27:
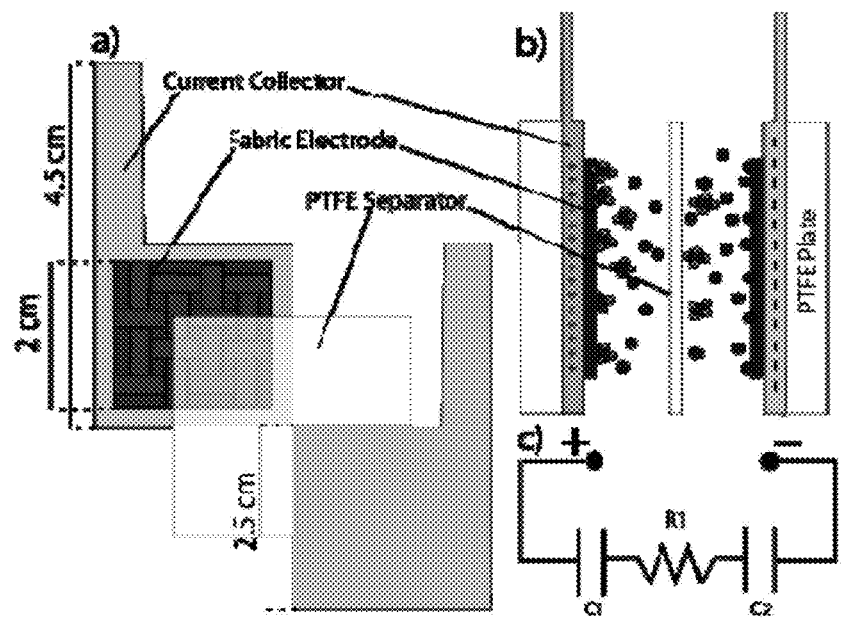
FIG. 27 provides a schematic representation of the testing set-up used to develop the fabric data described herein.
Figure 28:
FIG. 28 provides an illustration of the assembled cell, from which Cyclic Voltammetry (CV), Electrochemical Impedance Spectroscopy (EIS), and Galvanostatic Cycling (GC) measurements were taken.

Experimental—Cell Assembly:

Cells were assembled in a conventional symmetrical two electrode set up as shown in FIGS. 27-28. The cell comprised a porous PTFE separator (Gore, USA), stainless steel sheets 50 µm thick that act as current collectors, (dimensions: 2.5×2.5 $cm^2$ with a 4 cm extended tab), and supporting PTFE plates to apply even pressure across the electrodes while testing. The cells are put into a polypropylene bag filled with the electrolyte and heat sealed into that bag over the tabs of the current collectors to prevent evaporation and/or contamination of the electrolyte.

Experimental—Electrochemical Performance Testing:

Cyclic voltammetry (CV), galvanostatic cycling, and electrochemical impedance spectroscopy (EIS) were performed on a VMP3 potentiostat/galvanostat (Biologic, France). Cyclic voltammetry data was collected at 1, 5, 10, 20, 50, and 100 mV/s, within a 1 V window ranging from −0.2 V to 0.8 V. For each material system the stable voltage range was found to be −0.2 to 0.8 V except for 1 M NaCl electrolyte, where it was −0.2 to 0.6 V. Current was cycled galvanostatically at 2.5 and 5 mA/$cm^2$ within the same voltage window. Electrochemical impedance spectroscopy (EIS) was performed between 10 mHz and 200 kHz at the open circuit potential of the cell with a signal peak to peak amplitude of 10 mV. All experimental CV data was fitted using non-linear regression onto a series resistance-capacitance (RC) circuit model. The discharge capacitance was extracted as the slope of the integral of the I vs. V plot from cyclic voltammetry. For galvanostatic data, the equivalent series resitance (ESR) was calculated from the IR drop at the begining of the discharge cycle and the capacitance was also calculated from the slope of the discharge curve. For impedance spectroscopy, the ESR was taken to be the real part of the impedance (Z') at a frequency of 1 kHz.

Experimental—Carbon Impregnation Techniques:

Initial experiments showed that dip coating did not impregnate a significant amount of carbon into the fabric structure, and was highly dependant on the absorbency of the fibers. No uniform coating on the textile was achieved and the resulting coatings were not dense enough to create conductive bonds similar to those in conventional thin film supercapacitors. Therefore, 2×2 $cm^2$ swatches of fabric were cut and aligned on a PTFE plate for screen-printing. The screen-printing frame was a nylon mesh with filament spacing approximately 0.3 mm apart. The screen was placed over the fabric with the slurry directly applied to the swatches. The slurry was spread to smoothly apply the carbon across the fabric and this process was repeated 4 times to ensure full penetration of carbon through the yarns and into the fiber bundles. All swatches were dried on a small metal mesh drying screen and then degassed in a vacuum oven for 16 hours to remove any residual water prior to further sample handling. The carbon mass was determined by weighing the fabric electrodes before and after coating.

Figure 29:
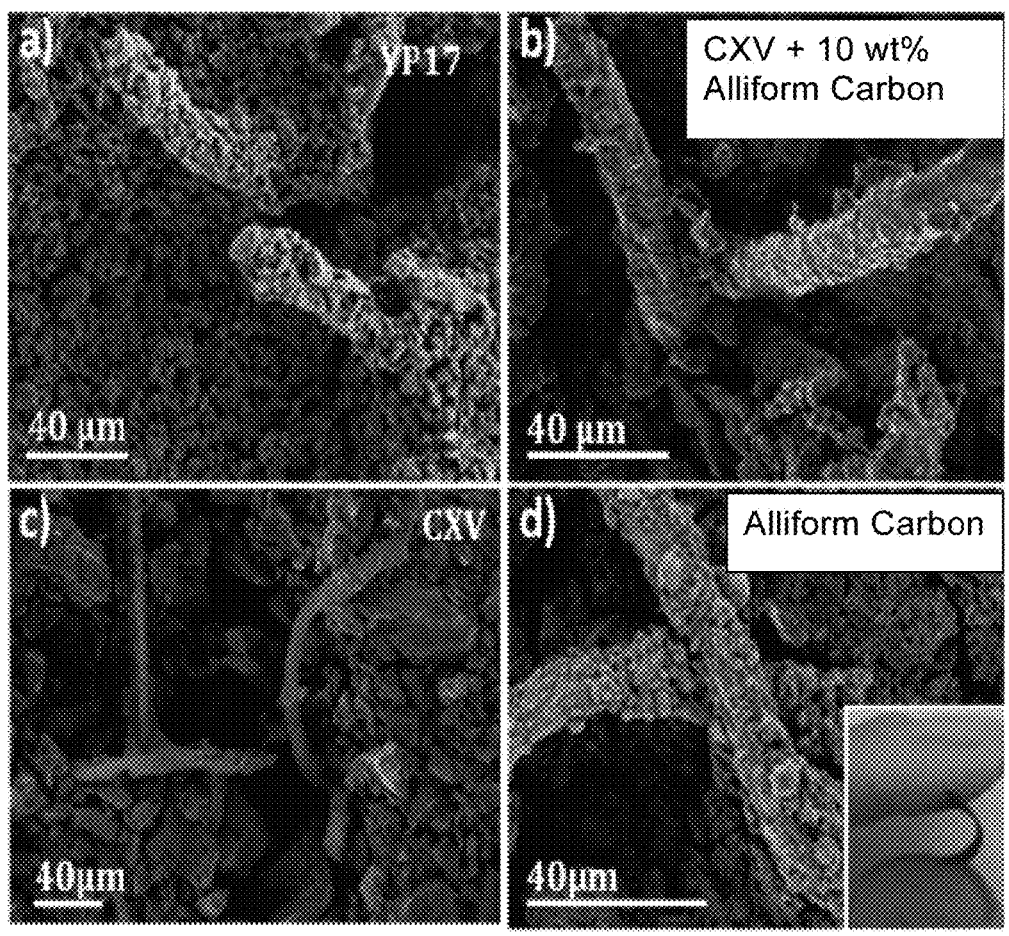
FIG. 29 shows SEM images of polyester microfiber impregnated with different carbon materials via the screen printing process: (A) YP17 thoroughly coats the fibers; (B) 10 wt % alliform carbon added to CXV; (C) CXV coated onto polyester microfiber; and (D) alliform carbon particles coat very thoroughly around polyester fibers. Inset: polyester electrode coated in alliform carbon shows high flexibility without carbon flaking or cracking.

Experimental—Adhesion of Different Carbons on Polyester Microfiber:

To characterize carbon impregnation and adherence to fabrics, different carbon materials were screen printed with a single coat onto polyester microfiber and examined under a scanning electron microscope (SEM). Polyester microfibers are cylindrical with a constant 10 µm diameter, while cotton fibers vary in size and length (16-30 µm). CXV activated carbon consisted of 10-32 µm sized particles that were too large to adhere to the fibers of polyester microfiber, which might explain why they flaked off. YP17 particles (2-3 µm) coat and adhere to the fibers thoroughly as seen in FIG. 29A. Alliform carbon were shown to have excellent adhesion, (FIGS. 29B and 29D) and the coated fabric electrode had excellent flexibility without carbon delamination (inset of FIG. 29D).

Figure 30:
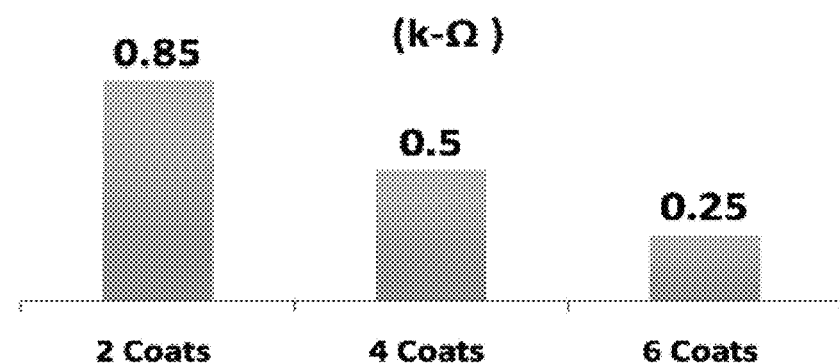
FIG. 30A provides data for the electrical resistance observed with an increasing number of coatings of alliform carbon.
FIG. 30B provides gravimetric capacitance data for various coating thicknesses and additives on polyester microfibers and polypyrrole coated poly/nylon. In this FIG. 30B, AC refers to activated carbon, "PM" refers to polyester microfiber, "Ppy" refers to polypyrole coated poly/nylon fibers. The numbers "2" and "4" refer to the number of coatings of the corresponding materials applied.
Figure 30:
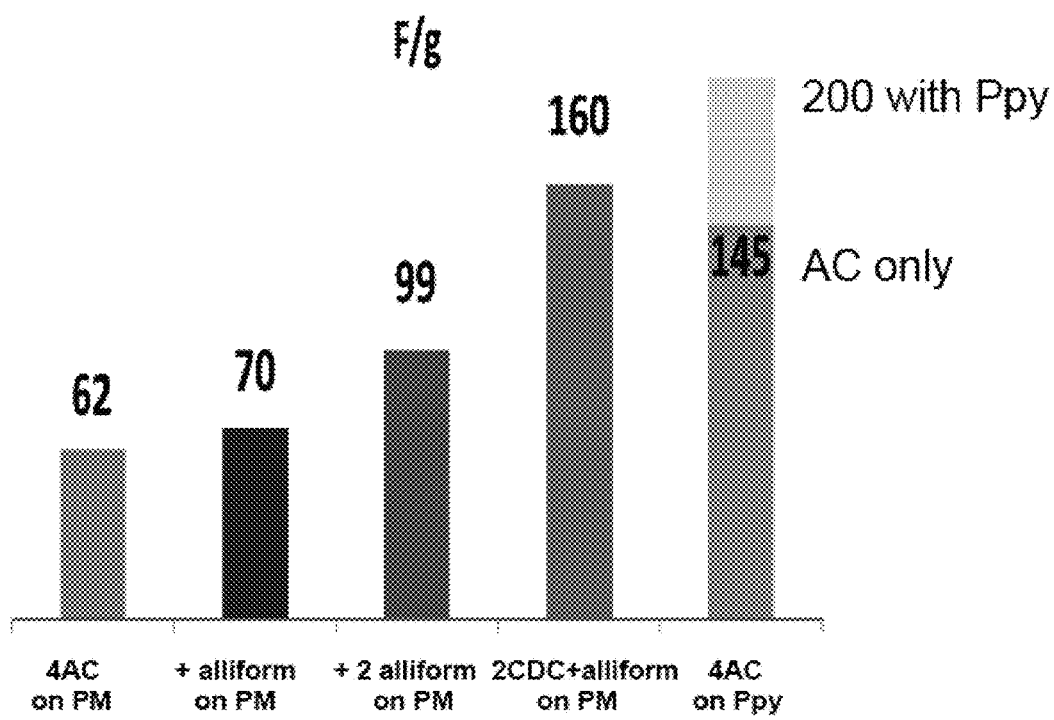
Figure 31:
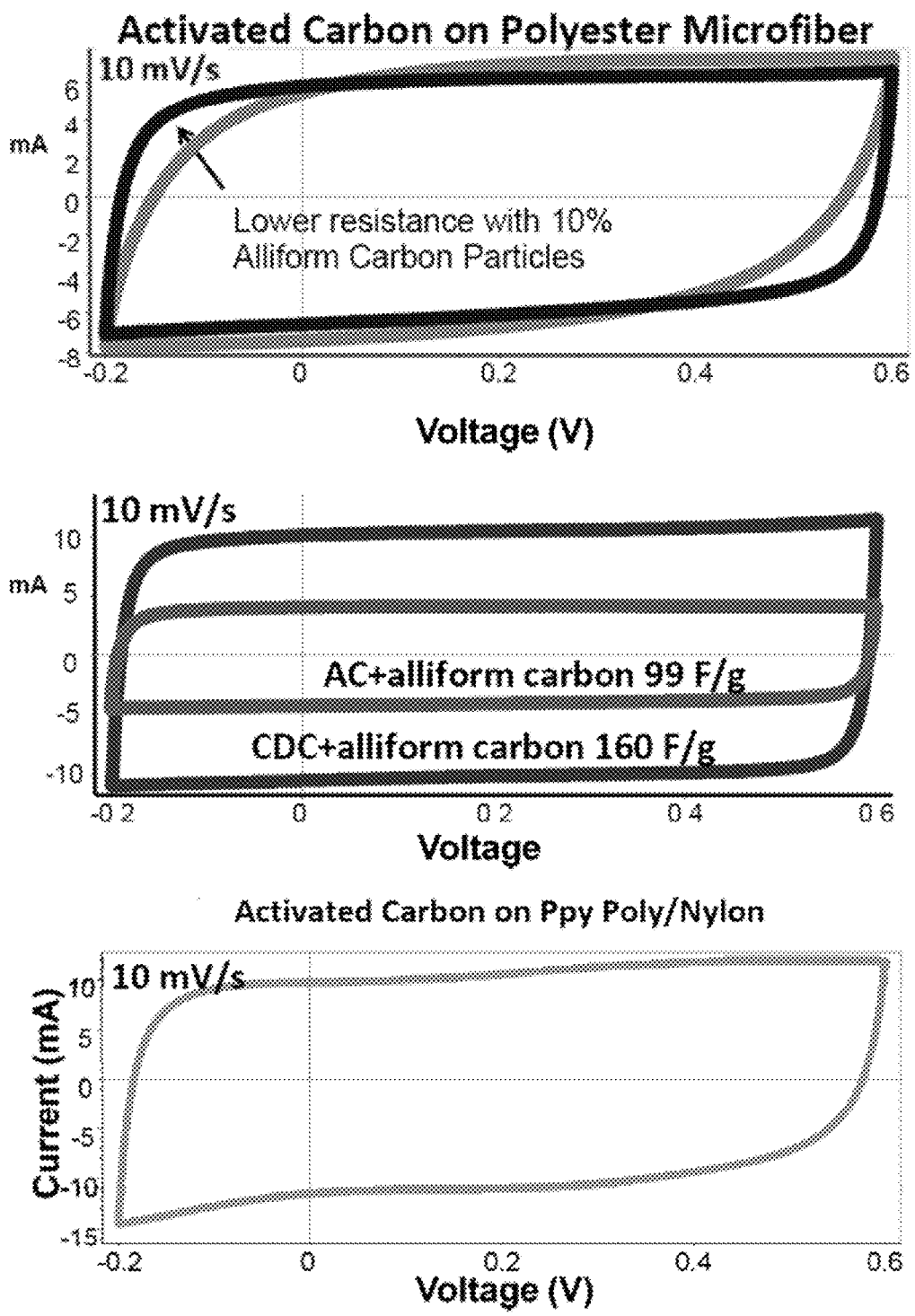
FIG. 31 provides cyclic voltammograms for alliform carbon fabrics.
Figure 32:
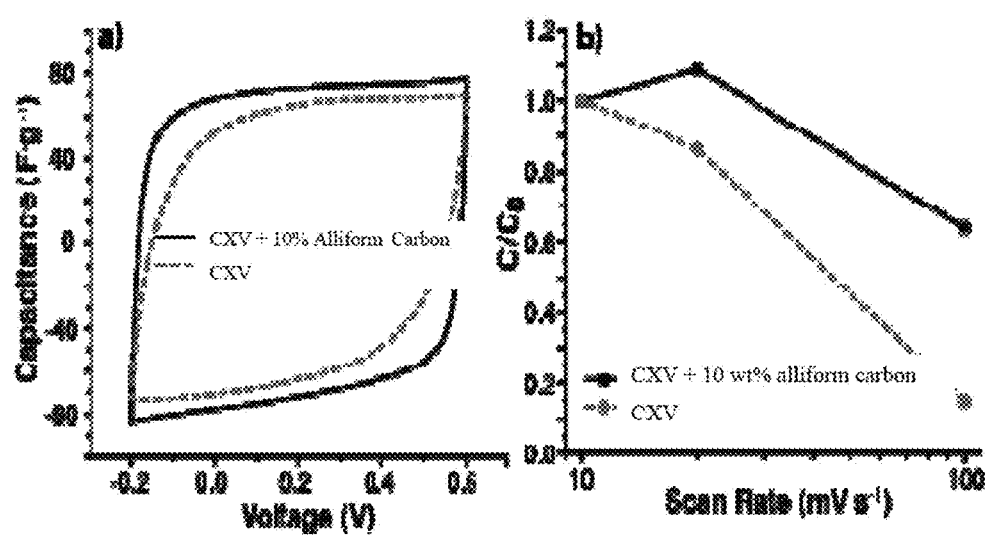
FIG. 32 provides data demonstrating the rate handling ability for CXV alone and for CXV plus 10 weight % alliform carbon particles with capacitance plotted as a function of voltage and the fractional concentration ($C/C_0$) plotted as a function of scan rate.

Results—Alliform carbon as a Conductive Additive:

Two polyester devices were fabricated: one device has electrodes screen printed with pure CXV slurry, while the other device has electrodes screen printed with CXV slurry with 10 wt % alliform carbon particles. Electrodes with the addition of alliform carbon particles were more conductive (14 Ω·$cm^2$ instead of 37 Ω·$cm^2$) (FIG. 30A) and had a slightly higher specific capacitance (Table 4; FIGS. 30B & 31). Furthermore, the rate handling ability (FIG. 32) was significantly improved by adding the alliform carbon particles.

TABLE 4

Alliform carbon particles as a conductive additive on polyester microfiber

| Active Material (CV @ 10 mV/sec) | Gravimetric Capacitance (F/g) | Device ESR (ohm) | Normalized ESR (ohm-$cm^2$) |
|---|---|---|---|
| CXV (activated carbon) | 63 | 9 | 37 |
| CXV + 10 wt % alliform carbon | 65 | 3.5 | 14 |

As those skilled in the art will appreciate, numerous modifications and variations of the present invention are possible in light of these teachings, and all such are contemplated hereby. For example, in addition to the embodiments described herein, the present invention contemplates and claims those inventions resulting from the combination of features of the invention cited herein and those of the cited prior art references which complement the features of the present invention. Similarly, it will be appreciated that any described material, feature, or article may be used in combination with any other material, feature, or article.

The disclosures of each patent, patent application, and publication cited or described in this document are hereby incorporated herein by reference, in their entirety.

What is claimed:

1. An energy storage device comprising:
  a. A first and a second electrode, each electrode comprising a body in electrical communication with a current collector; and
  b. an electrolyte;
  wherein at least one body comprises a three-dimensionally porous matrix of alliform carbon particles, the alliform carbon particles comprising at least one concentric graphitic shell having at least 25% of the shell comprising sp2 carbon, the alliform carbon particles being substantially spherical in shape, without carbon nanotube appendages, and substantially physically connected;
  said alliform carbon particles having a substantially unimodal size distribution with a mean particle diameter as measured by TEM photomicrograph image analysis of in a range of from 2 to 30 nanometers and
  said alliform carbon particles having a mean specific surface area in the range of 250 to 750 m2g-1;
  wherein the electrolyte physically contacts and is in electrical communication with said three-dimensionally porous matrix of alliform carbon particles; and
  wherein the energy storage device exhibits capacitance when a voltage polarity is applied across the first and second electrodes.

2. The energy storage device of claim 1, wherein the three-dimensionally porous matrix is substantially free of organic binder and has a mean pore size in a range of from 1 nm to 50 nm.

3. The energy storage device of claim 1, wherein the thickness of each body of three-dimensionally porous matrix of alliform carbon particles is independently in the range of 1 to 20 microns.

4. The energy storage device of claim 1, wherein the electrolyte is contained within aqueous based solution.

5. The energy storage device of claim 1, wherein the electrolyte is contained within a polar organic solvent comprising acetonitrile, γ-butyl lactone, dimethylformamide, 1,2-dimethoxyethane, dimethyl carbonate, diethyl carbonate, dipropyl carbonate, ethylene carbonate, nitromethane, propylene carbonate, or sulfalone.

6. The energy storage device of claim 1, wherein the electrolyte comprises an anion-cation pair comprising a cation and an anion, wherein the cation comprises an alkali metal, an alkaline earth metal, a lanthanide, a tetraalkyl ammonium cation, aluminum or zinc and the anion comprises $OH^-$, $PF_6^-$, $ClO_4^-$, $BF_4^-$, $CF_3SO_3^-$, or $SbF_6^-$.

7. The energy storage device of claim 1, wherein the first and second electrodes are superposed on a substrate and arranged in a planar array, with the electrolyte interposed between and physically separating said first and second electrodes, wherein said planar array is characterized as occupying a lateral planar area and having a vertical depth; and wherein the current collector of at least one electrode is positioned adjacent to the corresponding body of three-dimensionally porous matrix of alliform carbon particles.

8. The energy storage device of claim 7, wherein the first and second electrodes are arranged in an interdigital arrangement, wherein each electrode comprises a plurality of interdigital electrode fingers, said interdigital electrode fingers each characterized as having a length, width, and vertical distance, and said interdigital arrangement characterized as having an interdigital spacing between said interdigital electrode fingers; wherein the widths of the interdigital electrode fingers of each electrode are independently in a range of from 20 nm to 10 millimeters.

9. The energy storage device of claim 1, wherein the energy storage device:
  (a) maintains more than 95% of its original capacitance when the polarity of the electrodes is cycled more than 10,000 times; or
  (b) exhibits a near-linear relationship between discharge current and scan rate up to a scan rate of at least 175 $Vs^{-1}$; or
  (c) exhibits a linear relationship between discharge current and scan rate up to and including scan rates which exceed 100 $Vs^{-1}$; or
  (d) a combination of (a), (b), and (c).

10. The energy storage device of claim 8, wherein the widths of the interdigital electrode fingers of each electrode are in a range of from 100 nanometers micron to 1000 microns.

11. The energy storage device of claim 8, wherein the widths of the interdigital electrode fingers of each electrode are in a range of from 100 micron to 500 microns.

12. The energy storage device of claim 9, wherein the energy storage device maintains more than 95% of its original capacitance when the polarity of the electrodes is cycled more than 10,000 times.

13. The energy storage device of claim 9, wherein the energy storage device exhibits a near-linear relationship between discharge current and scan rate up to a scan rate of at least 175 $Vs^{-1}$.

14. The energy storage device of claim 9, wherein the energy storage device exhibits a linear relationship between discharge current and scan rate up to and including scan rates which exceed 100 $Vs^{-1}$.

* * * * *

UNITED STATES PATENT AND TRADEMARK OFFICE
CERTIFICATE OF CORRECTION

PATENT NO. : 9,576,694 B2  
APPLICATION NO. : 13/823336  
DATED : February 21, 2017  
INVENTOR(S) : Yury Gogotsi et al.

Page 1 of 1

It is certified that error appears in the above-identified patent and that said Letters Patent is hereby corrected as shown below:

On the Title Page

(73) Assignee: Change Second Assignee's name to "Université Toulouse III Paul Sabatier (FR)"

Signed and Sealed this  
Eighth Day of January, 2019

Andrei Iancu  
*Director of the United States Patent and Trademark Office*